(12) United States Patent
Kim et al.

(10) Patent No.: US 10,797,051 B2
(45) Date of Patent: Oct. 6, 2020

(54) SEMICONDUCTOR DEVICE AND METHOD OF MANUFACTURING THE SAME

(71) Applicant: SAMSUNG ELECTRONICS CO., LTD., Suwon-si, Gyeonggi-Do (KR)

(72) Inventors: Yoonjae Kim, Seoul (KR); Cheol Kim, Hwaseong-si (KR); Yong-Hoon Son, Yongin-si (KR); Jin-Hyuk Yoo, Hwaseong-si (KR); Woojin Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/716,384

(22) Filed: Dec. 16, 2019

(65) Prior Publication Data

US 2020/0119009 A1    Apr. 16, 2020

Related U.S. Application Data

(63) Continuation of application No. 15/413,466, filed on Jan. 24, 2017, now Pat. No. 10,553,582.

(30) Foreign Application Priority Data

Apr. 28, 2016    (KR) .................. 10-2016-0052146

(51) Int. Cl.
*H01L 29/16*    (2006.01)
*H01L 21/02*    (2006.01)
*H01L 27/088*    (2006.01)
*H01L 21/8234*    (2006.01)
*H01L 23/485*    (2006.01)
(Continued)

(52) U.S. Cl.
CPC .... *H01L 27/0886* (2013.01); *H01L 21/30604* (2013.01); *H01L 21/31116* (2013.01); *H01L 21/76897* (2013.01); *H01L 21/823418* (2013.01); *H01L 21/823437* (2013.01); *H01L 21/823475* (2013.01); *H01L 23/485* (2013.01); *H01L 27/0207* (2013.01); *H01L 27/088* (2013.01); *H01L 29/0673* (2013.01); *H01L 29/0847* (2013.01); *H01L 29/1037* (2013.01); *H01L 29/4238* (2013.01); *H01L 29/42392* (2013.01); *H01L 29/66545* (2013.01); *H01L 29/66636* (2013.01); *H01L 29/7848* (2013.01); *H01L 21/76832* (2013.01); *H01L 21/76834* (2013.01); *H01L 21/823431* (2013.01);
(Continued)

(58) Field of Classification Search
None
See application file for complete search history.

(56) References Cited

U.S. PATENT DOCUMENTS 6,140,218 A    10/2000    Liu et al.
6,142,018 A    11/2000    Dedert et al.
(Continued)

*Primary Examiner* — Joseph C. Nicely
*Assistant Examiner* — Lamont B Koo
(74) *Attorney, Agent, or Firm* — Volentine, Whitt & Francos, PLLC

(57) ABSTRACT

A semiconductor device includes a substrate having an active pattern, a conductive pattern crossing the active pattern, a spacer structure on at least one side surface of the conductive pattern, and a capping structure on the conductive pattern. The capping structure includes a first capping pattern and a second capping pattern. The second capping pattern is disposed on a top surface of the first capping pattern and a top surface of the spacer structure.

25 Claims, 55 Drawing Sheets

(51) Int. Cl.
  *H01L 21/768*   (2006.01)
  *H01L 21/306*   (2006.01)
  *H01L 21/311*   (2006.01)
  *H01L 27/02*    (2006.01)
  *H01L 29/06*    (2006.01)
  *H01L 29/08*    (2006.01)
  *H01L 29/10*    (2006.01)
  *H01L 29/423*   (2006.01)
  *H01L 29/66*    (2006.01)
  *H01L 29/78*    (2006.01)
  *H01L 21/8238*  (2006.01)
  *H01L 29/165*   (2006.01)

(52) U.S. Cl.
  CPC ............... *H01L 21/823807* (2013.01); *H01L 21/823814* (2013.01); *H01L 29/165* (2013.01)

(56) References Cited

U.S. PATENT DOCUMENTS

| | | | |
|---|---|---|---|
| 6,417,055 B2 | 7/2002 | Jang et al. | |
| 7,189,605 B2 | 3/2007 | Lee | |
| 8,048,790 B2 | 11/2011 | Soss et al. | |
| 8,436,404 B2 | 5/2013 | Bohr et al. | |
| 8,772,168 B2 | 7/2014 | Xie et al. | |
| 9,093,467 B1 | 7/2015 | Xie et al. | |
| 9,337,094 B1 | 5/2016 | Pranatharthiharan et al. | |
| 2008/0090400 A1 | 4/2008 | Cheek et al. | |
| 2009/0085075 A1 | 4/2009 | Kim et al. | |
| 2012/0139061 A1* | 6/2012 | Ramachandran | H01L 29/78 257/410 |
| 2013/0043592 A1 | 2/2013 | Park et al. | |
| 2014/0070333 A1 | 3/2014 | Cheng et al. | |
| 2014/0264280 A1* | 9/2014 | Kim | H01L 29/66545 257/29 |
| 2014/0369115 A1 | 12/2014 | Kim et al. | |
| 2015/0041868 A1 | 2/2015 | Cheng et al. | |
| 2015/0187945 A1* | 7/2015 | Kamineni | H01L 29/42376 257/384 |
| 2015/0221654 A1 | 8/2015 | Kim et al. | |
| 2015/0228646 A1 | 8/2015 | Ho et al. | |
| 2015/0364326 A1 | 12/2015 | Xie et al. | |
| 2016/0365426 A1 | 12/2016 | Ching et al. | |
| 2017/0213911 A1 | 7/2017 | Balakrishnan et al. | |
| 2017/0243947 A1* | 8/2017 | Adusumilli | H01L 29/456 |
| 2017/0352744 A1* | 12/2017 | Basker | H01L 27/0886 |

\* cited by examiner

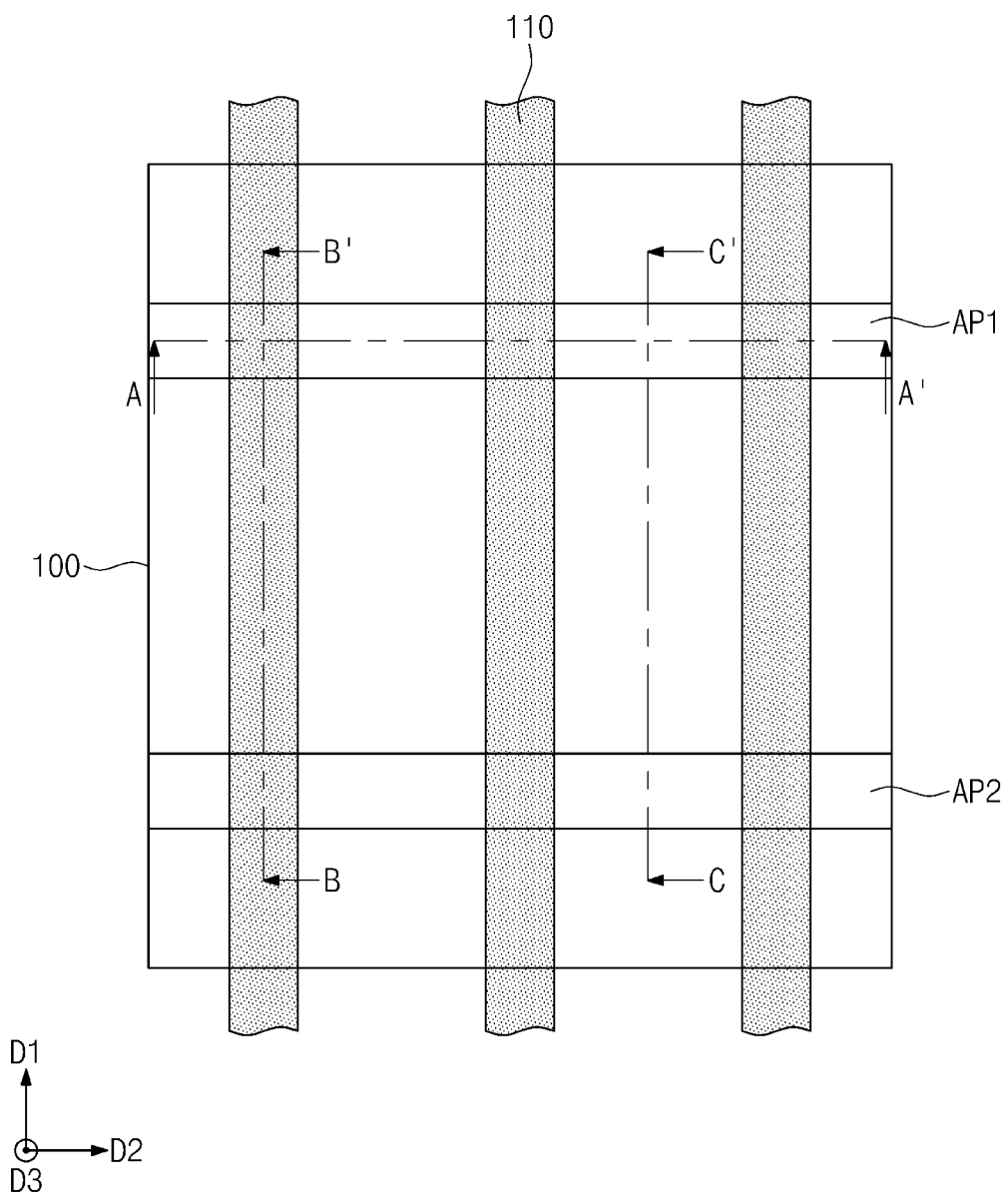

SEMICONDUCTOR DEVICE AND METHOD OF MANUFACTURING THE SAME

PRIORITY STATEMENT

This is a Continuation of U.S. application Ser. No. 15/413,466, filed Jan. 24, 2017, now U.S. Pat. No. 10,553,582 issued on Feb. 4, 2020, and a claim of priority under 35 U.S.C. § 119 is made to Korean Patent Application No. 10-2016-0052146 filed on Apr. 28, 2016 in the Korean Intellectual Property Office, the disclosure of which is hereby incorporated by reference in its entirety.

BACKGROUND

1. Field

The inventive concept relates to a semiconductor device and to a method of manufacturing the same. More specifically, the inventive concept relates to the gate structure of a field effect transistor and to a method of manufacturing the same.

2. Description of the Related Art

Semiconductor devices owing to high performance, small size and/or low manufacturing cost characteristics have been used as essential devices in the electronics industry. The semiconductor devices are classified into semiconductor memory devices for storing logical data, semiconductor logic devices for processing the logical data and hybrid semiconductor devices including a memory element and a logic element. As the electronics industry has been highly developed, a demand for semiconductor devices of high speed, high reliability and multifunction has increased. To meet these characteristics, semiconductor devices have become highly integrated and internal structures of semiconductor devices have become highly complex.

SUMMARY

According to the inventive concept, there is provided a semiconductor device including a substrate having an active pattern, a conductive pattern crossing the active pattern, a respective spacer structure on each of at least one of the side surfaces of the conductive pattern, the spacer structure having a top surface, and a capping structure on the conductive pattern, and in which the capping structure includes a first capping pattern, the first capping pattern having a top surface, and a second capping pattern, and the second capping pattern is disposed on the top surface of the first capping pattern and on the top surface of the spacer structure.

According to the inventive concept, there is also provided a semiconductor device including a substrate having an active pattern, a conductive pattern crossing the active pattern, and a capping structure on the conductive pattern, and in which the capping structure includes a first capping pattern and a second capping pattern on the first capping pattern, the first capping pattern has an indentation, the second capping pattern has a protrusion received in the indentation as engaged with the first capping pattern, and a width of the second capping pattern is greater than a width of the first capping pattern.

According to the inventive concept, there is also provided a method of manufacturing a semiconductor device, including forming a conductive pattern crossing an active pattern on a substrate, forming spacer layers on opposite side surfaces of the conductive pattern, forming a first capping layer on the conductive pattern and the spacer layers, recessing the first capping layer and the spacer layers, within insulating material, to form a first capping pattern and spacer structures, and forming a second capping pattern on a top surface of the first capping pattern and top surfaces of the spacer structures.

According to the inventive concept, there is also provided a semiconductor device, including a substrate having an active pattern including a source/drain (S/D) region, an interlayer dielectric layer on the substrate, at least one conductive pattern extending longitudinally in a first direction across the active pattern within the interlayer dielectric layer, a respective spacer structure on each of at least one of the side surfaces of the conductive pattern, a capping structure on the conductive pattern, and a contact structure extending vertically in the interlayer dielectric layer to the S/D region, and in which the contact structure comprises a conductive member electrically connected to the S/D region, the capping structure includes a first capping pattern and a second capping pattern having a first portion disposed on the top surface of the first capping pattern and a second portion on the top surface of the spacer structure, the contact structure is disposed against the spacer structure and the second portion of the second capping pattern, and the second capping pattern is of material having an etch selectivity with respect to that of the interlayer dielectric layer.

BRIEF DESCRIPTION OF THE DRAWINGS

FIGS. 7, 9, 11, 13, 15, 17, 19, 21, 23 and 25 are plan views illustrating a method of manufacturing a semiconductor device according to an example of the inventive concept.

DETAILED DESCRIPTION

Various examples of the inventive concept will now be described more fully with reference to the accompanying drawings. However, the inventive concept may be embodied in many alternate forms and should not be construed as limited to only the examples described hereinafter.

Figure 1:
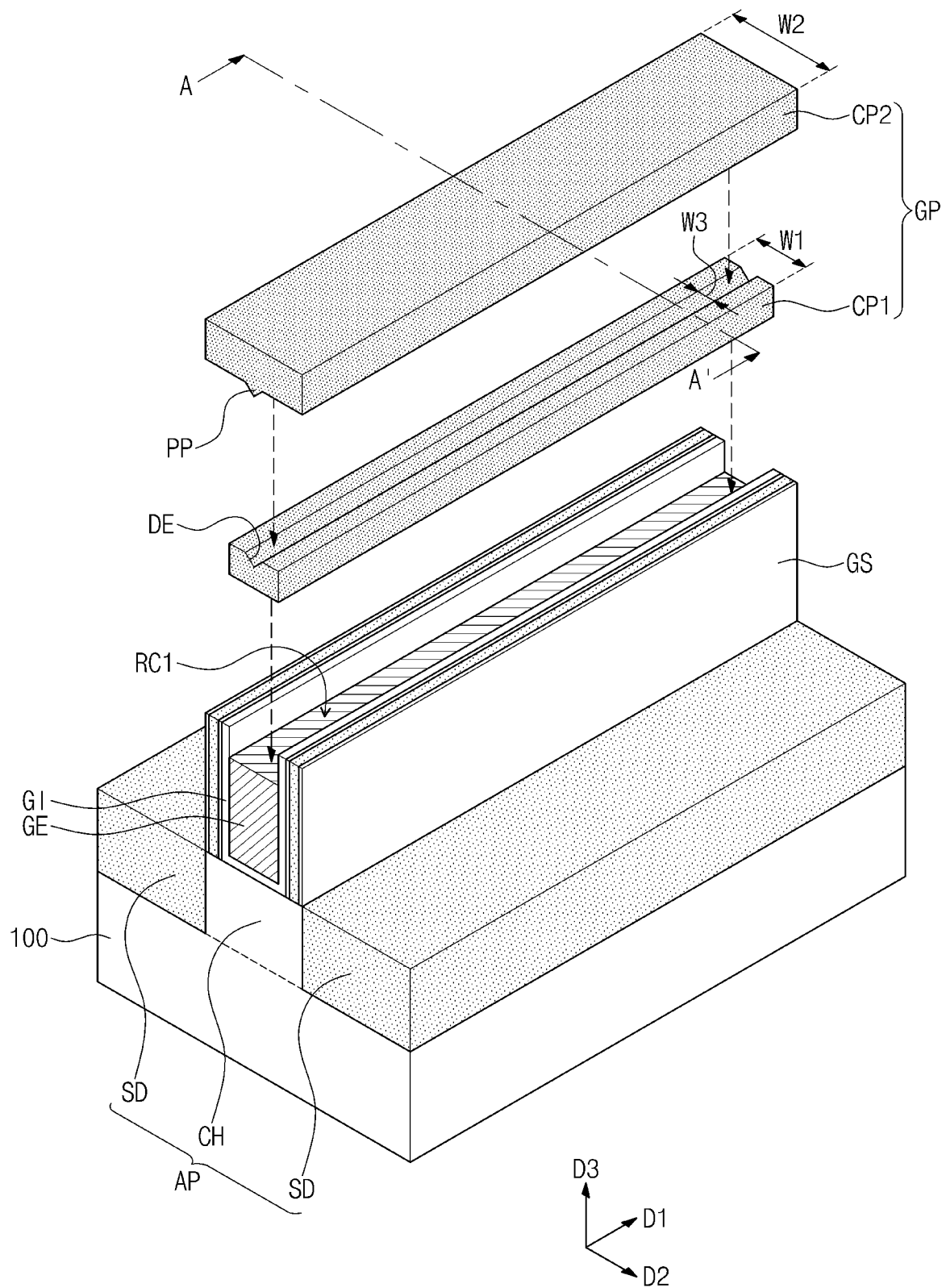
FIG. 1 is a perspective view illustrating a semiconductor device according to an example of the inventive concept.
Figure 2:
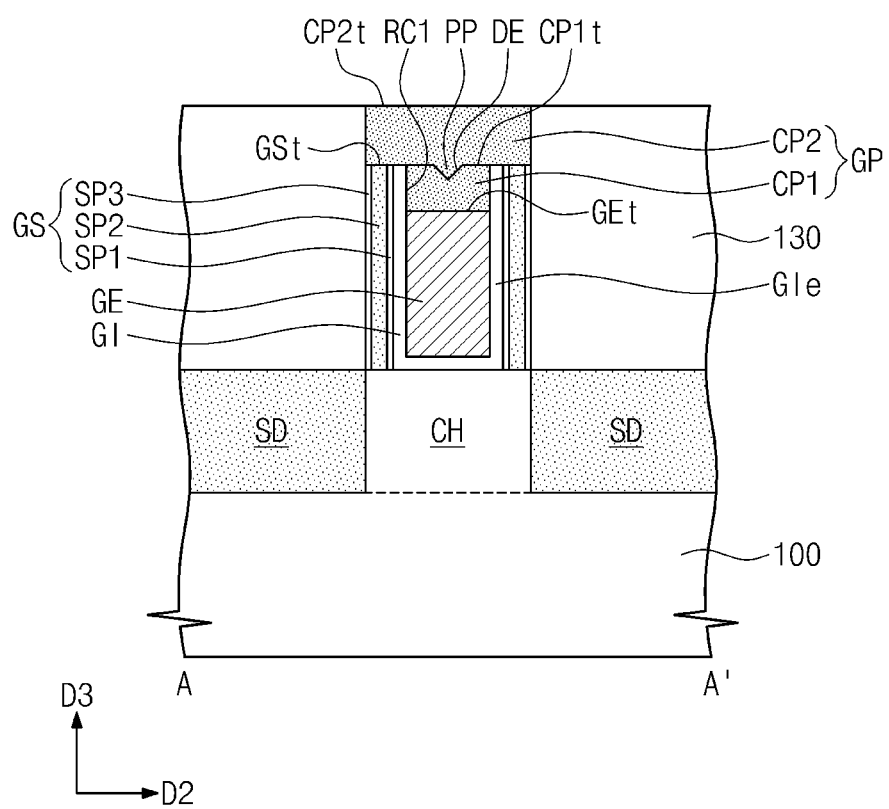
FIG. 2 is a cross-sectional view taken along line A-A' of FIG. 1.

FIG. 1 is a perspective view illustrating a semiconductor device according to an example of the inventive concept. FIG. 2 is a cross-sectional view taken along line A-A' of FIG. 1.

Referring to FIGS. 1 and 2, a substrate 100 having an active pattern AP may be provided. The substrate 100 may be, for example, a silicon substrate, a germanium substrate, or a silicon-on-insulator (SOI) substrate. The active pattern AP may be disposed on the substrate 100. The active pattern AP may upwardly protrude from the substrate 100. The active pattern AP may include a pair of source/drain regions SD and a channel region CH between the pair of source/drain regions SD. The source/drain regions SD may be impurity regions that are doped with impurities having a different conductivity type from the substrate 100.

A conductive pattern may be disposed on the channel region CH. As an example, the conductive pattern may include a gate electrode GE crossing the active pattern AP. The gate electrode GE may have a linear shape that extends in a first direction D1 parallel to a top surface of the substrate 100. The gate electrode GE may include a doped semiconductor material (e.g., doped silicon, doped germanium, etc.), a conductive metal nitride (e.g., titanium nitride, tantalum nitride, etc.) and/or a metal (e.g., aluminum, tungsten, etc.)

Spacer structures GS may be respectively disposed on opposite sidewalls of the gate electrode GE. The spacer structures GS may extend in the first direction D1 along the gate electrode GE. Top surfaces GSt of the spacer structures GS may be higher than a top surface GEt of the gate electrode GE. The spacer structures GS may each include a plurality of spacers SP1, SP2 and SP3. In other words, the plurality of spacers SP1, SP2 and SP3 may be multiple layers that are sequentially stacked on a sidewall of the gate electrode GE. The plurality of spacers SP1, SP2, and SP3 may include a first spacer SP1, a second spacer SP2 and a third spacer SP3.

Bottom surfaces of the first through third spacers SP1, SP2 and SP3 may be substantially coplanar with each other and top surfaces of the first through third spacers SP1, SP2 and SP3 may be substantially coplanar with each other. The second spacer SP2 may be interposed between the first spacer SP1 and the second spacer SP2. A dielectric constant of the second spacer SP2 may be lower than that of the first and third spacers SP1 and SP3. The second spacer SP2 may have a width greater than that of each of the first and third spacers SP1 and SP3. In other words, the percentage of the second spacer SP2 by volume in the spacer structure GS may be greater than that of each of the first and third spacers SP1 and SP3 in the spacer structure GS. Because the dielectric constant of the second spacer SP2 is relatively low, the spacer structure GS having a relatively low dielectric constant may be formed.

The first through third spacers SP1, SP2 and SP3 may each include at least one of $SiO_2$, SiCN, SiCON and SiN. In some examples, the second spacer SP2 may contain more oxygen than the first through third spacers so as to have the relatively low dielectric constant. In other words, a concentration of oxygen atoms in the second spacer SP2 may be greater than that in each of the first and third spacers SP1 and SP3. As an example, the first and third spacers SP1 and SP3 may include SiN and the second spacer SP2 may include SiCON.

A gate dielectric pattern GI may be disposed between the gate electrode GE and the channel region CH and between the gate electrode and the pair of spacer structures GS. The gate dielectric pattern GI may extend in the first direction D1. The gate dielectric pattern GI may include a pair of extension portions GIe. The extension portions GIe may each extend in a third direction D3 along inner sidewalls of the spacer structure GS. The third direction D3 may be a direction perpendicular to the top surface of the substrate 100. Top surfaces of the extension portions GIe may be substantially coplanar with the top surfaces GSt of the spacer structure GS. In other words, the top surfaces of the extension portions GIe may be higher than the top surface GEt of the gate electrode GE.

The gate dielectric pattern GI may include at least one of silicon oxide, silicon nitride and a high-k dielectric material having a dielectric constant greater than that of silicon oxide. The high-k dielectric material may include, for example, at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and lead zinc niobate.

The gate electrode GE may be recessed, i.e., its top surface GEt may be lower than the top surface GSt of the spacer structure GS and a top surface of the gate dielectric pattern GI. Thus, a first recess region RC1 may be defined on the gate electrode GE. Specifically, the first recess region RC1 may include a recess defined by inner sidewalls of the extension portions GIe and the top surface GEt of the gate electrode GE.

A capping structure GP may be disposed on the gate electrode GE. The capping gate structure GP may extend in the first direction D1 along the gate electrode GE. As an example, the cross section of the capping structure GP, in a second direction D2 crossing the first direction D1, may have a T-shape (refer to FIG. 2). The capping structure GP may include a first capping pattern CP1 and a second capping pattern CP2 that are sequentially stacked.

The first capping pattern CP1 may be disposed on the top surface GEt of the gate electrode GE. The first capping pattern CP1 may be interposed between the gate electrode GE and the second capping pattern CP2. In addition, the first capping pattern CP1 may be interposed between the spacer structures GS. The first capping pattern CP1 may be disposed in the first recess region RC1. In other words, the first capping pattern CP1 may be surrounded by the gate electrode GE, the second capping pattern CP2 and the pair of spacer structures GS. At least a portion of a top surface CP1t of the first capping pattern CP1 may be substantially coplanar with the top surfaces GSt of the spacer structures GS. In other words, at least a portion of the top surface CP1t of the first capping pattern CP1 may be positioned at substantially the same level as the top surfaces GSt of the spacer structures GS.

The first capping pattern CP1 may have a width W1 in the second direction D2. For example, the width W1 of the first capping pattern CP1 may be substantially equal to the width of the gate electrode GE in the second direction.

The first capping pattern CP1 may include an indentation DE formed in a top surface thereof. The indentation DE may be in the form of a groove that extends longitudinally in the first direction D1. The indentation DE may have a width W3 in the second direction D2. The width W3 may be less than the width W1 of the first capping pattern CP1.

The second capping pattern CP2 may be disposed on the top surface CP1t of the first capping pattern CP1 and the top surfaces GSt1 of the spacer structure GS. In other words, the second capping pattern CP2 may cover the entire top surface CP1t of the first capping pattern CP1 and the entire top surfaces GSt1 of the spacer structure GS. The second capping pattern CP2 may extend from the top surface CP1t of the first capping pattern CP1 to the top surfaces GSt of the spacer structures GS. Opposite sidewalls of the second capping pattern CP2 may each be aligned with a sidewall of each spacer structure GS. The sidewall of each spacer structure GS may be a sidewall of the third spacer SP3. The opposite sidewalls of the second capping pattern CP2 and the sidewall of each spacer structure GS may be covered by an interlayer insulating layer 130. A top surface CP2t of the second capping pattern CP may be substantially coplanar with a top surface of the first interlayer insulating layer 130 covering the substrate 100.

The second capping pattern CP2 may have a width W2 in the second direction D2. The width W2 of the second capping pattern CP2 may be greater than the width W1 of the first capping pattern CP1.

The second capping pattern CP2 may include a protrusion portion PP (or simply "protrusion") projecting toward the substrate 100 at a bottom surface thereof. The protrusion portion PP may have a linear shape that extends in the first direction D1. The protrusion portion PP may be complementary to and received in the indentation DE.

The second capping pattern CP2 may include a material having an etching selectivity with respect to the first interlayer insulating layer 130. For example, in a dry etching process using fluorocarbon ($C_xF_y$) as an etching gas, the second capping pattern CP2 may include a material having an etching selectivity with respect to the first interlayer insulating layer 130. In some examples, in the case where the first interlayer insulating layer 130 may include silicon oxide, the second capping pattern CP2 may include at least one of SiON, SiCN, SiCON, SiN and $Al_2O_3$.

In some examples, the first capping pattern CP1 may include the same material as the second capping pattern CP2. In other examples, the first capping pattern CP1 may include a different material from the second capping pattern CP2. In this case, a dielectric constant of the second capping pattern CP2 may be greater than that of the first capping pattern CP1. In the case of a material having a relatively high dielectric constant in general, an etching selectivity of the material with respect to silicon oxide forming the first interlayer insulating layer 130 may be higher. The first capping pattern CP1 may include at least one of SiON, SiCN, SiCON, SiN and $Al_2O_3$. As an example, the first and second capping patterns CP1 and CP2 may include SiN. As another example, the first capping pattern CP1 may include SiON, and the second capping pattern CP2 may include SiN. As still another example, the first capping pattern CP1 may include SiN, and the second capping pattern CP2 may include $Al_2O_3$.

Figure 3:
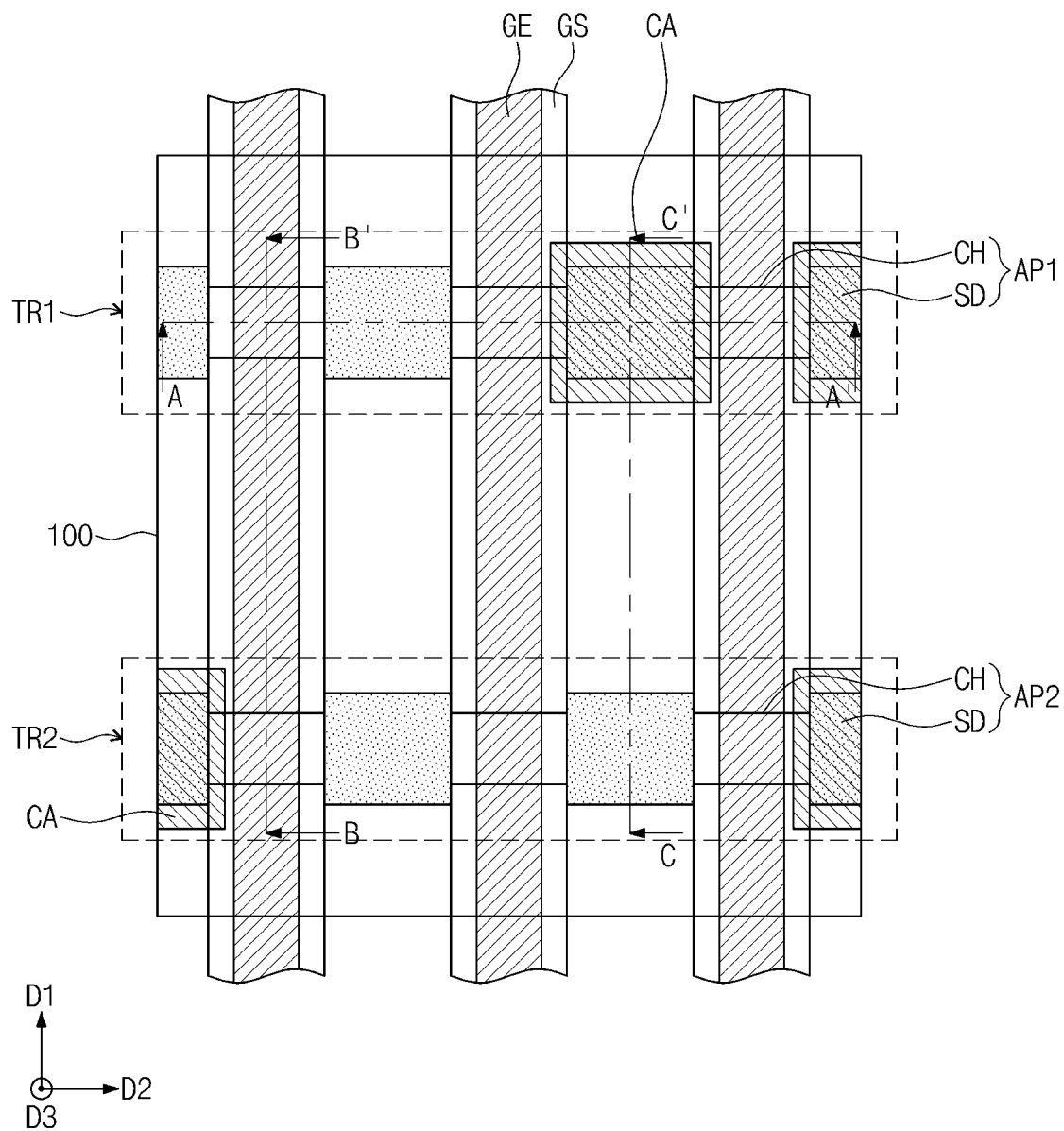
FIG. 3 is a plan view illustrating a semiconductor device according to an example of the inventive concept.
Figure 4A:
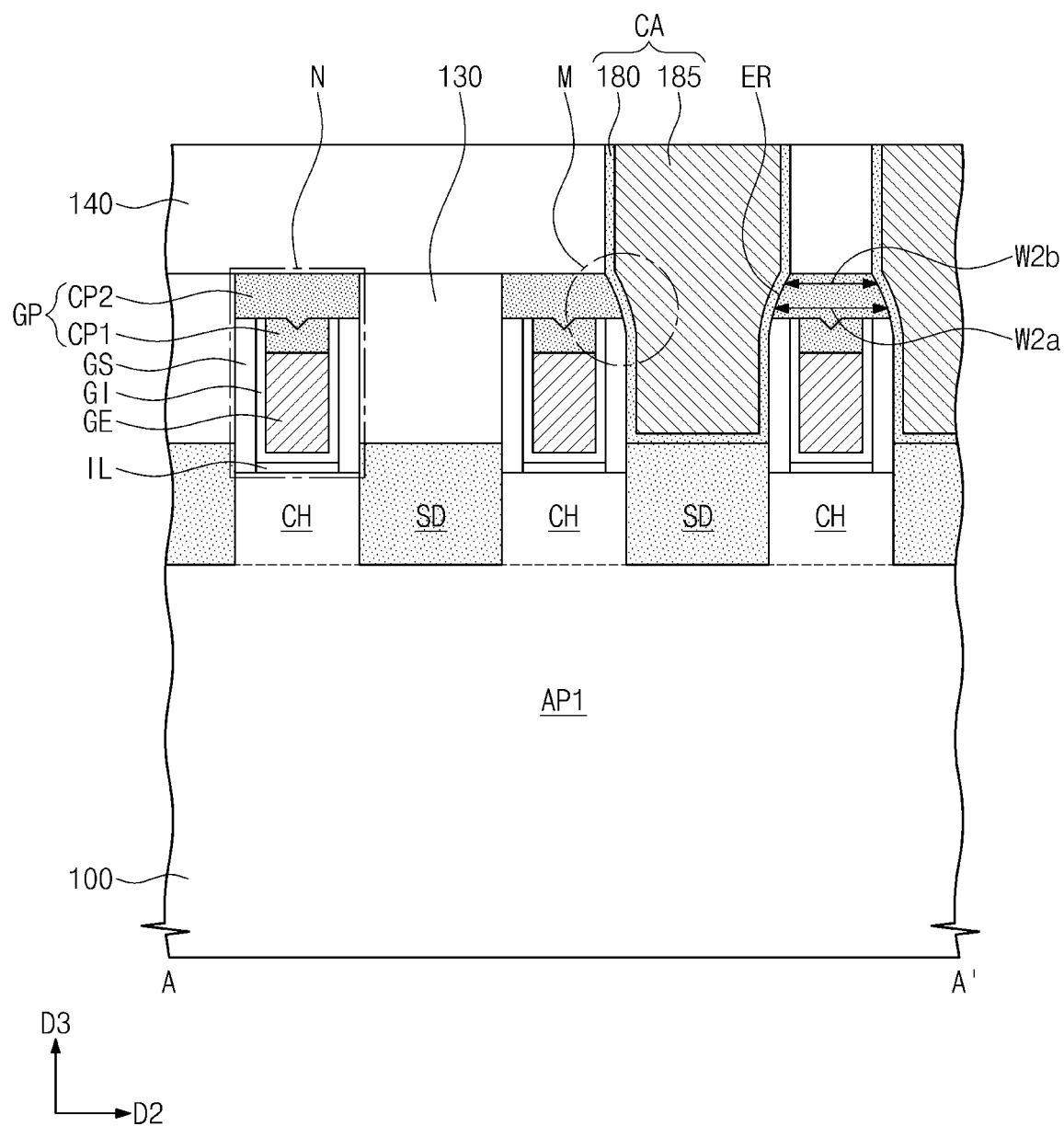
FIGS. 4A, 4B and 4C are cross-sectional views taken along lines A-A', B-B' and C-C' of FIG. 3, respectively.
Figure 4B:
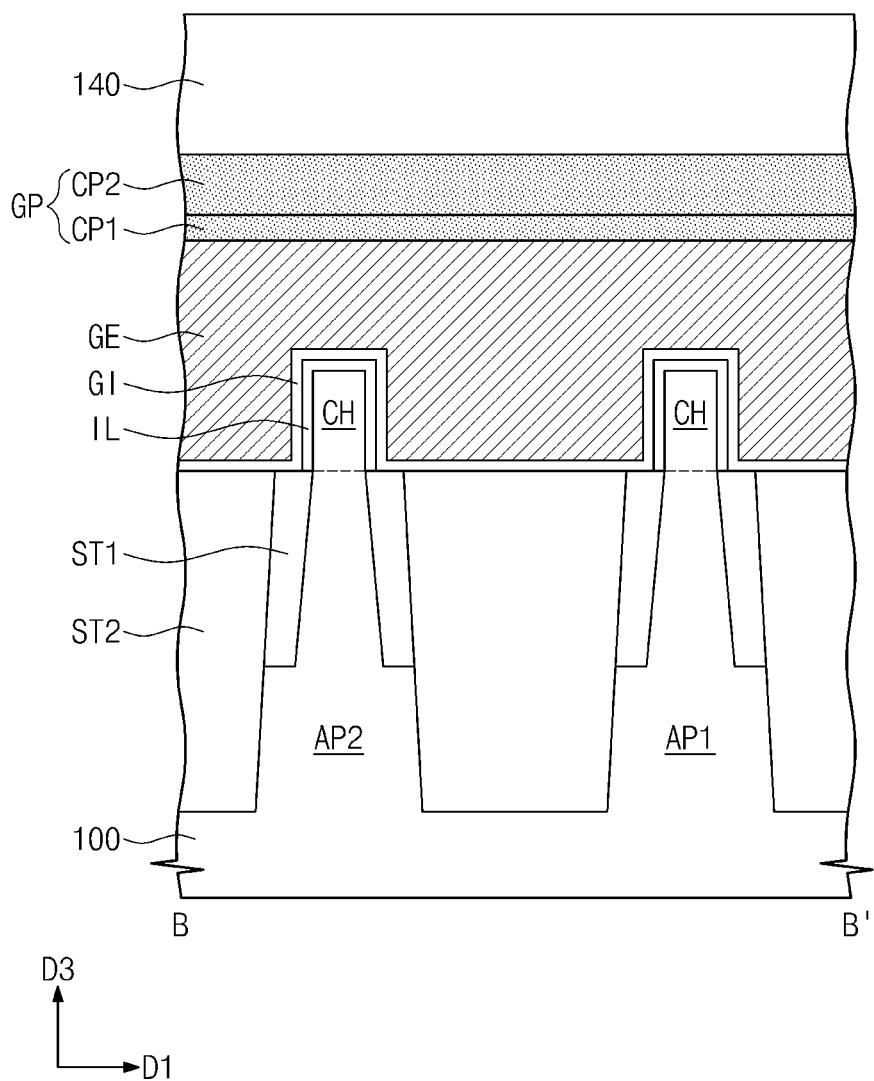
Figure 4C:
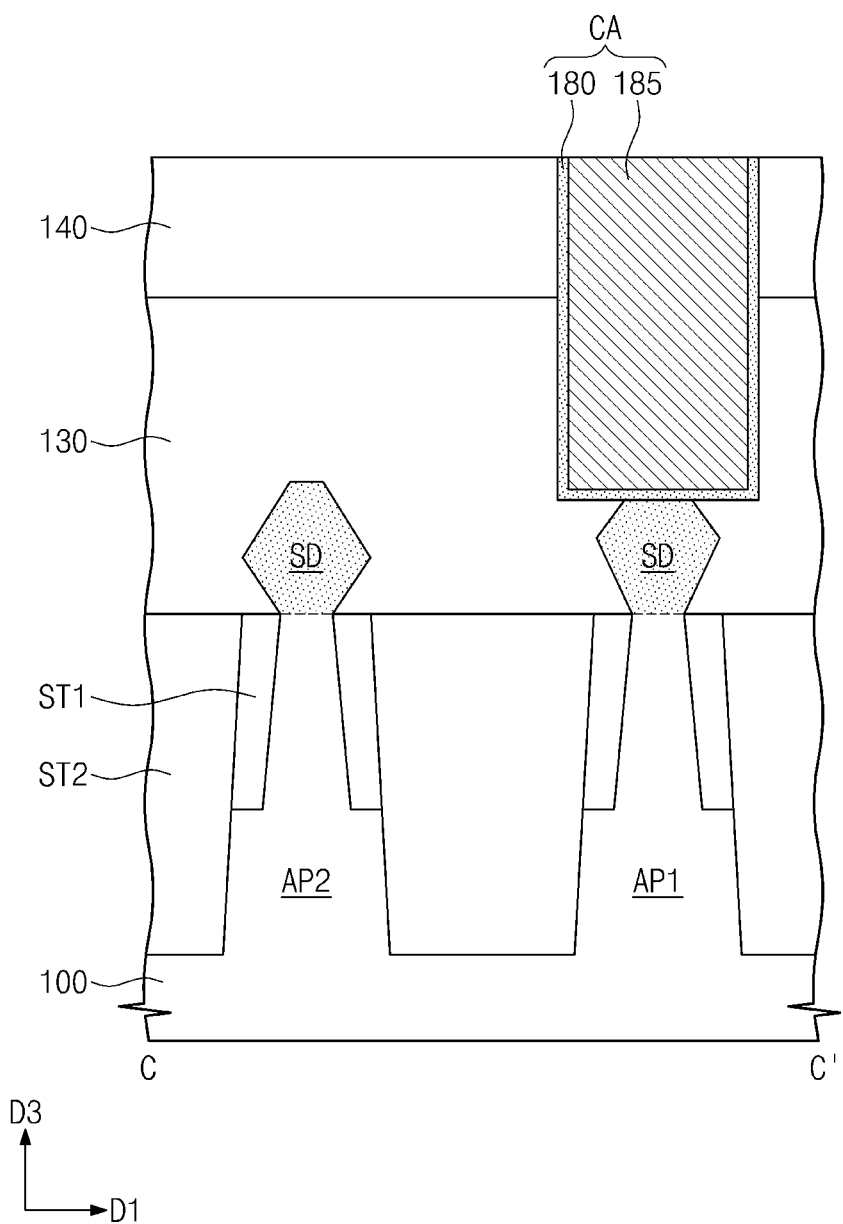
Figure 5:
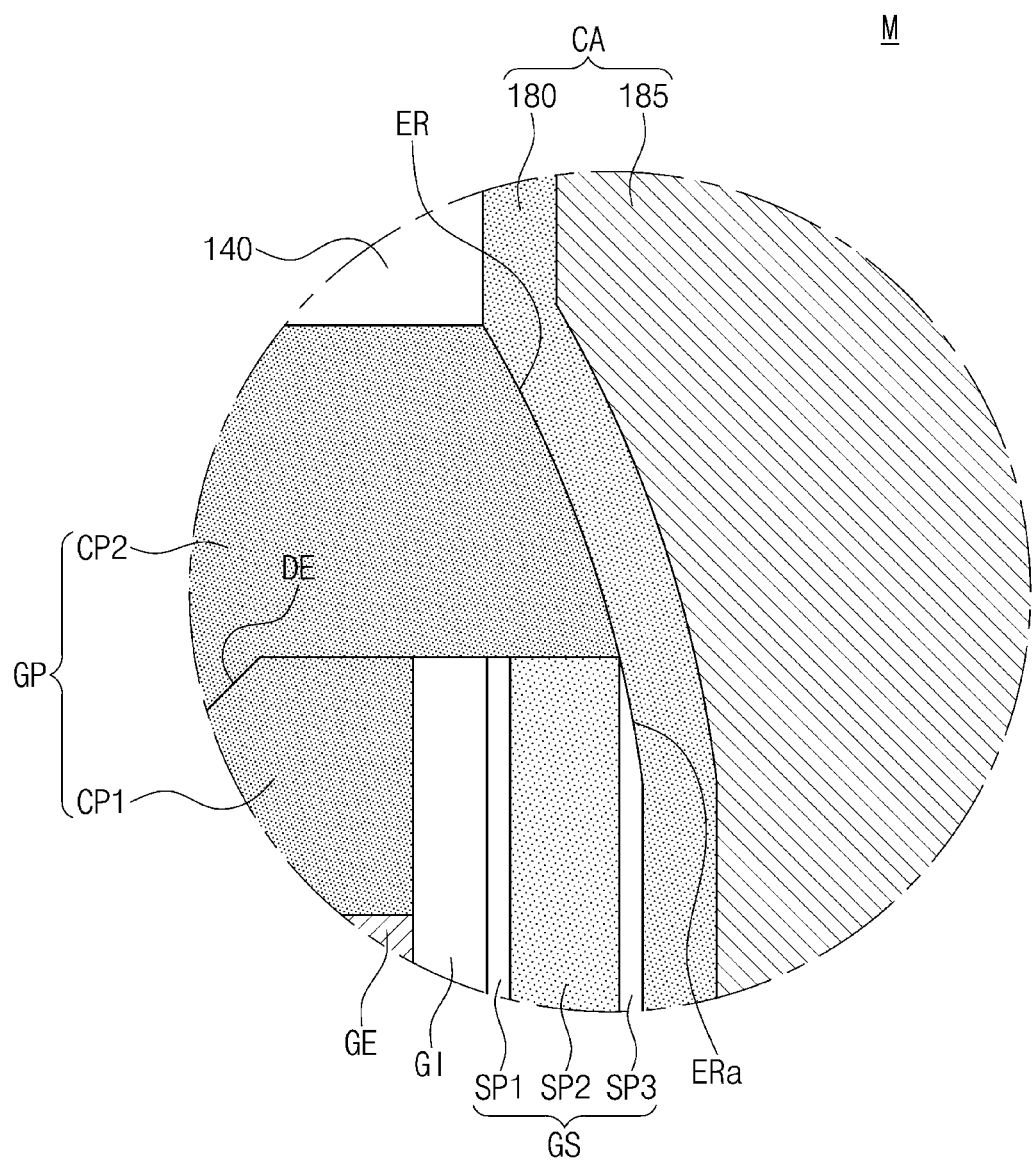
FIG. 5 is an enlarged cross-sectional view of region "M" of FIG. 4A.
Figure 6A:
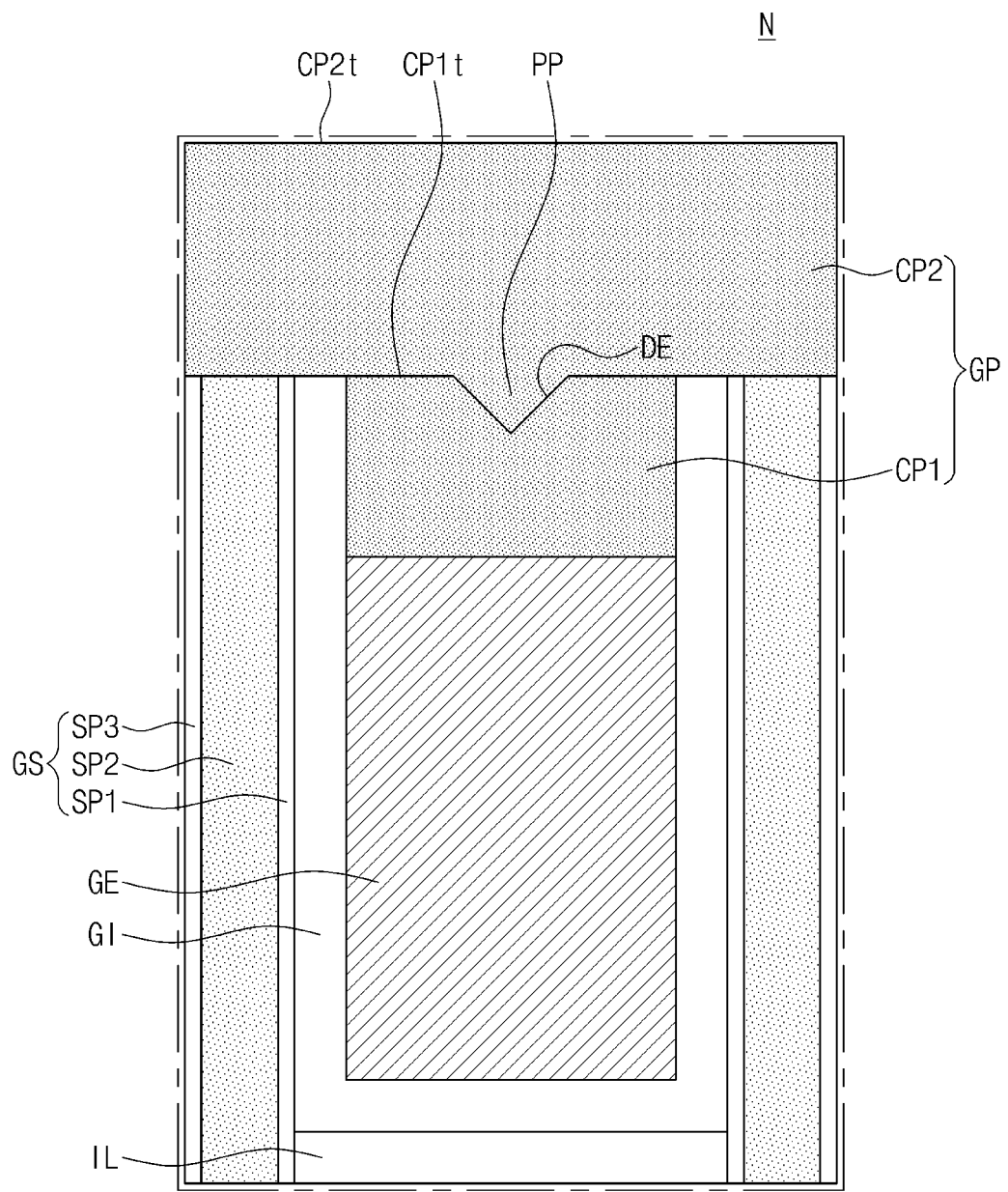
FIGS. 6A, 6B and 6C are enlarged cross-sectional views of region "N" of FIG. 4A.
Figure 6B:
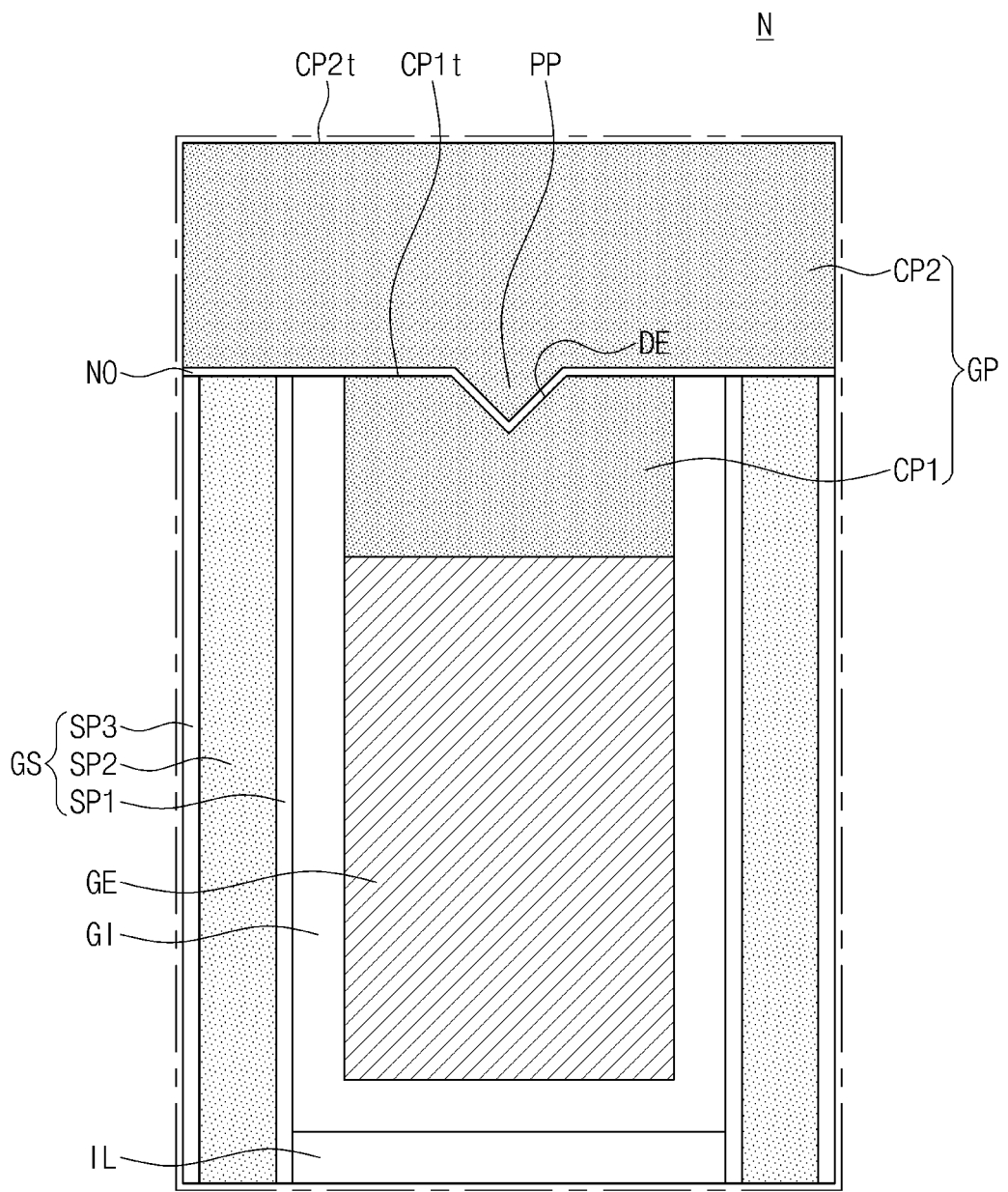
Figure 6C:
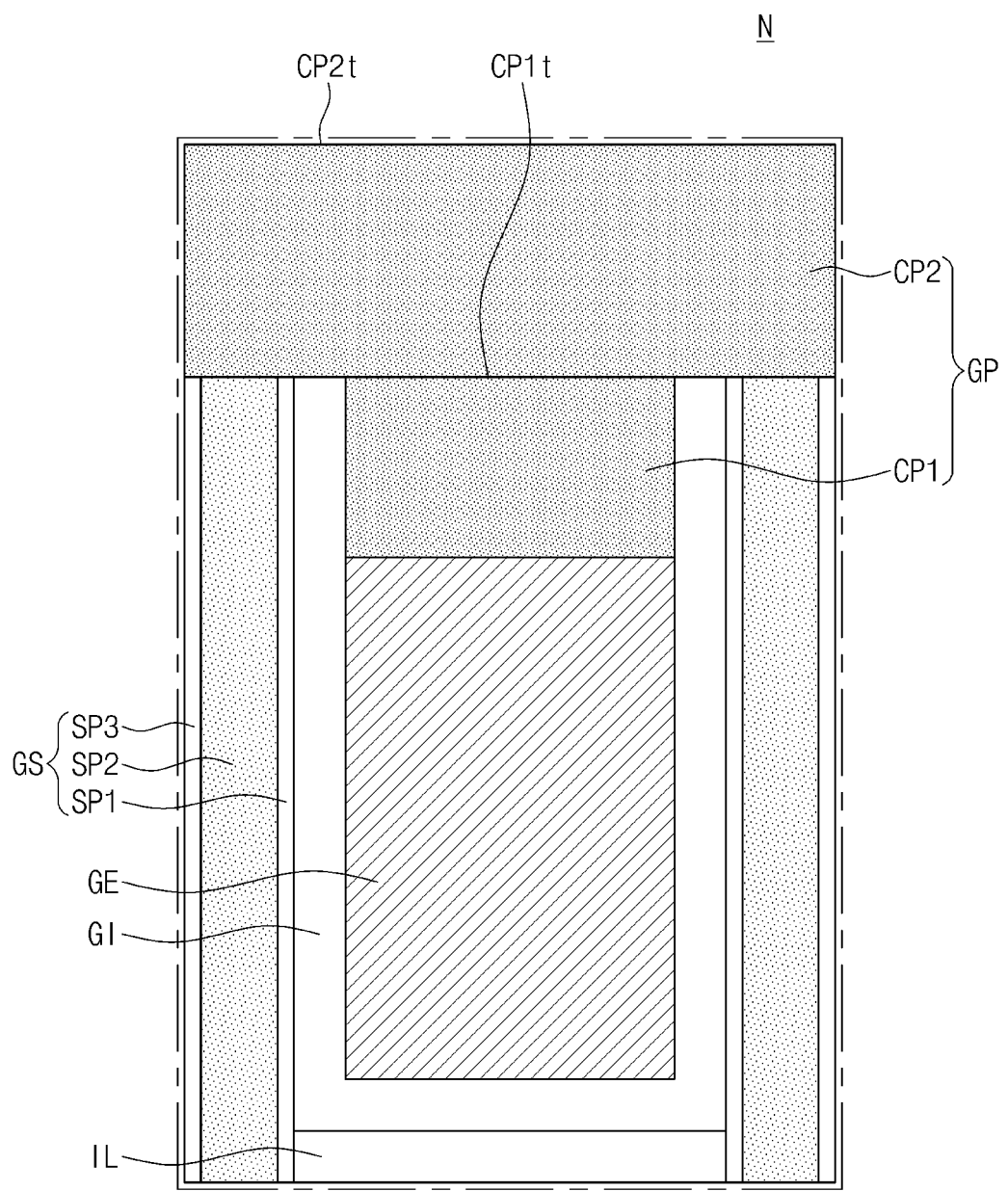

FIG. 3 is a plan view illustrating a semiconductor device according to an example of the inventive concept. FIGS. 4A, 4B and 4C are cross-sectional views taken along lines A-A', B-B' and C-C' of FIG. 3, respectively. FIG. 5 is an enlarged cross-sectional view of region "M" of FIG. 4A. FIGS. 6A, 6B and 6C are enlarged cross-sectional views of region "N" of FIG. 4A. Hereinafter, the same elements as described with reference to FIGS. 1 and 2 will not be described again or will only be mentioned briefly for the sake of brevity.

Referring to FIGS. 3, 4A through 4C, 5 and 6A, a substrate 100 may be provided. For example, the substrate 100 may be a silicon substrate, a germanium substrate or a silicon-on-insulator (SOI) substrate. A first transistor TR1 and a second transistor TR2 may be disposed on the substrate 100. The first and second transistors TR1 and TR2 may be provided on a region of the substrate 100.

In some examples, the region of the substrate 100 may be a memory cell region in which a plurality of memory cells for storing data are disposed. As an example, memory cell transistors configuring a plurality of SRAM cells may be disposed in the memory cell region of the substrate 100. The first and second transistors TR1 and TR2 may constitute two of the memory cell transistors, i.e., may be representative of the memory cell transistors.

In other examples, the region of the substrate 100 may be a logic cell region in which logic transistors configuring logic circuits of the semiconductor device are disposed. As an example, the logic transistors configuring a processor core or I/O terminals may be disposed in the logic cell region. The first and second transistors TR1 and TR2 may constitute two of the logic transistors, i.e., may be representative of the logic transistors. However, aspects of the inventive concept are not limited thereto.

The first and second transistors TR1 and TR2 may be transistors of different conductive types. For example, the first transistor TR1 may be a PMOSFET, and the second transistor TR2 may be an NMOSFET.

The substrate 100 may include a first active pattern AP1 and a second active pattern AP2 at the top thereof. The first active pattern AP1 may be an active pattern for the first transistor TR1, and the second active pattern AP2 may be an active pattern for the second transistor TR2.

The first and second transistors AP1 and AP2 may extend parallel to each other in the second direction D2. The first and second transistors AP1 and AP2 may be spaced apart from each other with a second device isolation pattern ST2 therebetween. First device isolation patterns ST1 may be disposed on opposite sides of the first active pattern AP1 and may define the first active pattern AP1. Also, the first device isolation patterns ST1 may be disposed on opposite sides of the second active pattern AP1 and may define the second active pattern AP2.

Although not shown, the first active pattern AP1 may include a plurality of first active regions adjacent to each other, and the second active pattern AP2 may include a plurality of second active regions adjacent to each other. In this case, the first device isolation patterns ST1 may be interposed between the adjacent first active regions and between the adjacent second active regions.

The first and second device isolation patterns ST1 and ST2 may be insulating layers connected to each other so as to be a substantially integral structure of insulating material. The second device isolation pattern ST2 may have a thickness greater than that of the first device isolation pattern ST1. In this case, the first device isolation pattern ST1 may be formed by a process separate from a process of forming the second device isolation pattern ST2. In some examples, the first and second device isolation patterns ST1 and ST2 may be concurrently formed and have substantially the same thickness. The first and second device isolation patterns ST1 and ST2 may be formed in the upper portion of the substrate 100. For example, the first and second device isolation patterns ST1 and ST2 may be constituted by a silicon oxide layer.

Gate electrodes GE may be disposed on and cross the first and second active patterns AP1 and AP2. The gate electrodes GE may extend in the first direction D1 to traverse the first and second device isolation patterns ST1 and ST2. The gate electrodes GE may be spaced apart from each other in the second direction D2.

Interfacial layers IL may be respectively interposed between the first and second active patterns AP1 and AP2 and the gate electrodes GE. The interfacial layers IL may respectively cover upper portions of the first and second active patterns AP1 and AP2 (e.g., top surfaces and sidewalls of channel regions CH that will be described later). The interfacial layers IL may include a silicon oxide layer.

Referring again to FIG. 6A, a gate dielectric pattern GI may be interposed between the gate electrode GE and the interfacial layer IL. Spacer structures GS may be disposed on opposite side surfaces of the gate electrodes GE, respectively. A capping structure GP may be disposed on the gate electrode GE. The spacer structures GS may each include first through third spacers SP1, SP2 and SP3. The capping structure GP may include a first capping pattern CP1 and a second capping pattern CP2 that are sequentially stacked. The gate electrodes GE, the gate dielectric pattern GI, the spacer structures GS and the capping pattern GP may be similar to those described with reference to FIGS. 1 and 2.

Referring again to FIGS. 3 and 4A through 4C, the first and second active patterns AP1 and AP2 may include source/drain regions SD and channel regions CH that are respectively positioned at upper portions of the first and second active patterns AP1 and AP2. Specifically, the source/drain regions SD may be disposed at opposite sides of the gate electrodes GE. As an example, the source/drain regions SD of the first active pattern AP1 may have a p-type conductivity, and the source/drain regions SD of the second active pattern AP2 may have an n-type conductivity.

The channel region CH may be disposed between respective ones of the source/drain regions SD. The channel region CH may be vertically juxtaposed with the gate electrodes GE. Although the gate electrode GE as shown in FIG. 1 covers a top surface of the channel region CH, each of the gate electrodes GE according to the example of the inventive concept may cover the top surface and sidewalls of the channel region CH.

The source/drain regions SD may include epitaxial patterns that are grown using the first and second active patterns AP1 and AP2 under the source/drain regions SD as a seed. In this case, the source/drain regions SD of the first active pattern AP1 may include a material applying a compressive strain to the channel region CH. The source/drain regions SD of the second active pattern AP2 may include a material applying a tensile strain to the channel region CH. For example, in the case in which the substrate 100 is a silicon substrate, the source/drain regions SD of the first active pattern AP1 may include SiGe, of which a lattice constant is greater than that of Si. The source/drain regions SD of the second active pattern AP2 may include SiC, of which a lattice constant is smaller than that of Si, or may include Si, of which a lattice constant is substantially equal to that of the substrate 100. When viewed in cross section, referring to FIG. 4C, the source/drain regions SD of the first active pattern AP1 may have a shape different from the source/drain regions SD of the second active pattern AP2. This may be because the source/drain regions SD of the first active pattern AP1 and the source/drain regions SD of the second active pattern AP2 are epitaxially grown using different substances.

A first interlayer insulating layer 130 may be disposed on the substrate 100 and fill gaps between the gate electrodes GE. A top surface of the first interlayer insulating layer 130 may be coplanar with top surfaces of the capping structures GP. A second interlayer insulating layer 140 may be disposed on the first insulating layer 130. The first and second interlayer insulating layers 130 and 140 may include a silicon oxide layer.

Active contacts CA that are electrically connected to at least one of the source/drain regions SD may be provided. The active contacts CA may pass through the second interlayer insulating layer 140 and the first interlayer insulating layer 130 and be electrically connected to the source/drain region SD. The active contacts CA may be disposed at a side or opposite sides of at least one of the gate electrodes GE. The active contacts CA may each include a conductive structure 185 and a barrier pattern 180 surrounding the conductive structure 185. The barrier pattern 180 may include a barrier conductive layer including, for example, at least one of titanium nitride, tungsten nitride and tantalum nitride. The conductive structure 185 may include a metal layer including, for example, at least one of tungsten, titanium and tantalum.

The capping structure GP being in contact with the active contact CA will be described in more detail with reference to FIGS. 4A and 5. In an example of the inventive concept, the active contact CA may be a self-aligned contact (SAC). The active contact CA may be disposed between adjacent ones of the gate electrodes GE. The active contact CA may contact the capping structure GP on at least one of the adjacent gate electrodes GE.

The capping structure GP contacting the active contact CA may be in a state in which a portion of the capping structure GP is removed in comparison with another capping structure GP not contacting the active contact CA. Specifically, the capping pattern GP contacting the active contact CA may be recessed. In other words, the second capping pattern CP2 may have a sloped sidewall ER that contacts the active contact CA.

Since a portion of the second capping pattern CP2 is missing due to the active contact CA, a width of the second capping pattern CP2 may vary in the direction of its height. More specifically, the width of the second capping pattern CP2 may gradually decrease in a direction away from the substrate 100 (e.g., in a third direction D3). In other words, a lower portion of the second capping pattern CP2 may be wider than an upper portion of the second capping pattern CP2 (in direction D2 in FIG. 4A).

An upper portion of the spacer structure GS that contacts the active contact CA may be recessed due to the active contact CA. In this respect, the upper portion of the spacer structure GS may have a sloped sidewall ERa. The sloped sidewall ER of the second capping pattern CP2 may extend directly from, i.e., be contiguous with, the sloped sidewall ERa of the spacer structure GS to form a continuously sloped or curved sidewall ER and ERa. The active contact CA may extend downwardly along the sloped sidewall ER and ERa and directly cover a sidewall of the spacer structure GS.

For example, the portion of the second capping pattern CP2 which lays atop the spacer structure GS may have a convex surface in contact with the contact structure CA. The spacer structure GS (i.e., third spacer SP3) may also have a convex surface in contact with the contact structure CA. The convex surface of the second capping pattern CP2 meets the convex surface of the spacer structure GS (i.e., the convex surface of the third spacer SP3) at a location adjacent to the contact structure CA. Adjacent to this location where the convex surfaces meet, the radius of curvature of the convex surface of the second capping pattern CP2 may be substantially the same as the radius of curvature of the convex surface of the spacer structure GS (i.e., the radius of curvature of the convex surface of the third spacer SP3). In other words, there may be a smooth transition of one surface to the other, i.e., there may be substantially no inflection point at the location where the curved side surfaces of the second capping pattern CP2 and spacer structure GS meet.

While forming the active contact CA, the first through third spacers SP1, SP2 and SP3 may be protected by the second capping pattern CP2. Because the second spacer SP2 has a relatively low dielectric constant, a parasitic capacitance that may occur between the gate electrode GE and the active contact CA may be reduced.

The second capping pattern CP2 may be vertically spaced apart from the gate electrode GE by the first capping pattern CP1 and the spacer structure GS. Therefore, even if the second capping pattern CP2 has a relatively high dielectric constant, it may not affect parasitic capacitance occurring between the gate electrode GE and the active contact CA.

The capping structure GP of another example of a semiconductor device according to the inventive concept will now be described with reference to FIGS. 4A, 6B and 6C.

As an example of the inventive concept, first, referring to FIGS. 4A and 6B, an insulating pattern NO may be interposed between the first capping pattern CP1 and the second capping pattern CP2. The insulating pattern NO may include a native oxide formed on the first capping pattern CP1 and the spacer structures GS. Thus, the insulating pattern NO may directly cover a top surface CP of the first capping pattern CP1 and top surfaces GSt of the spacer structure GS.

As an example, in the case in which the first capping pattern CP1 include SiN, the insulating pattern NO may include a silicon oxide layer (i.e., native oxide layer) formed on the SiN layer. However, the native oxide layer is not limited to the silicon oxide layer. The material of the native oxide layer depends on materials from which the first capping pattern CP1 and the spacer structures GS are formed. For example, in the case in which the first capping pattern CP1 includes $Al_2O_3$, the insulating pattern NO may include an aluminum oxide layer as the native oxide layer, formed on the $Al_2O_3$ layer.

As another example of the inventive concept, referring to FIGS. 4A and 6C, the first capping pattern may have a substantially flat top surface CP1t. In other words, unlike the first capping pattern CP1 and the second capping pattern CP2 as described with reference to FIGS. 1 and 2, the first capping pattern CP1 according to this example may not include an indentation DE and the second capping pattern CP2 may also not include a protrusion portion PP. The top surface CP1t of the first capping pattern CP1 may be substantially coplanar with the top surfaces GSt of the spacer structures GS.

FIGS. 7, 9, 11, 13, 15, 17, 19, 21, 23 and 25 are plan views illustrating a method of manufacturing a semiconductor device according to an example of the inventive concept. FIGS. 8A, 10A, 12A, 14A, 16A, 18A, 20A, 22A, 24A and 26A are cross-sectional views taken along lines A-A' of FIGS. 7, 9, 11, 13, 15, 17, 19, 21, 23 and 25, respectively, FIGS. 8B, 10B, 12B, 14B, 16B, 18B, 20B, 22B, 24B and 26B are cross-sectional views taken along lines B-B' of FIGS. 7, 9, 11, 13, 15, 17, 19, 21, 23 and 25, respectively, and FIGS. 10C, 12C, 14C, 16C, 18C, 20C, 22C, 24C and 26C are cross-sectional views taken along lines C-C' of FIGS. 9, 11, 13, 15, 17, 19, 21, 23 and 25, respectively.

Figure 7:
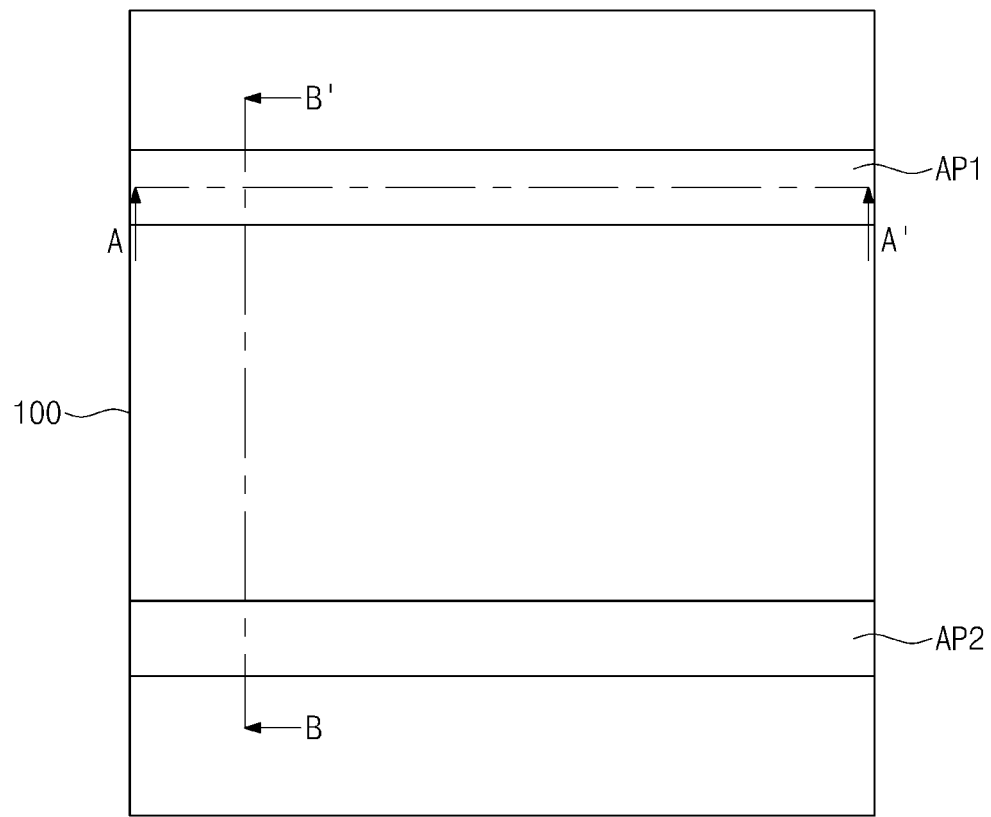
Figure 8A:
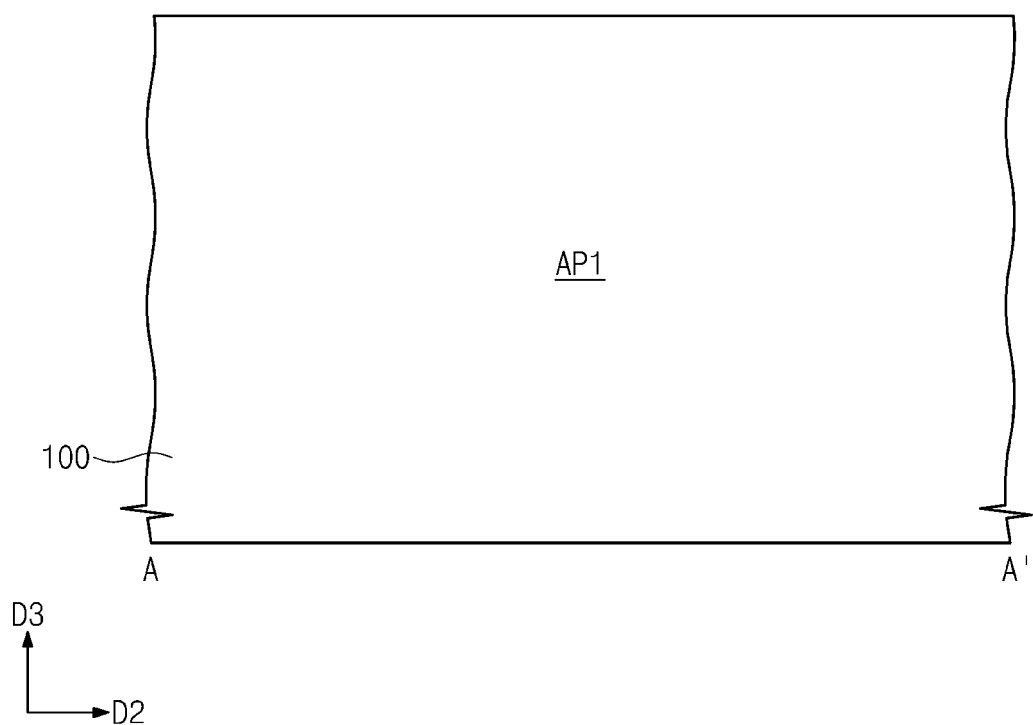
FIGS. 8A, 10A, 12A, 14A, 16A, 18A, 20A, 22A, 24A and 26A are cross-sectional views taken along lines A-A' of FIGS. 7, 9, 11, 13, 15, 17, 19, 21, 23 and 25, respectively.
Figure 8B:
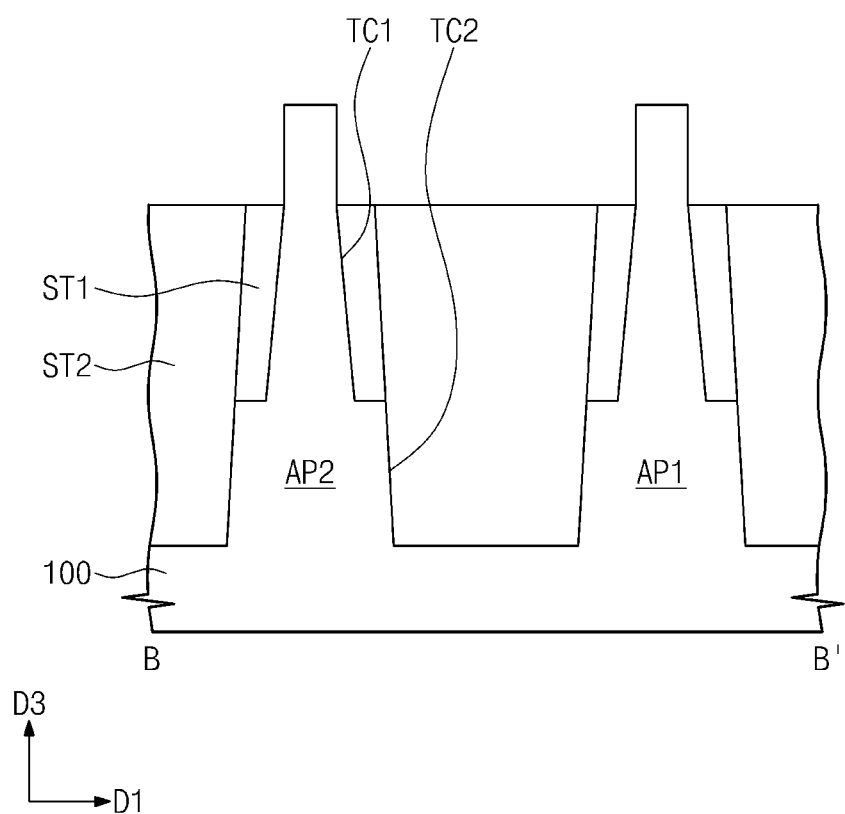
FIGS. 8B, 10B, 12B, 14B, 16B, 18B, 20B, 22B, 24B and 26B are cross-sectional views taken along lines B-B' of FIGS. 7, 9, 11, 13, 15, 17, 19, 21, 23 and 25, respectively.
Figure 10A:
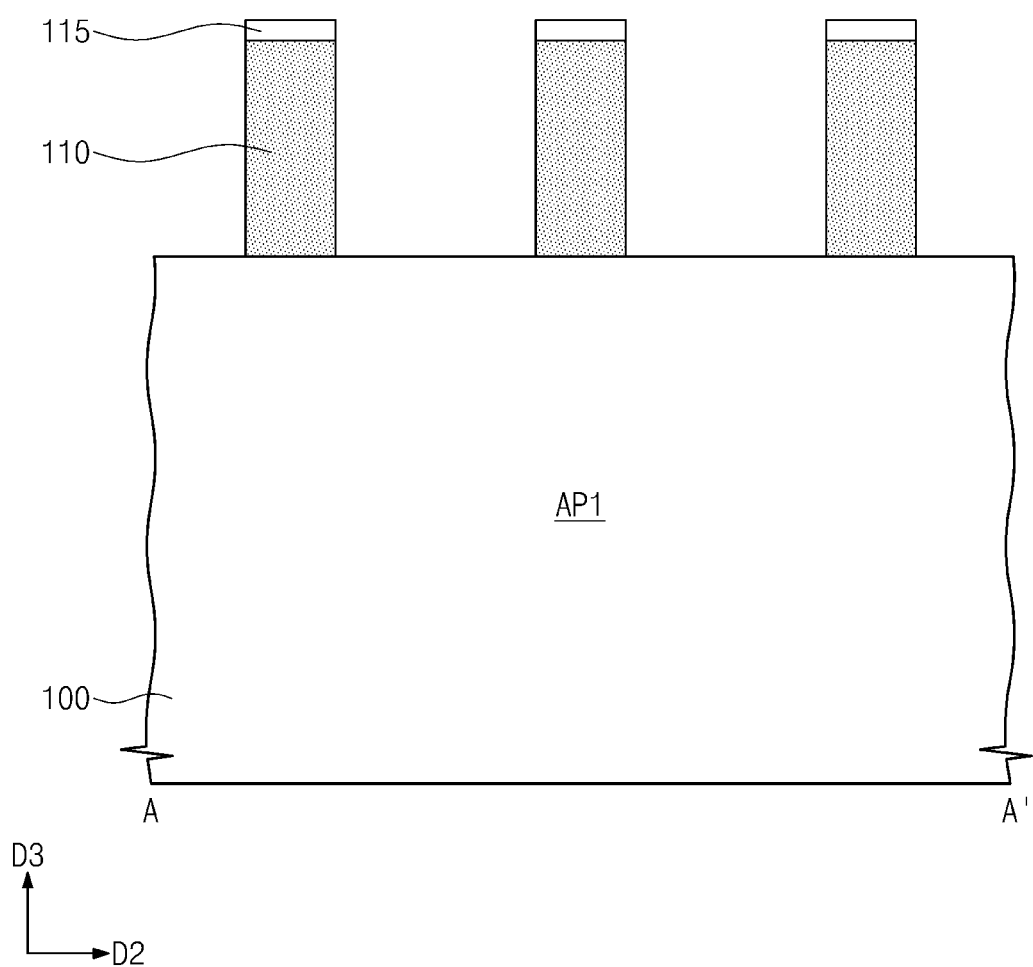
Figure 10B:
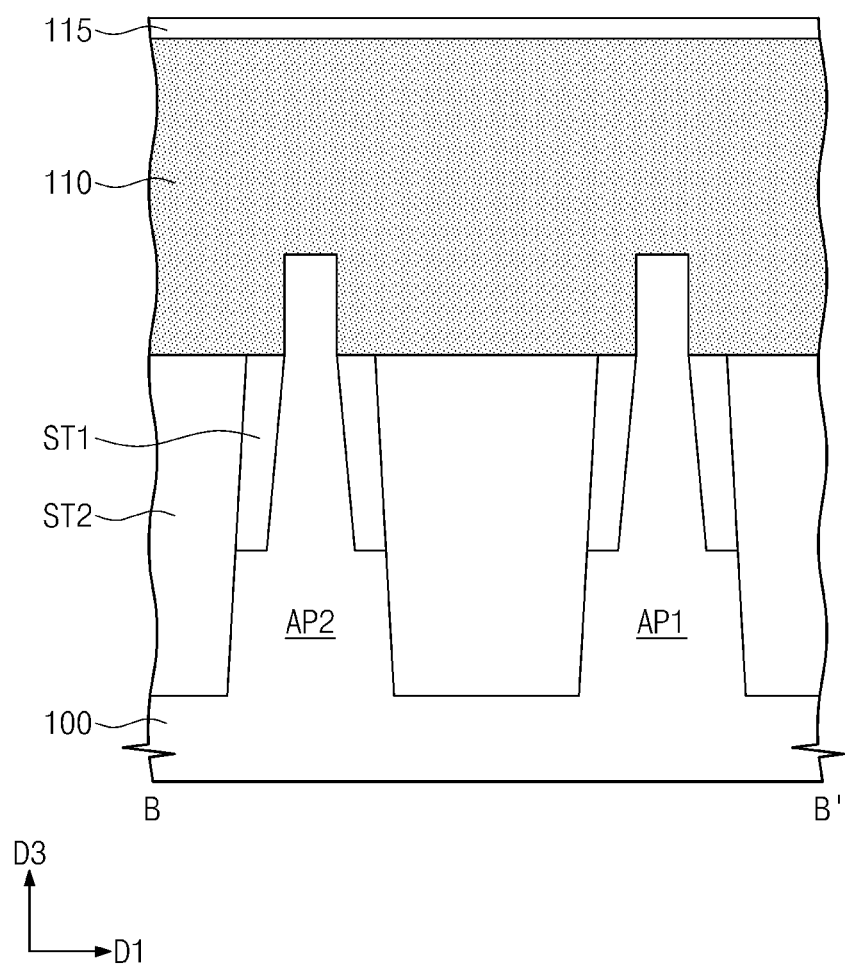
Figure 10C:
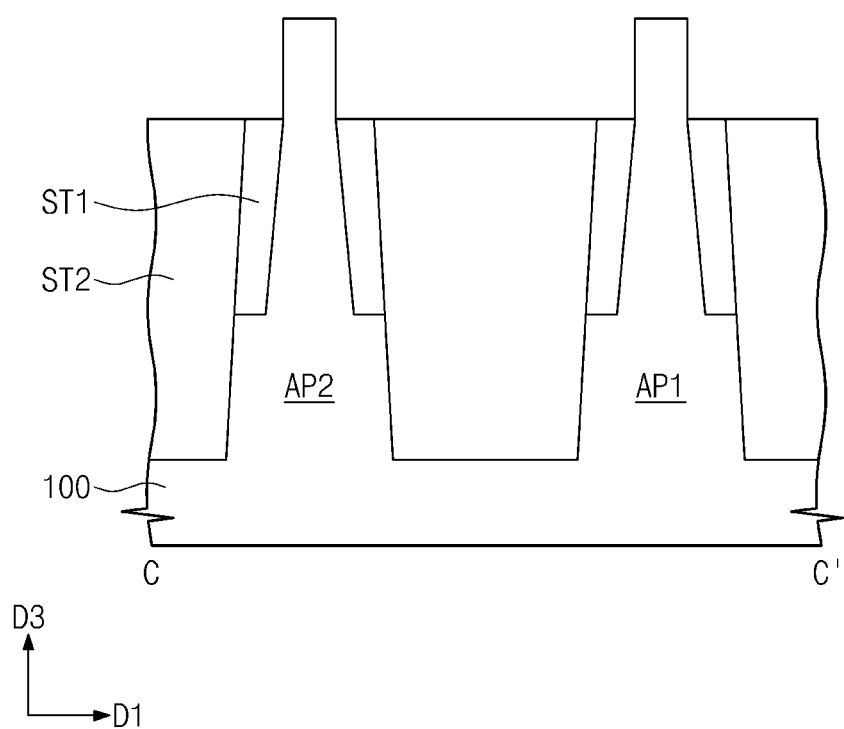
FIGS. 10C, 12C, 14C, 16C, 18C, 20C, 22C, 24C and 26C are cross-sectional views taken along lines C-C' of FIGS. 9, 11, 13, 15, 17, 19, 21, 23 and 25, respectively.

Referring to FIGS. 7, 8A and 8B, a first active pattern AP1 and a second active pattern AP2 may be formed in a region of a substrate 100. For example, the substrate 100 may be a silicon substrate, a germanium substrate or a silicon-on-insulator (SOI) substrate. In some examples, the region of the substrate 100 may be a memory cell region in which a plurality of memory cells for storing data are disposed. In other examples, the region of the substrate 100 may be a logic cell region in which a plurality of logic transistors for forming logic circuits are disposed.

Specifically, first trenches TC1 that define the first active pattern AP1 and the second active pattern AP2 may be formed by patterning an upper portion of the substrate 100. The first and second active patterns AP1 and AP2 may be spaced apart from each other in the first direction D1. The first and second active patterns AP1 and AP2 may have a linear shape that extends in the second direction D2. First device isolation patterns ST1 may be formed to fill the first trenches T1. The first device isolation patterns ST1 may be formed to expose upper portions of the first and second active patterns AP1 and AP2. In other words, the upper portions of the first and second active patterns AP1 and AP2 may protrude vertically (e.g., in the third direction D3) above the first device isolation patterns ST1.

Next, the upper portion of the substrate may be patterned again to form second trenches TC2. At least one of the second trenches TC2 may be formed between the first active pattern AP1 and the second active pattern AP2. When forming the second trenches TC2, a portion of the first device isolation patterns ST1 may be removed. Bottom surfaces of the second trenches TC2 may be lower than those of the first trenches TC1. Second device isolation patterns ST2 may be formed to fill the second trenches TC2.

As an example, the first and second device isolation patterns ST1 and ST2 may together form a structure of substantially one integral or unitary layer of insulating material. The first and second device isolation patterns ST1 and ST2 may be formed of silicon oxide.

Referring to FIGS. 9, 10A through 10C, sacrificial gate patterns 110 and gate mask patterns 115 on the respective sacrificial gate mask patterns 115 may be formed on the substrate 100. The sacrificial gate patterns 110 may be formed to cross the first and second active patterns AP1 and AP2 and extend in the first direction D1. The sacrificial gate patterns 110 may cover top surfaces and sidewalls of the first and second active patterns AP1 and AP2. In addition, the sacrificial gate patterns 110 may cover a portion of top surfaces of the first and second device isolation patterns ST1 and ST2.

The forming of the sacrificial gate patterns 110 and the gate mask patterns 115 may include sequentially forming a sacrificial gate layer and a gate mask layer on the substrate 100 to cover he first and second patterns AP1 and AP2 and sequentially patterning the sacrificial gate layer and the gate mask layer. The sacrificial gate layer may include polysilicon. The gate mask layer may include silicon nitride or silicon oxynitride.

Figure 11:
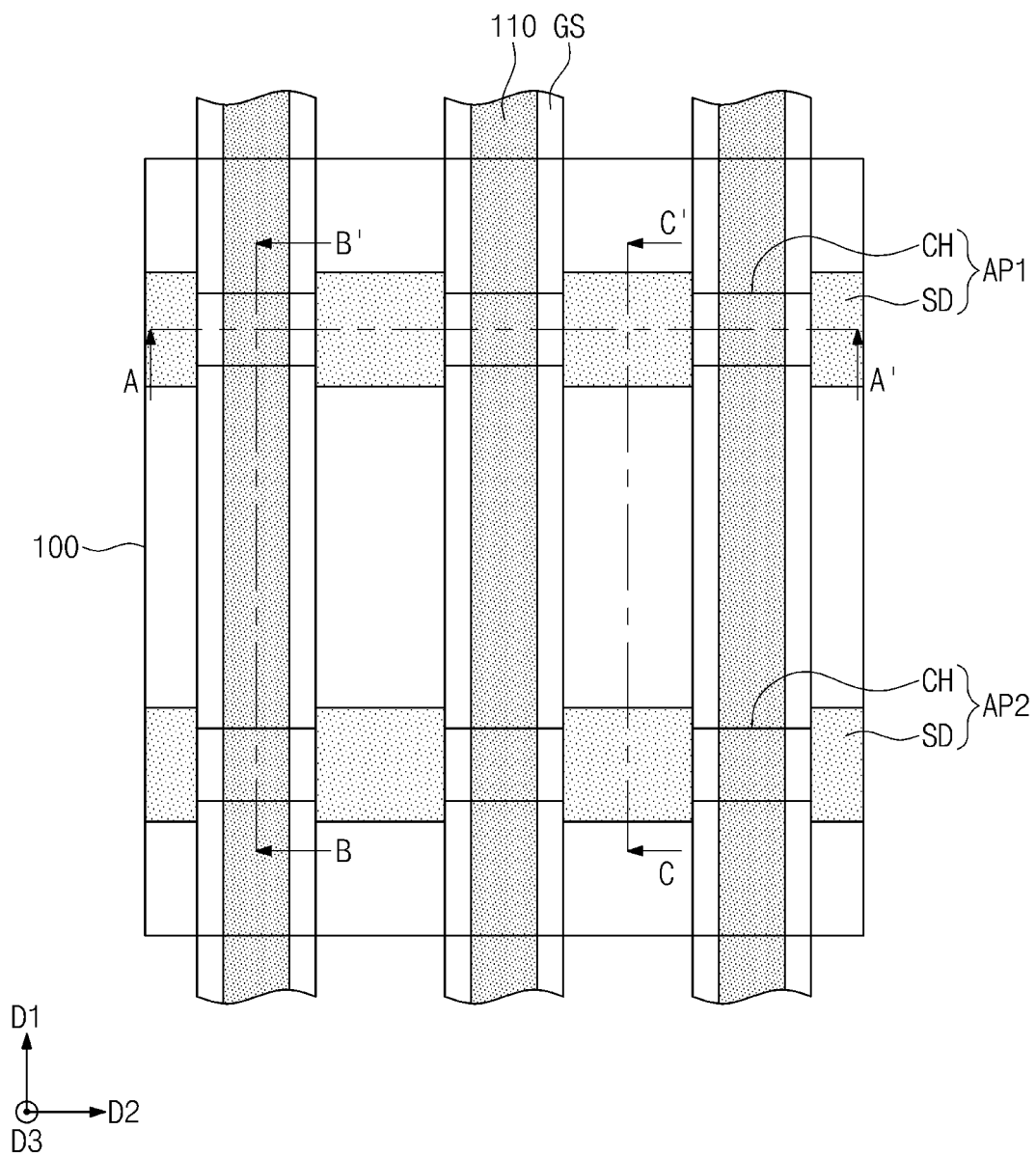
Figure 12A:
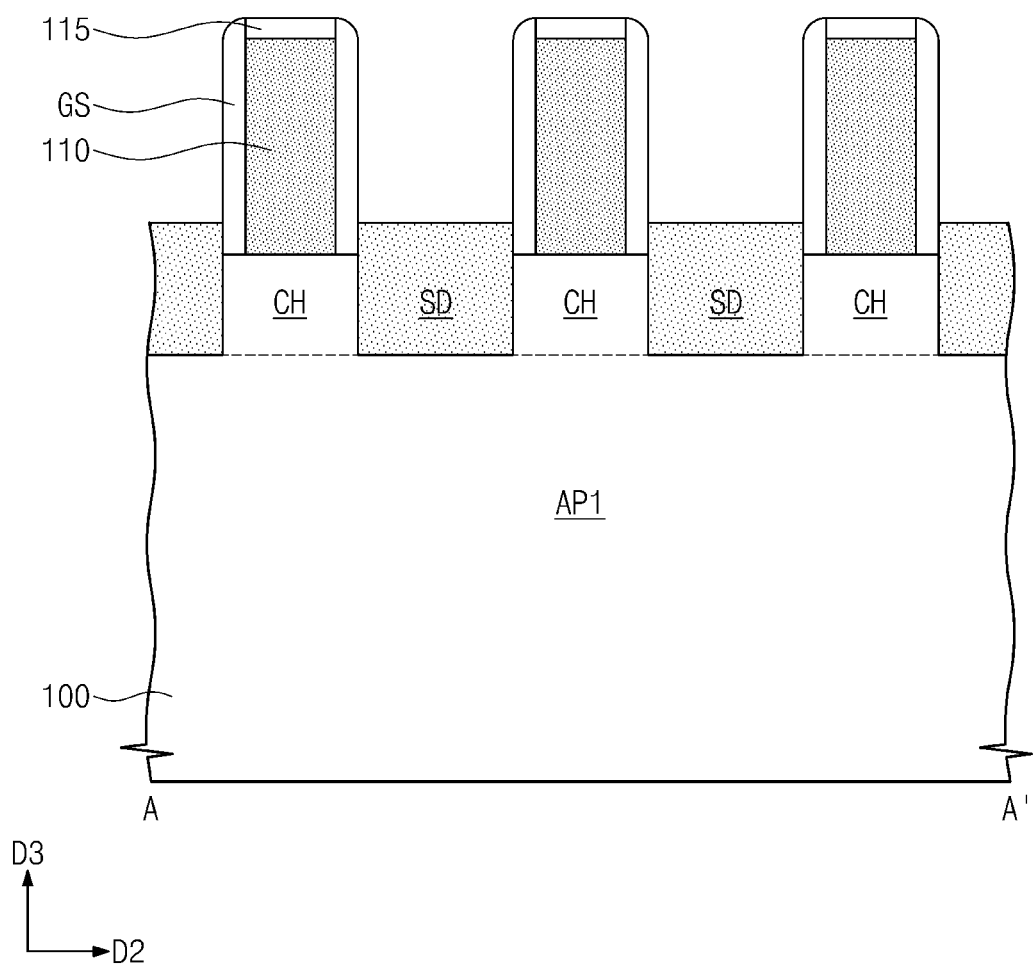
Figure 12B:
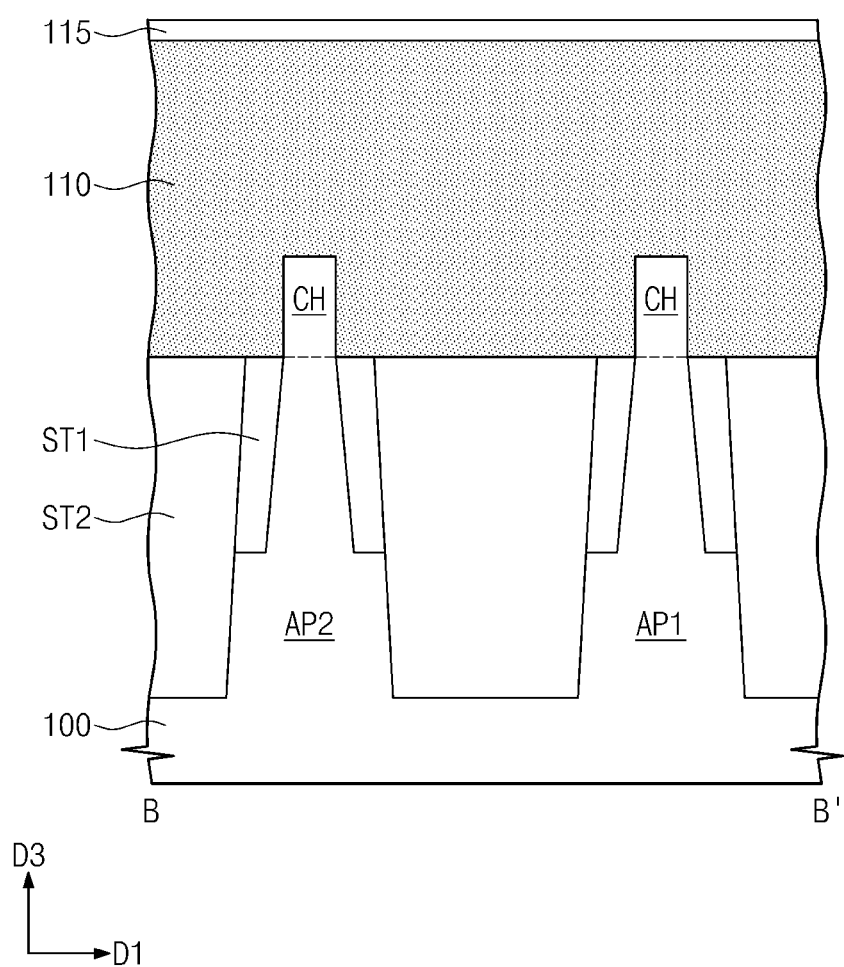
Figure 12C:
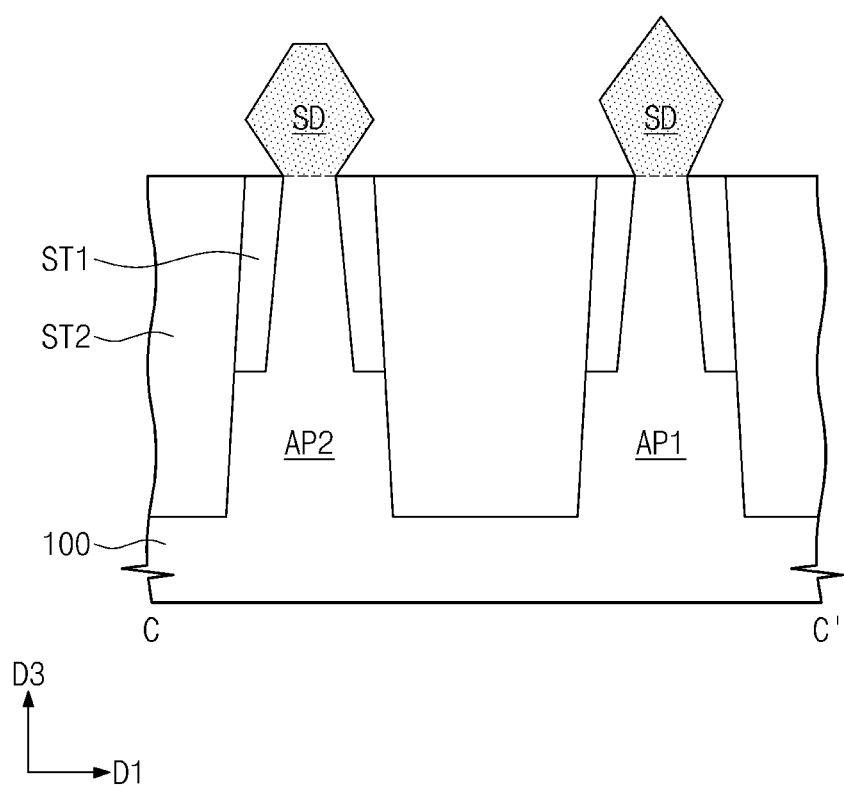
Figure 13:
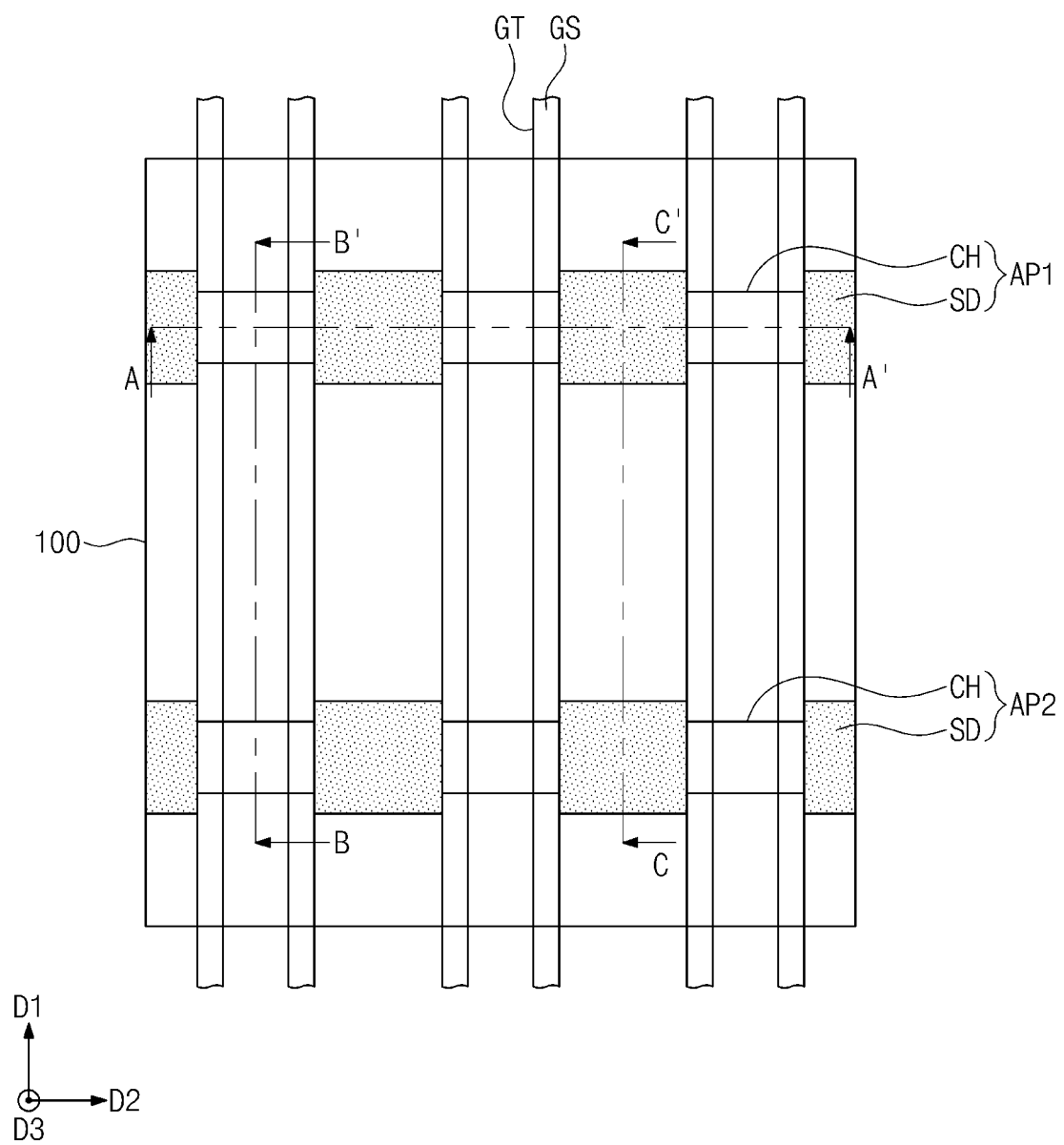
Figure 14A:
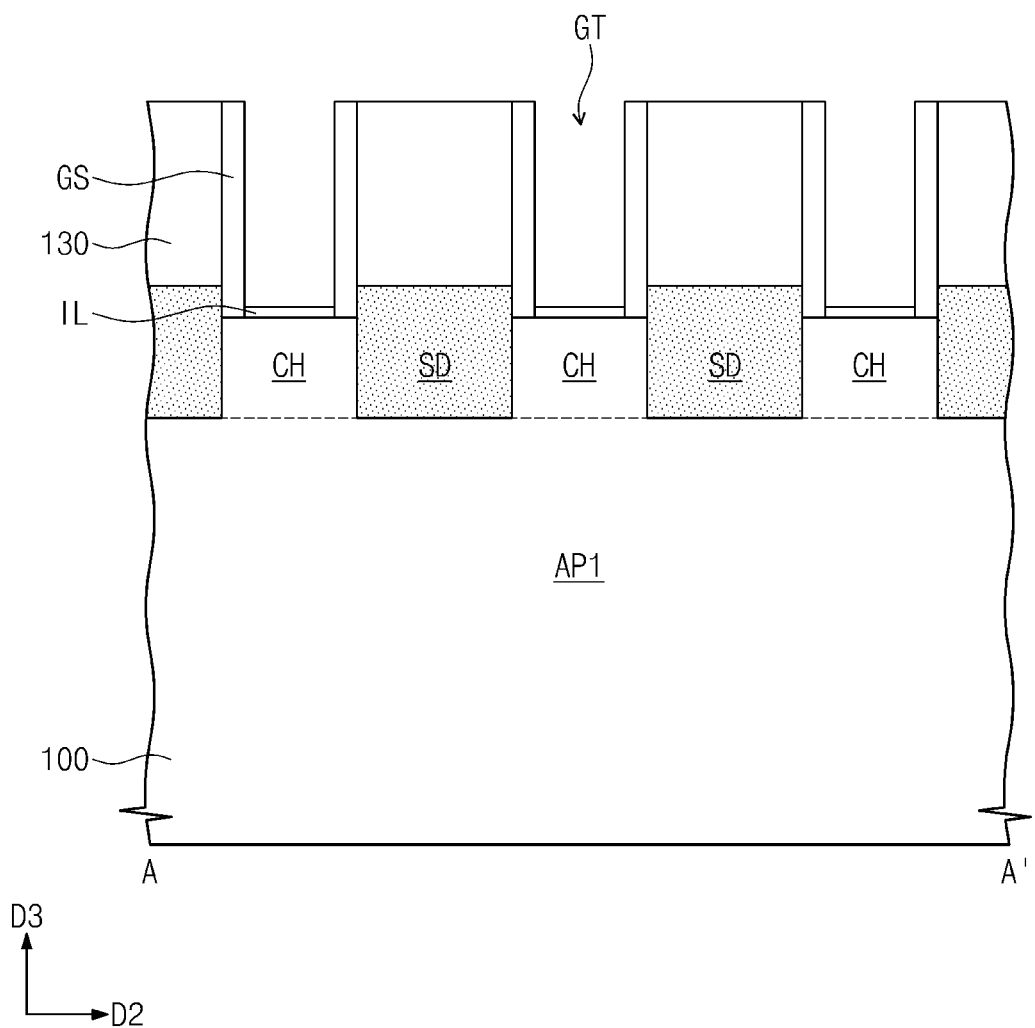
Figure 14B:
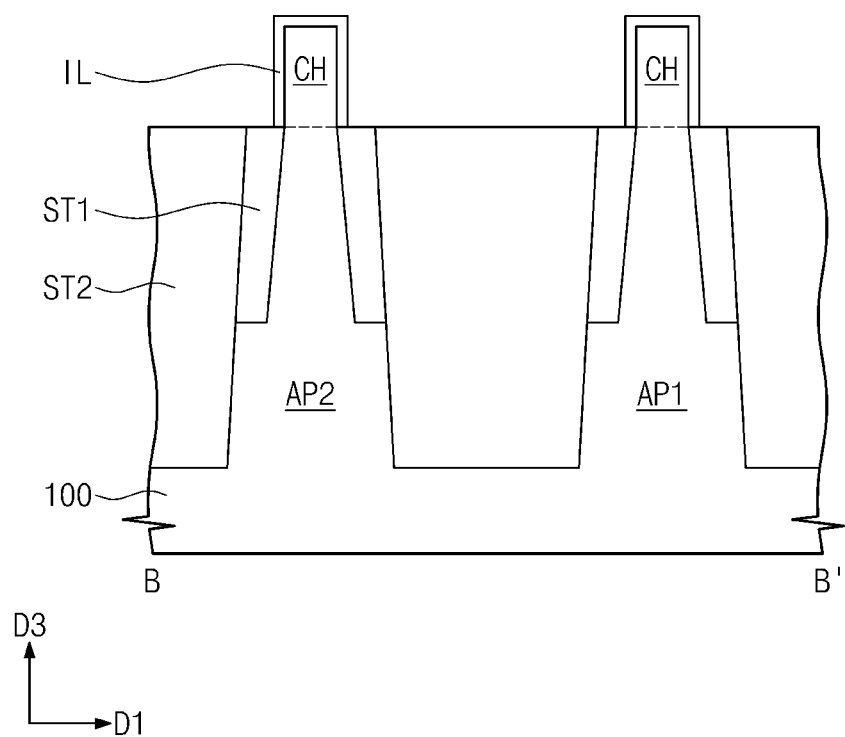
Figure 14C:
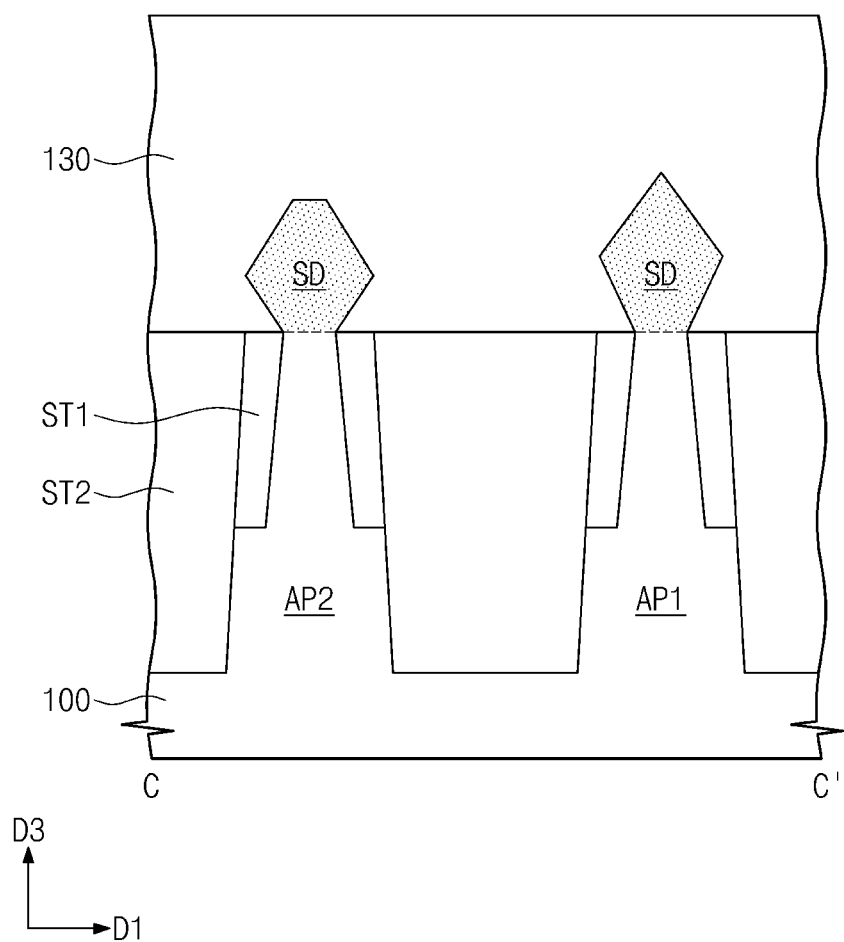
Figure 15:
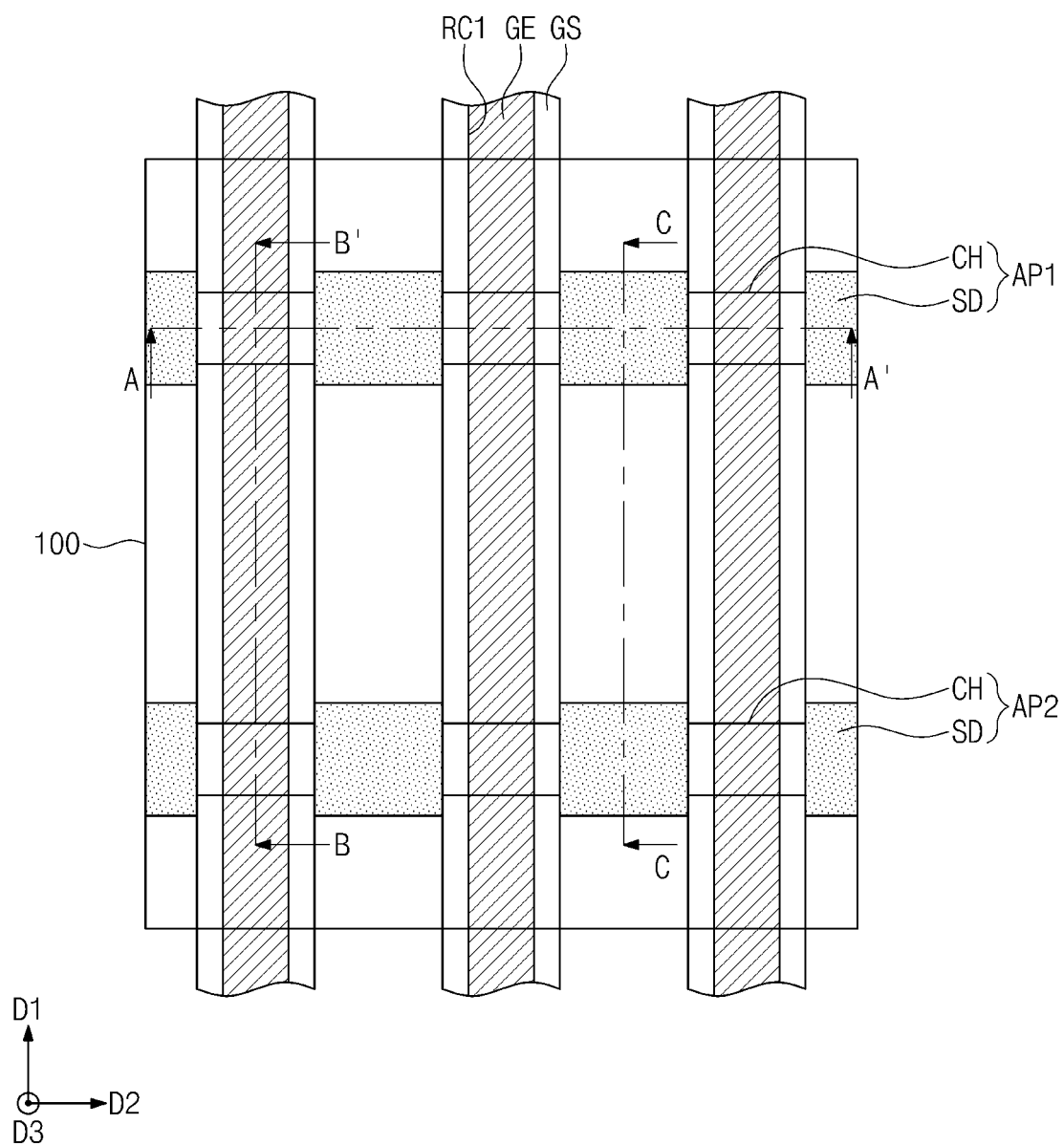
Figure 16A:
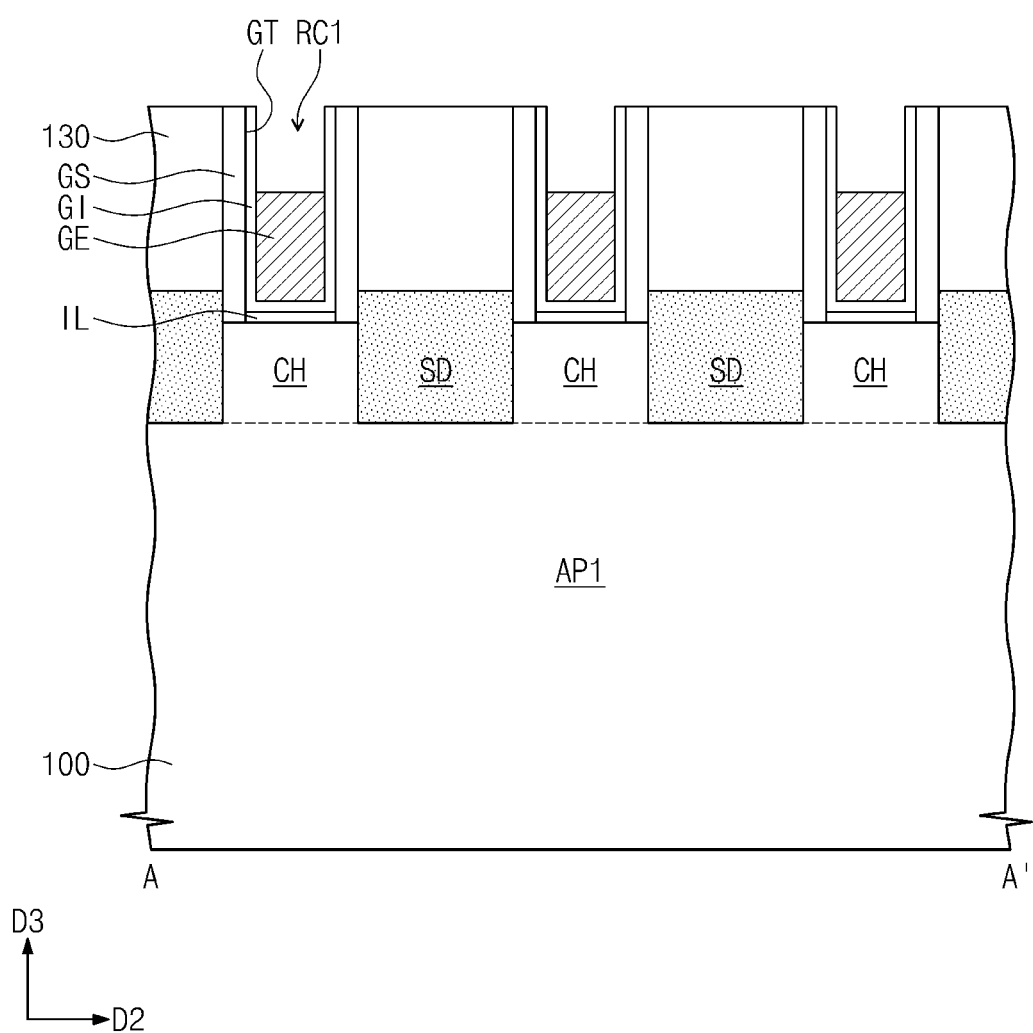
Figure 16B:
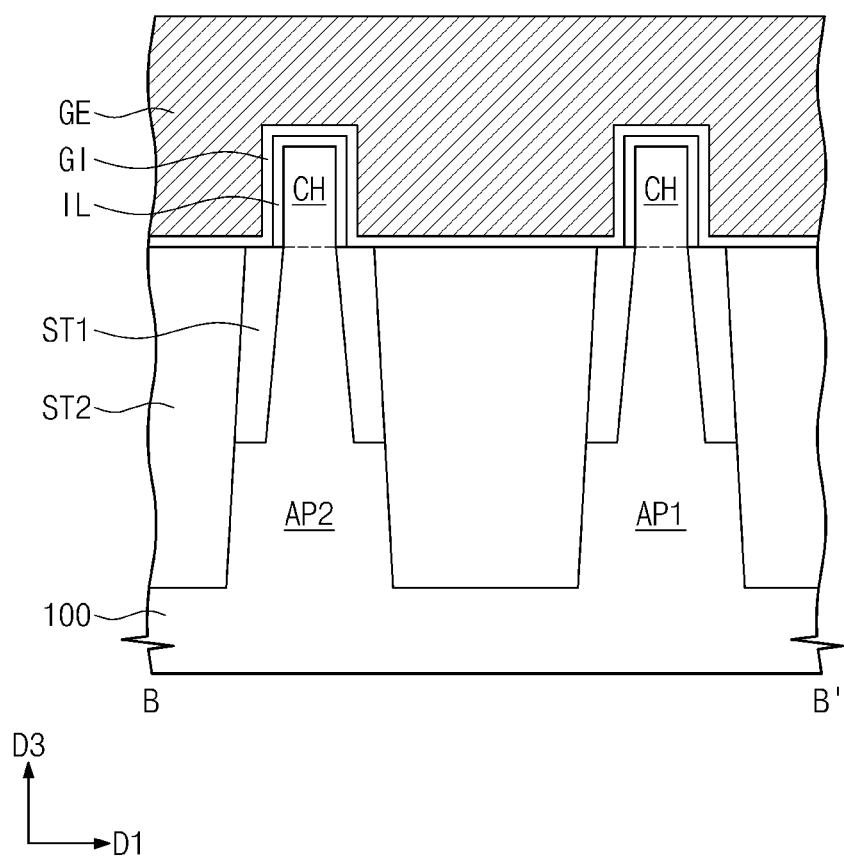
Figure 16C:
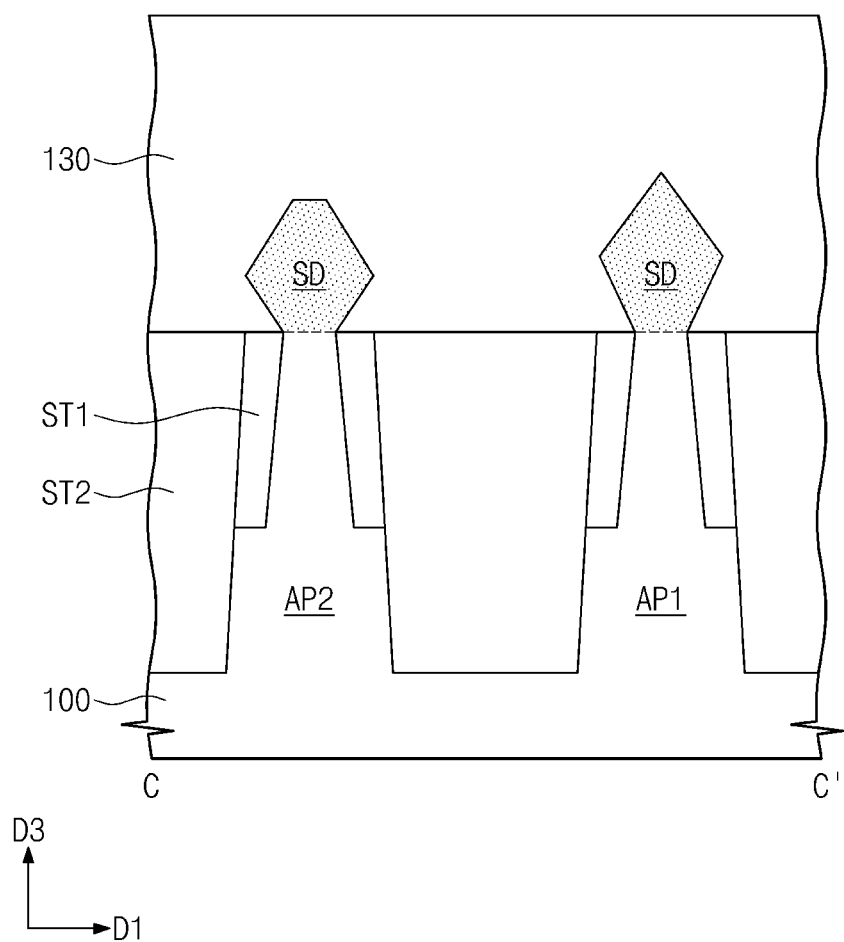
Figure 17:
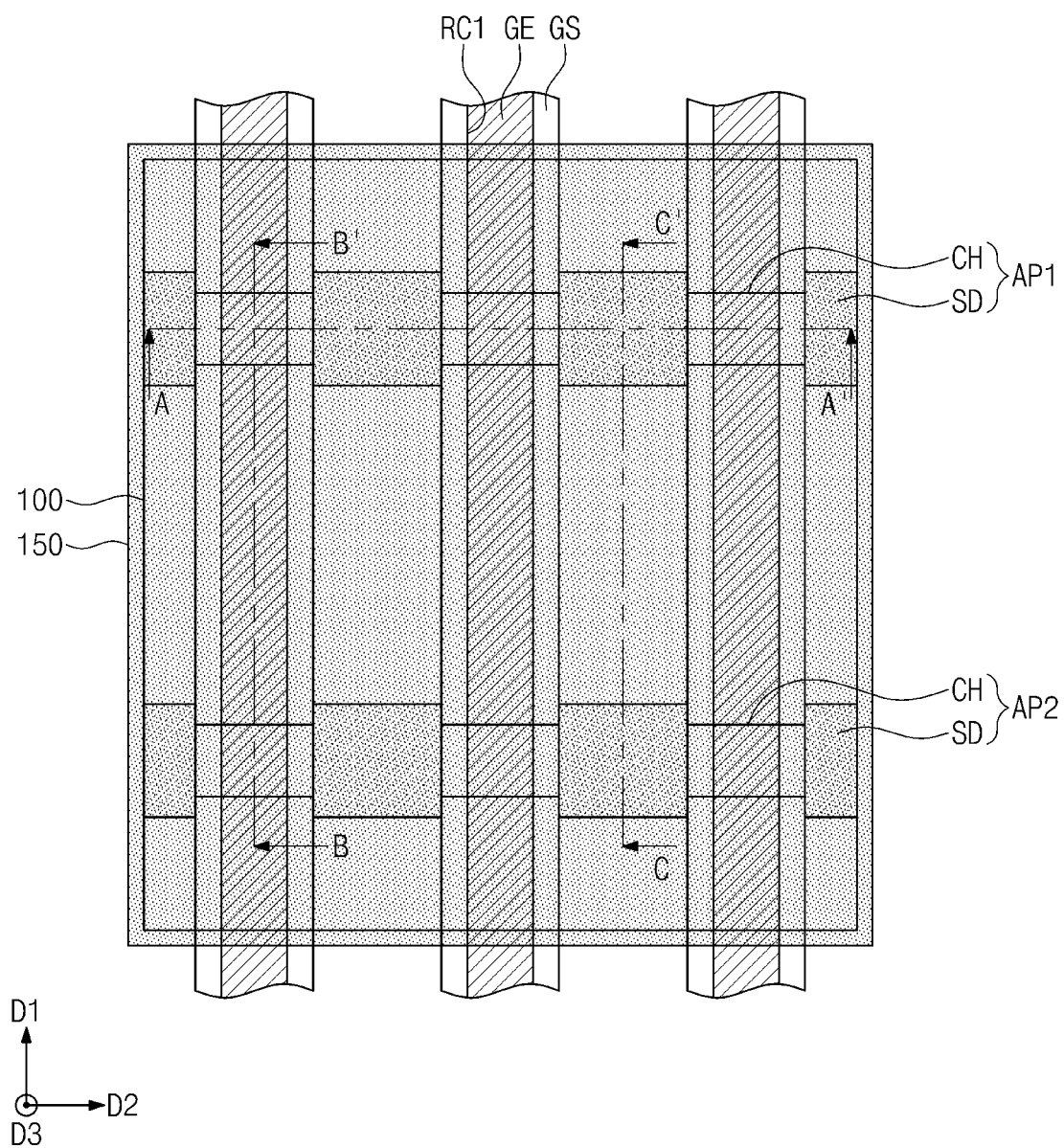
Figure 18A:
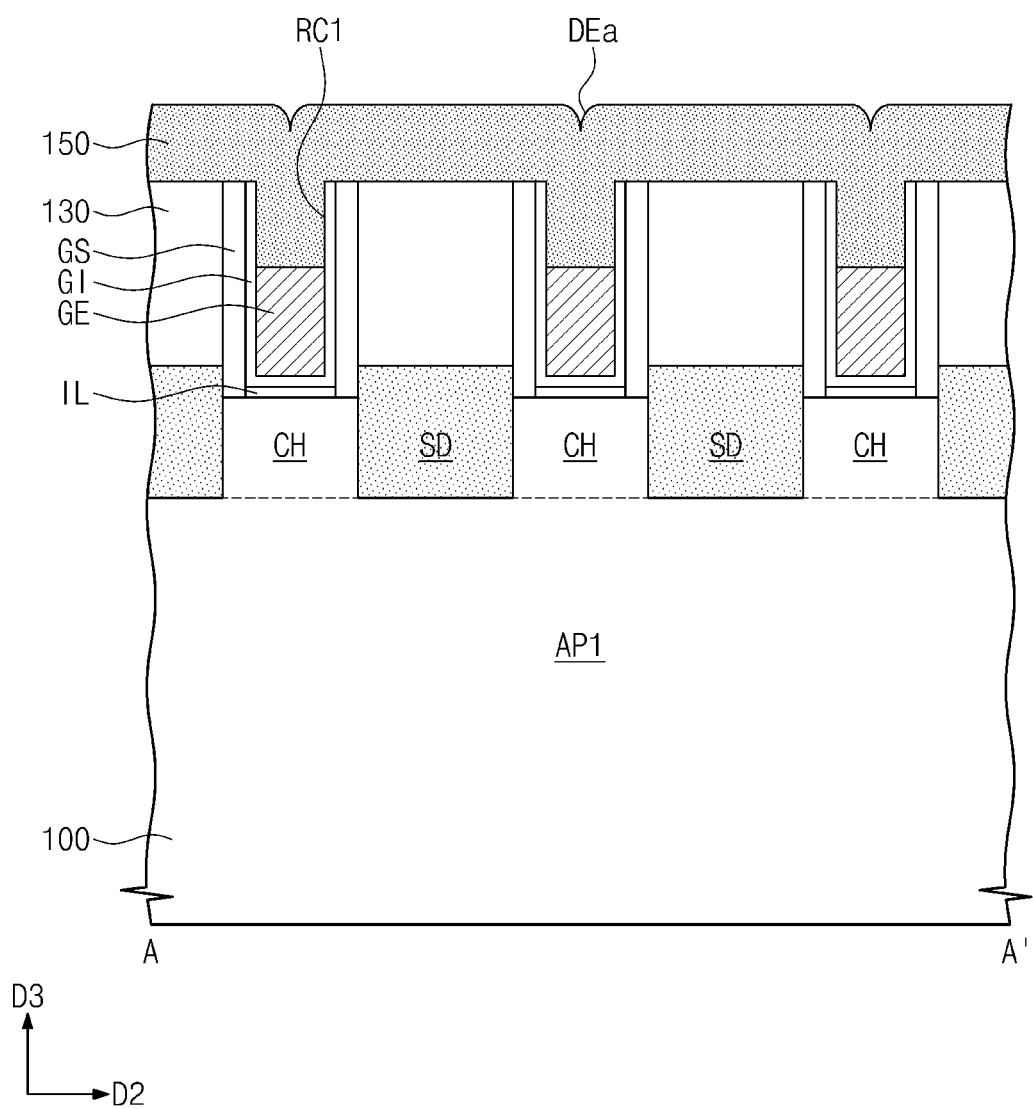
Figure 18B:
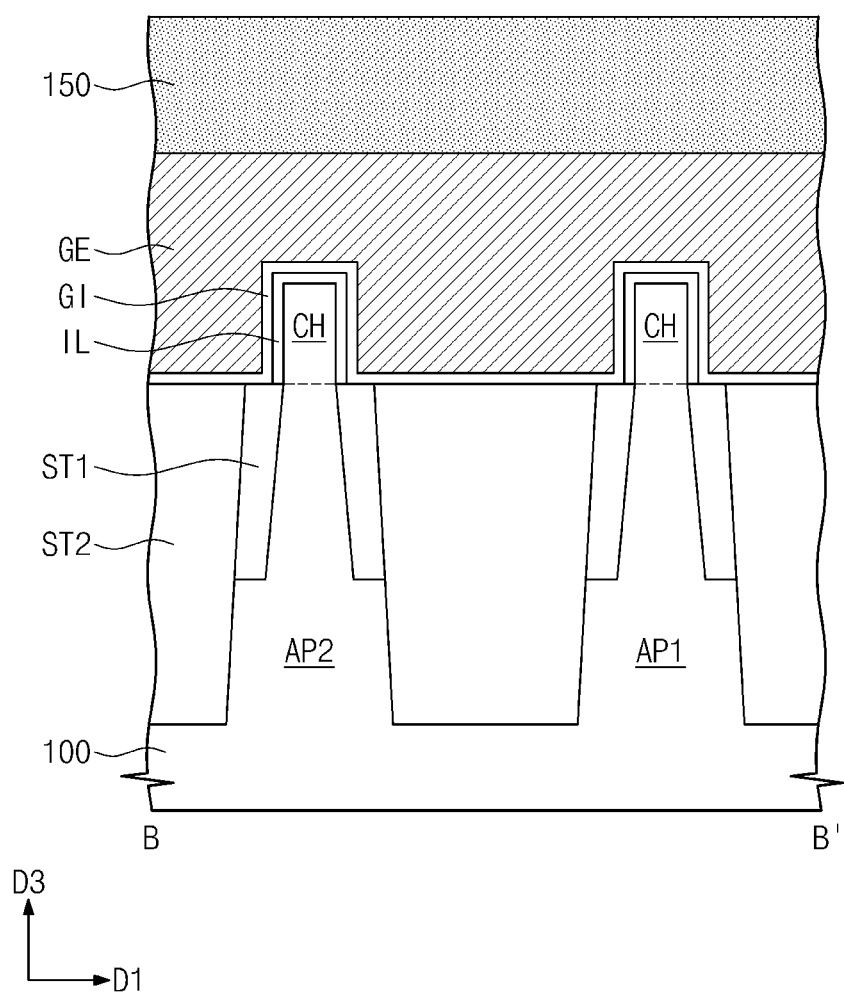
Figure 18C:
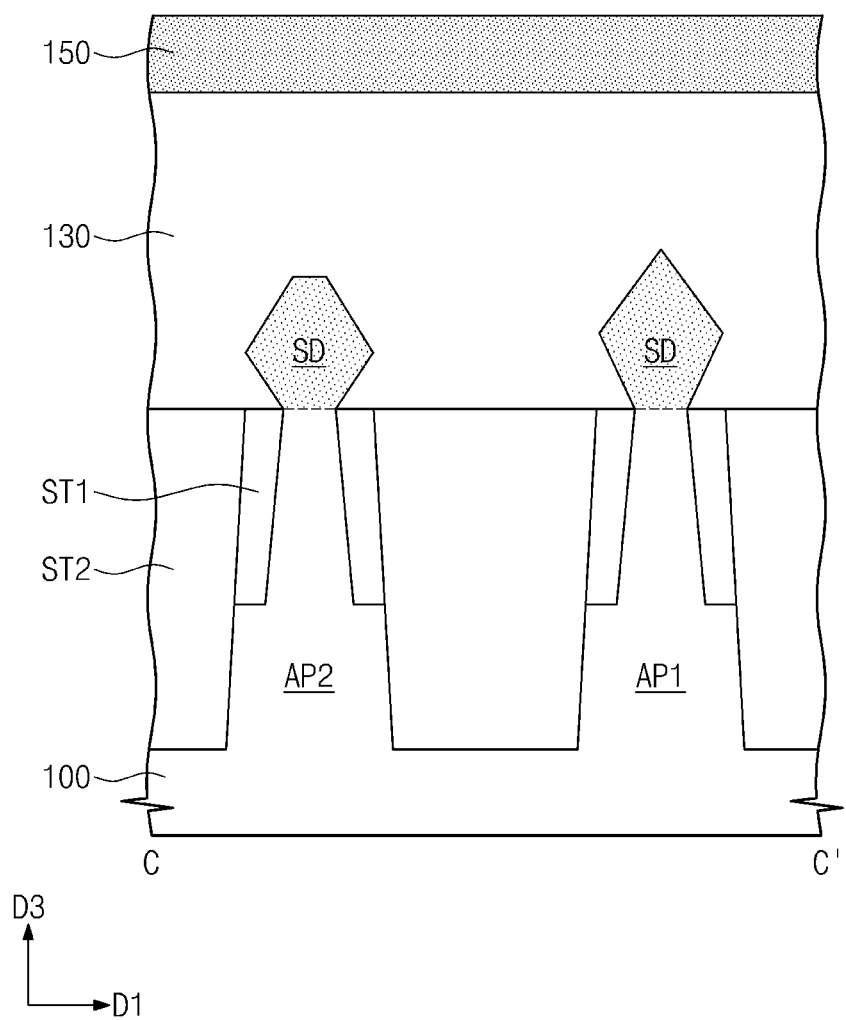
Figure 19:
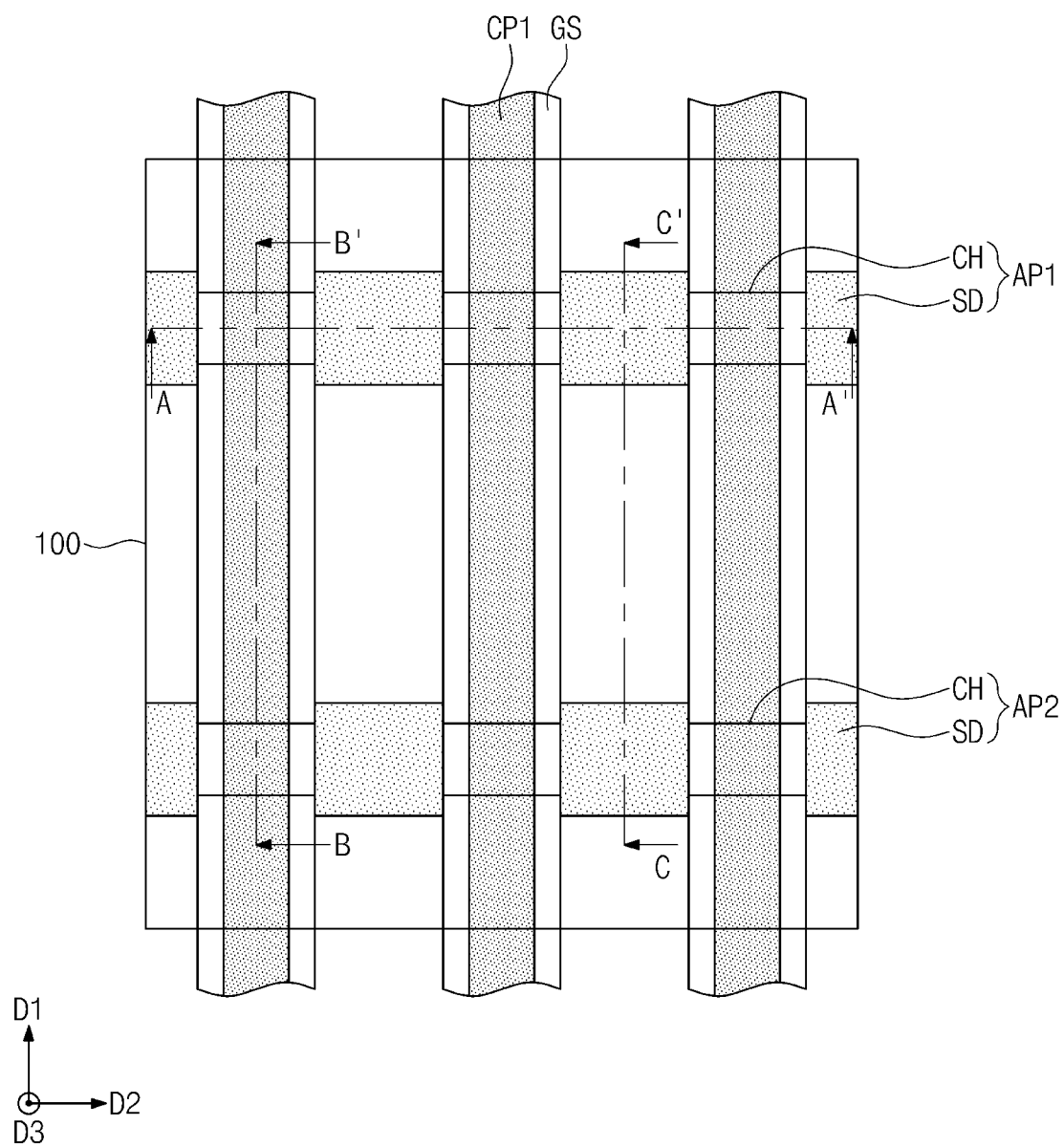
Figure 20A:
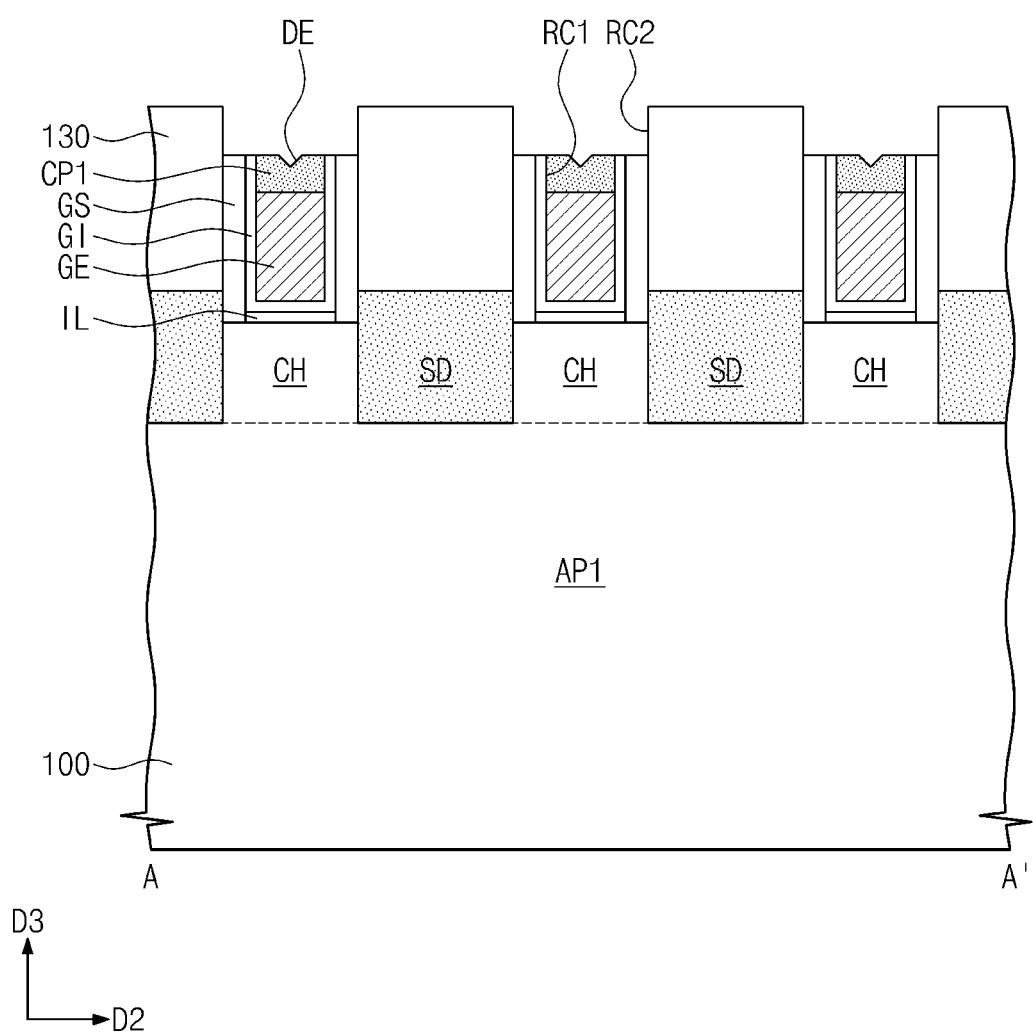
Figure 20B:
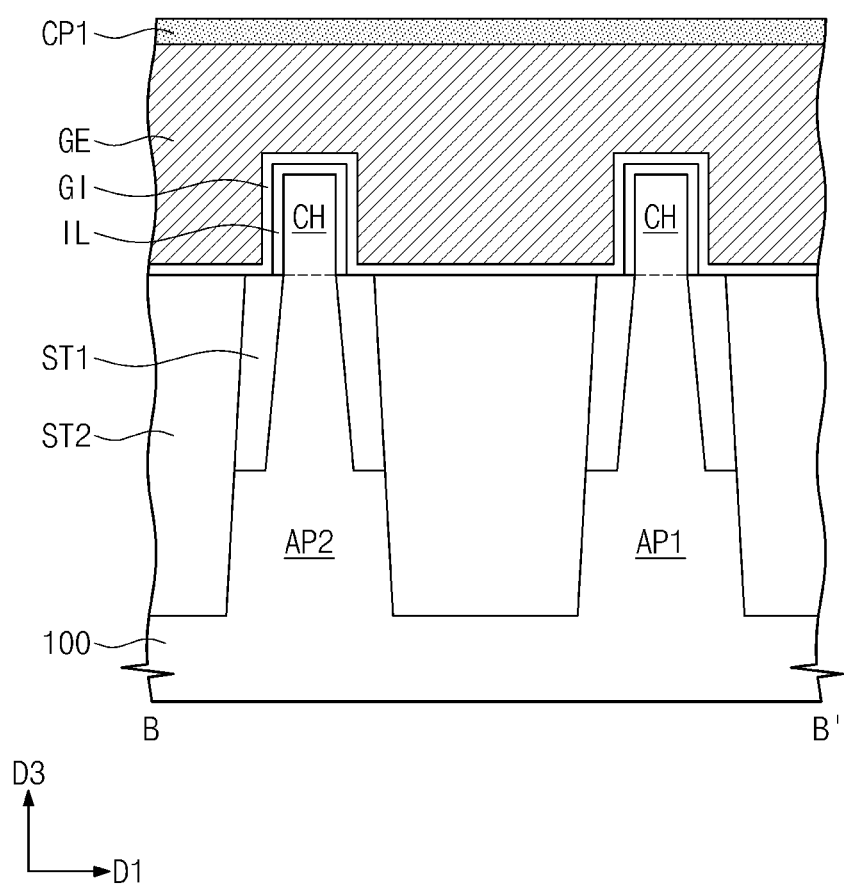
Figure 20C:
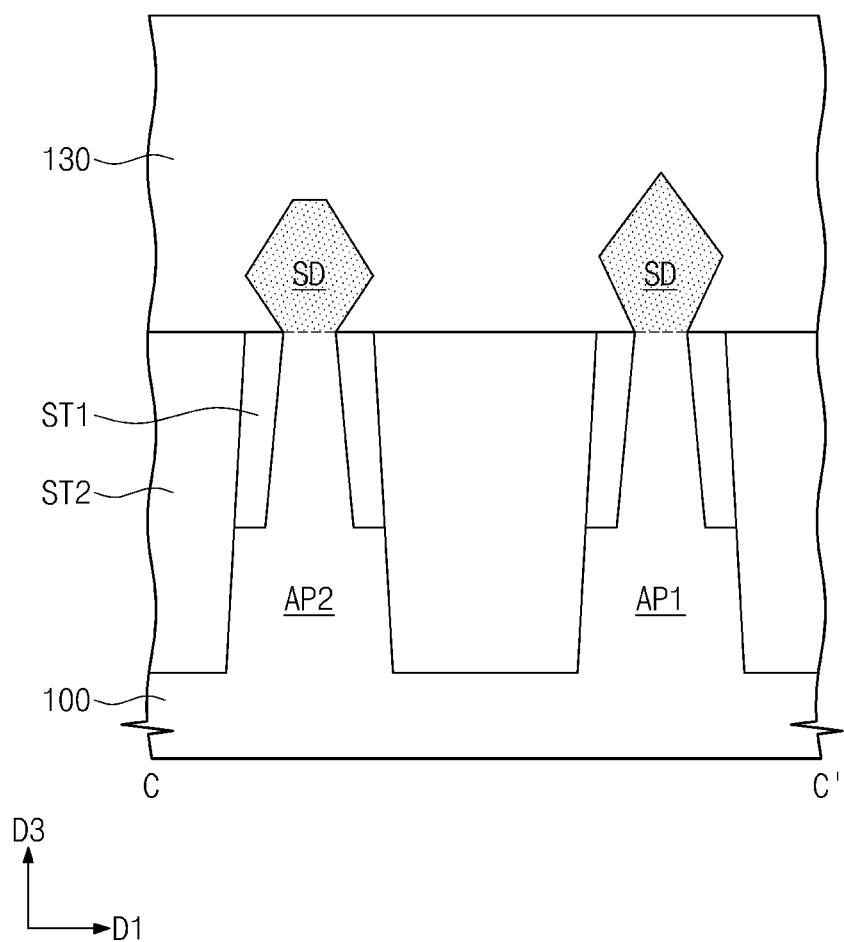
Figure 21:
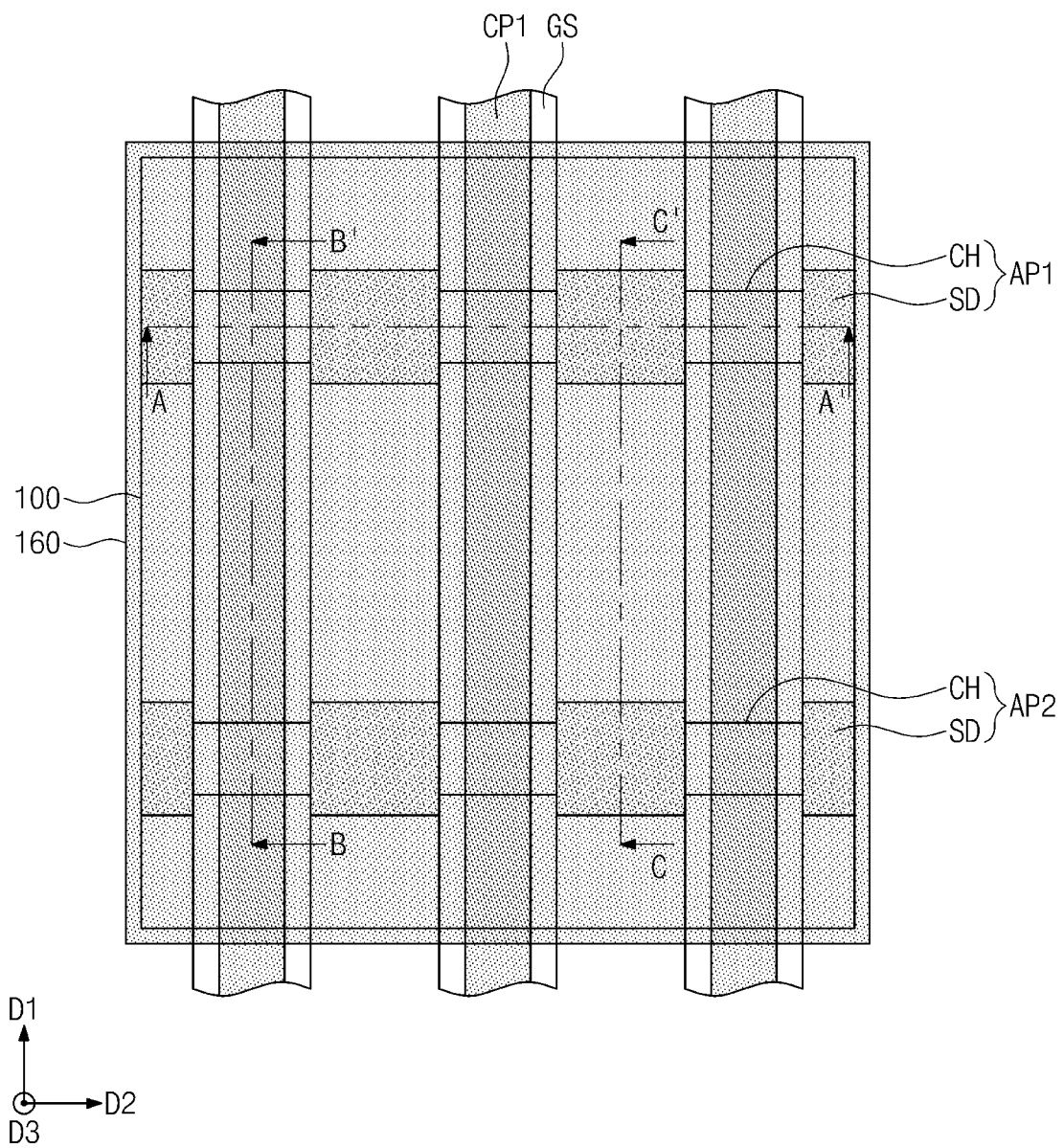
Figure 22A:
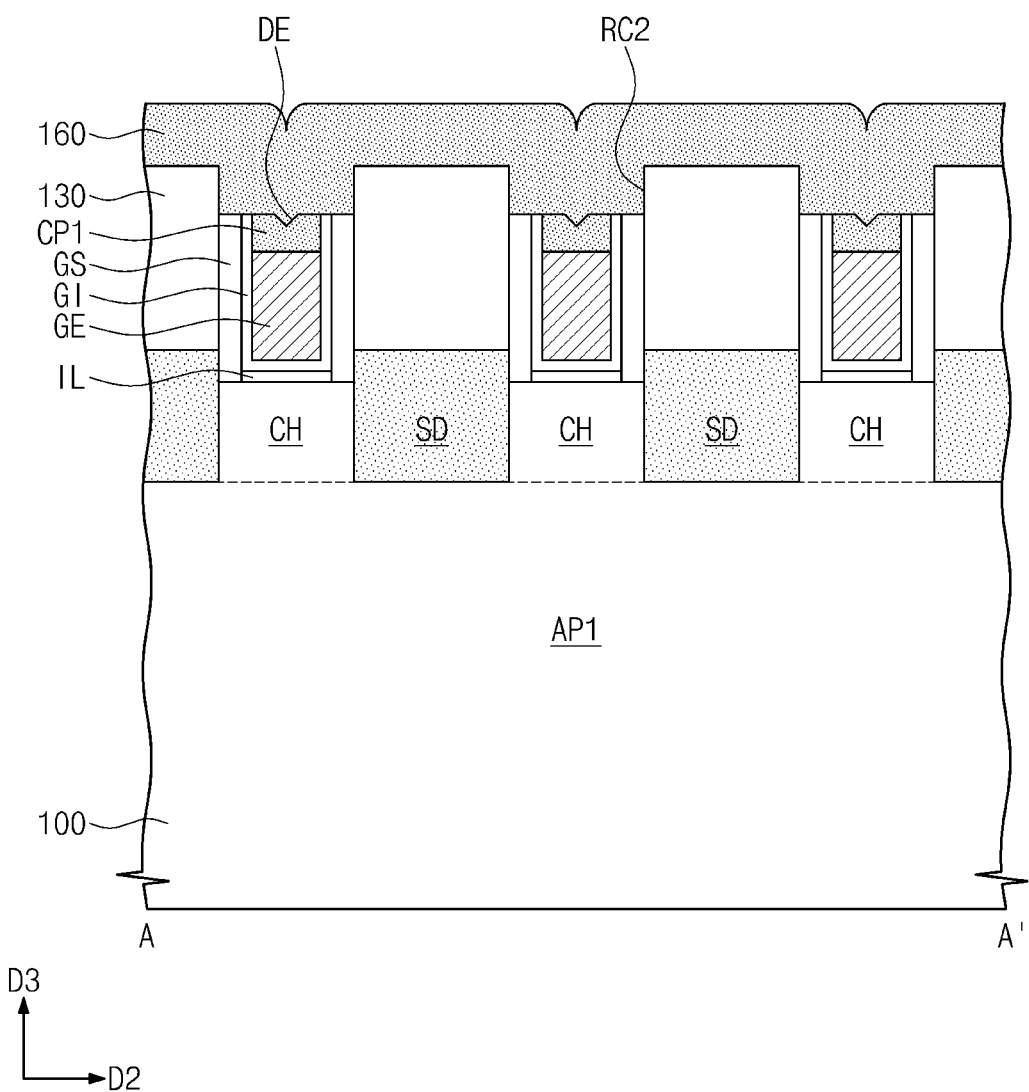
Figure 22B:
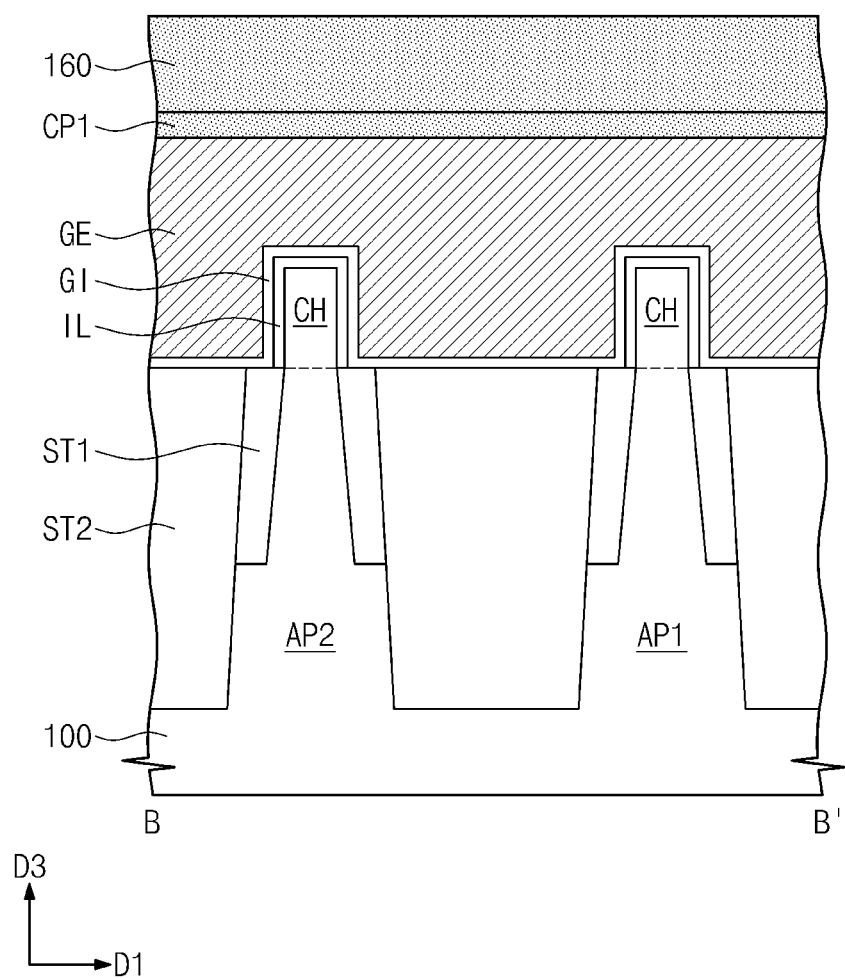
Figure 22C:
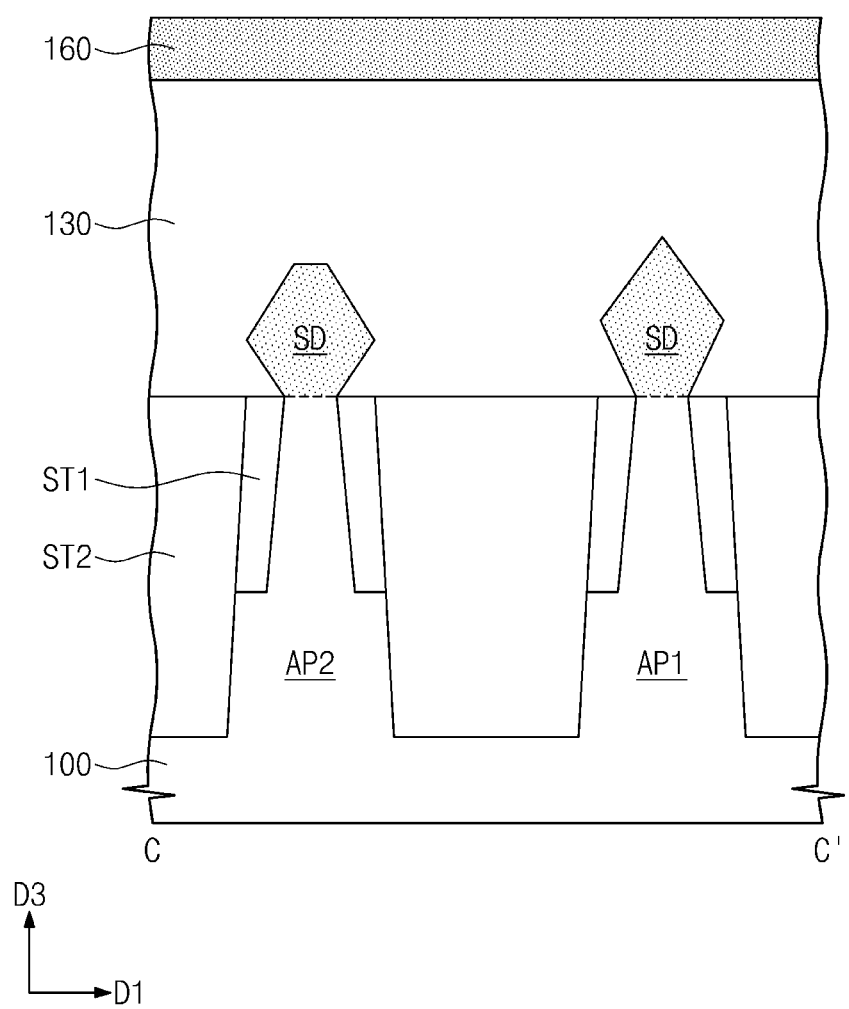
Figure 23:
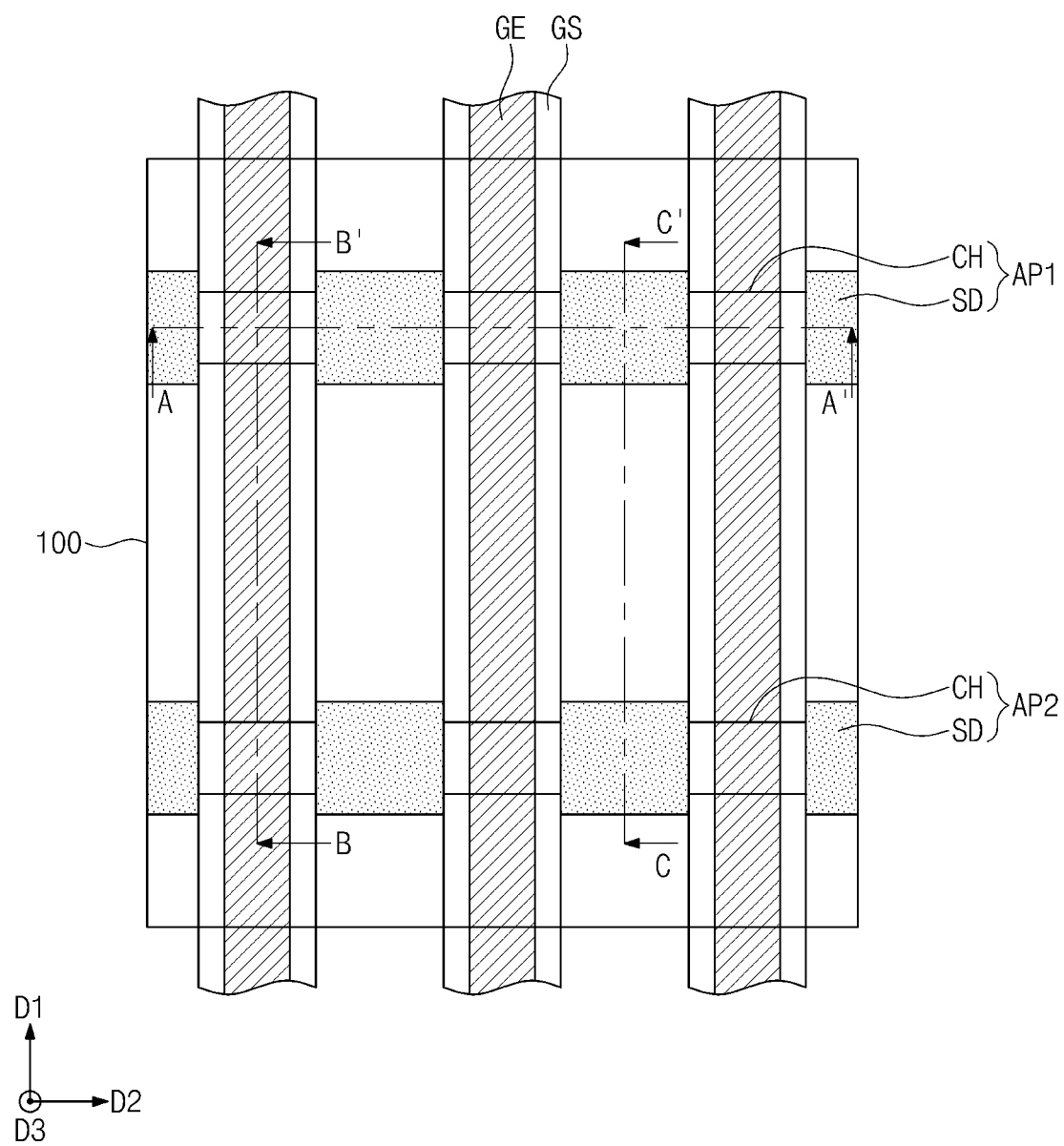
Figure 24A:
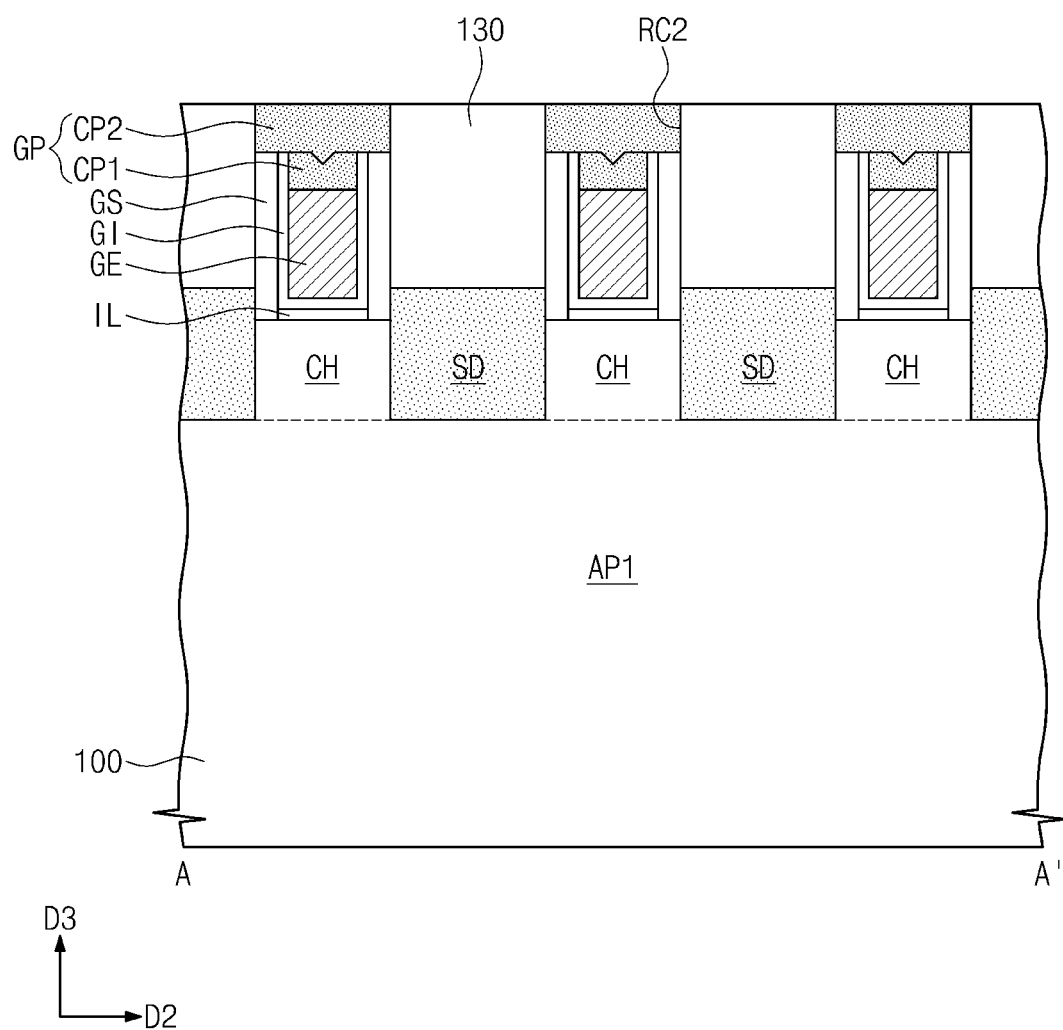
Figure 24B:
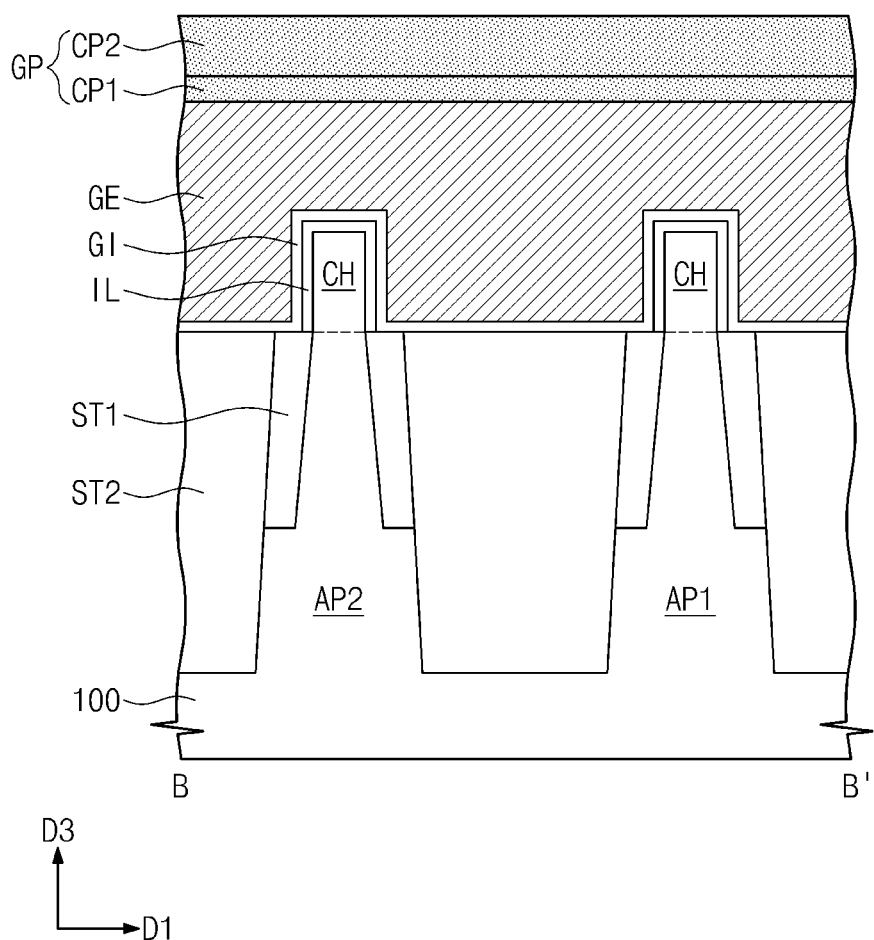
Figure 24C:
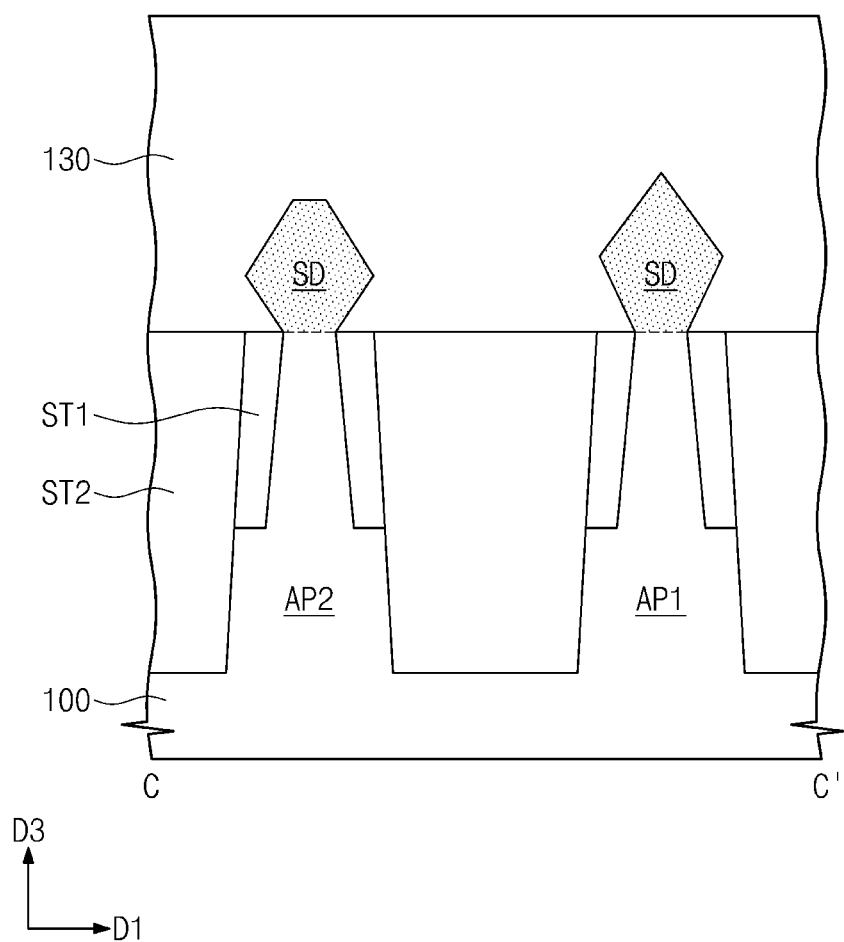
Figure 25:
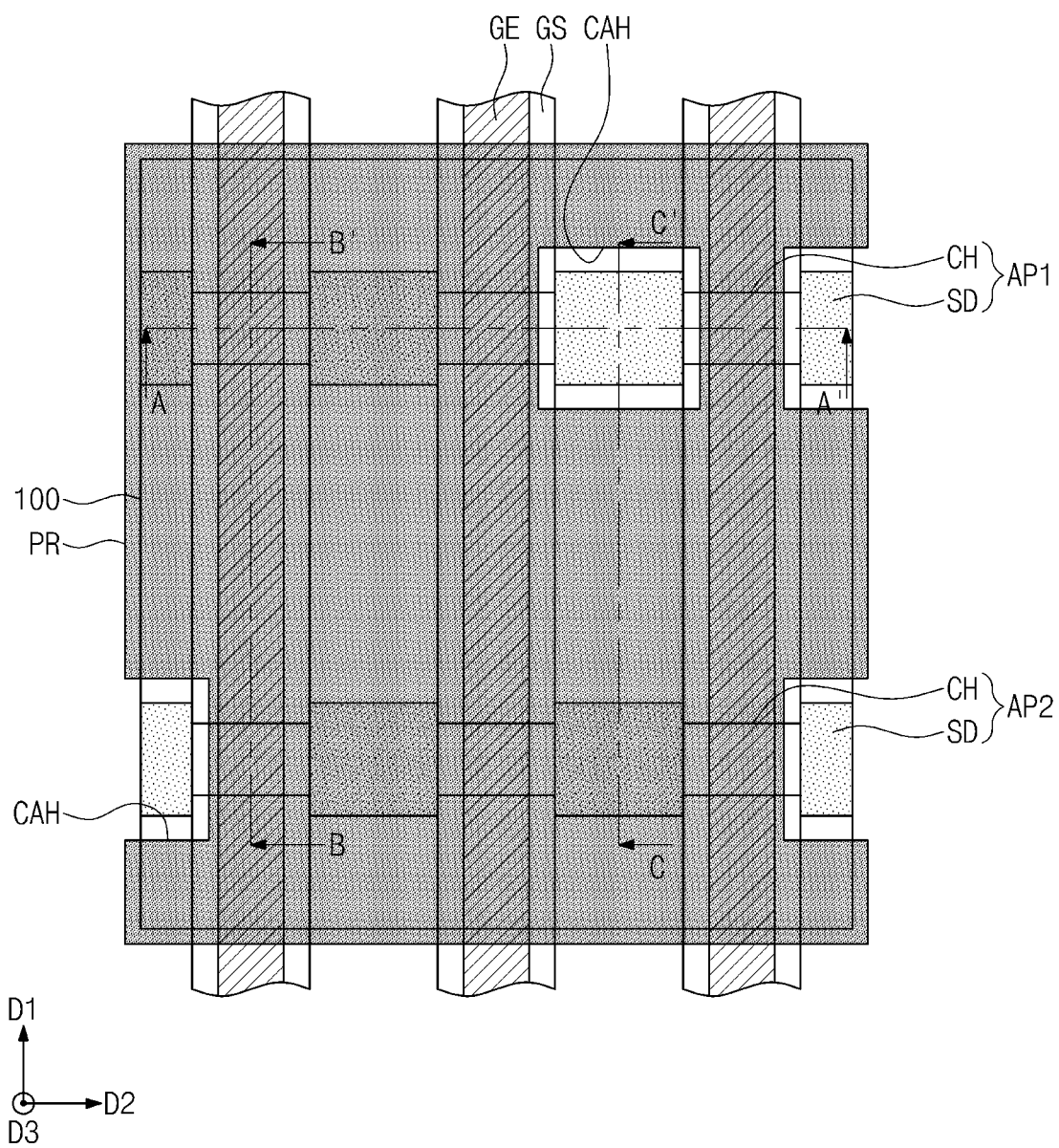
Figure 26A:
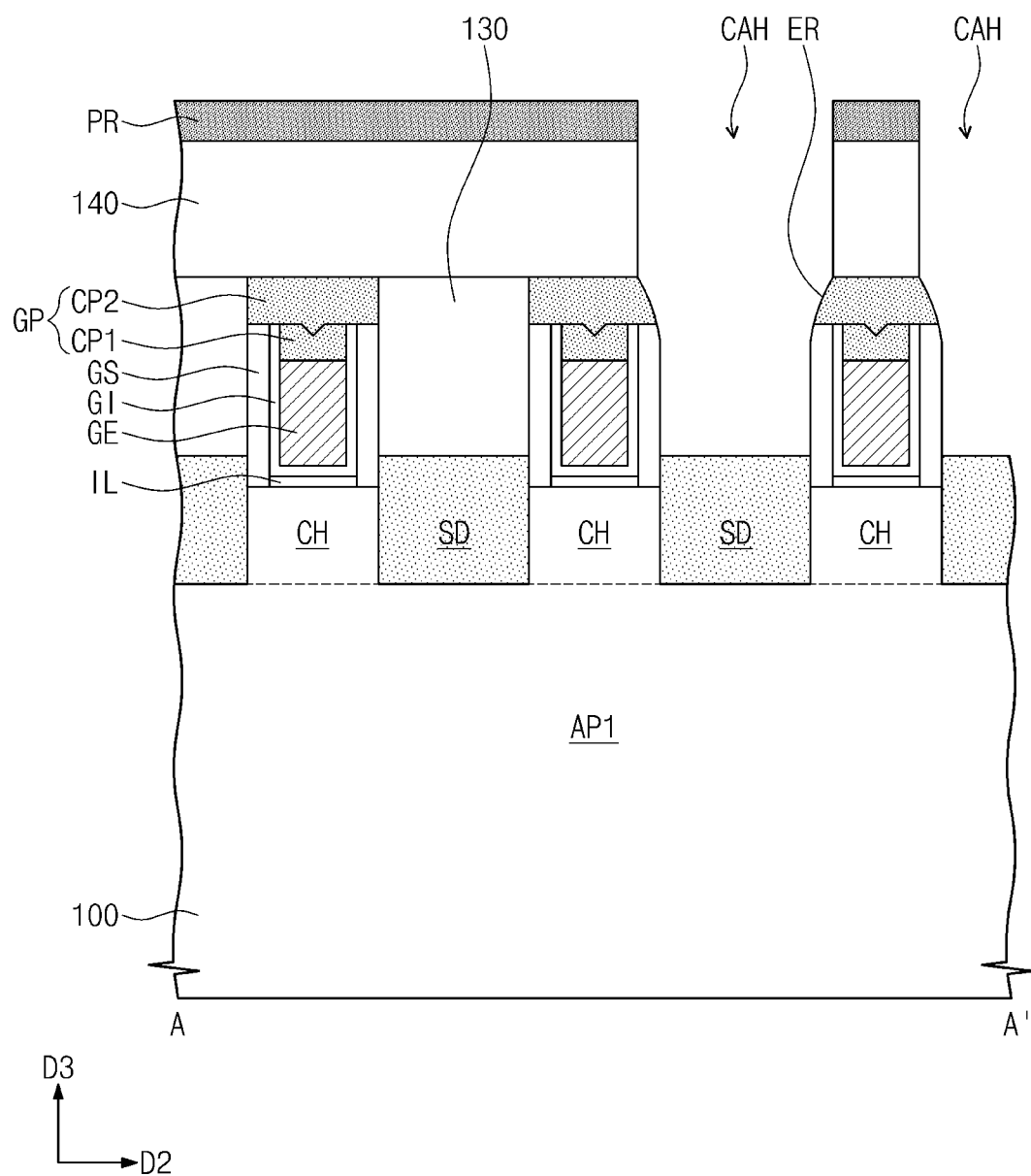
Figure 26B:
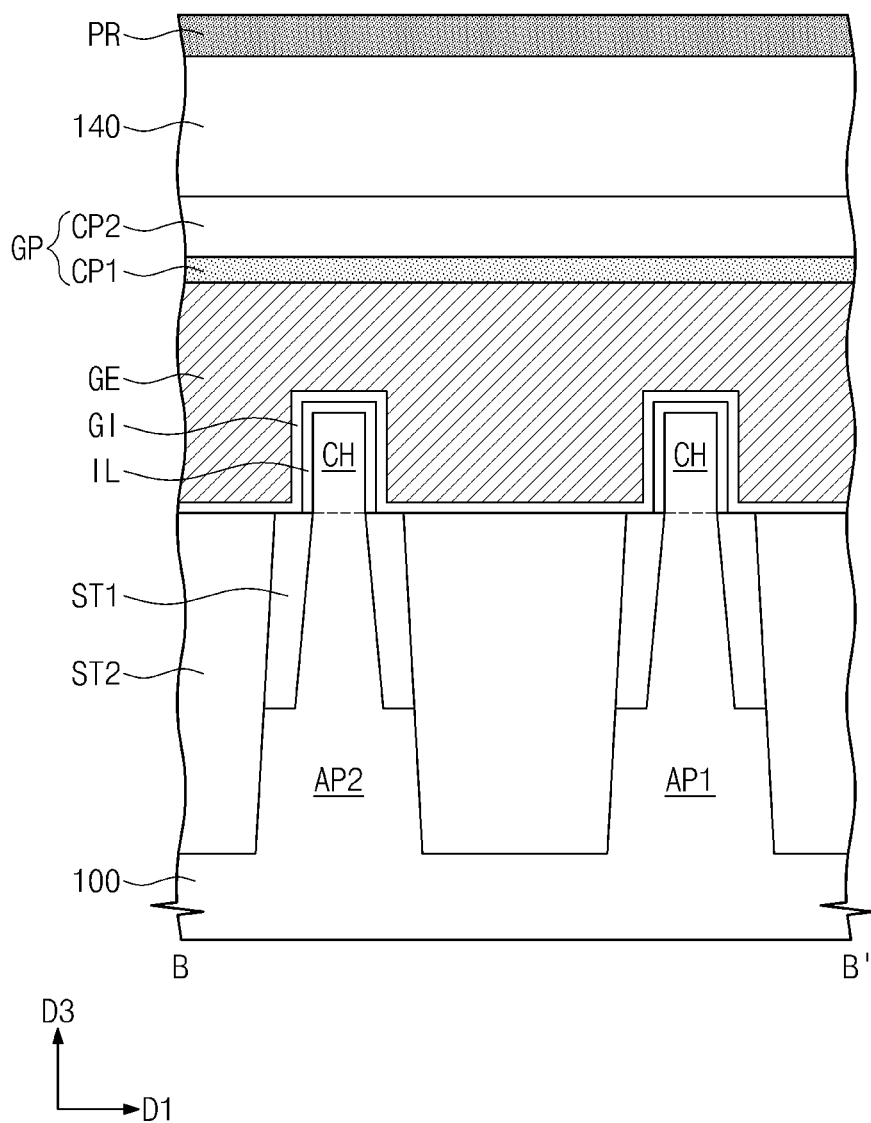
Figure 26C:
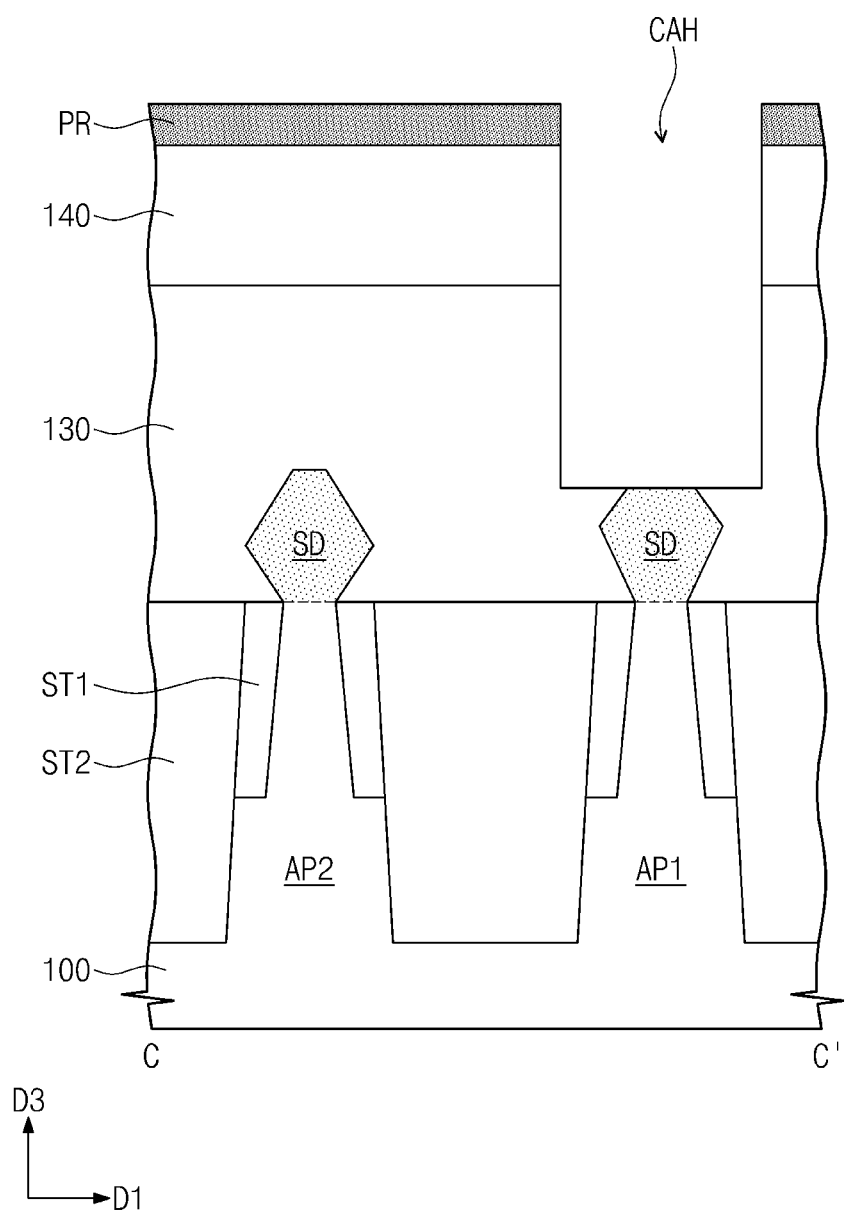

Referring to FIGS. 11 and 12A through 12B, a pair of spacer structures GS may be formed to cover opposite sidewalls of each of the sacrificial gate patterns 110. Source/drain regions SD may be formed on the upper portions of the first and second active patterns AP1 and AP2. The source/drain regions SD may be positioned at opposite sides of each sacrificial gate pattern 110. Channel regions CH may each be disposed between respective ones of the source/drain regions SD.

Specifically, the forming of the spacer structures GS may include forming a gate spacer layer on the substrate 100 to conformally cover the sacrificial gate patterns 110 and the gate mask patterns 115 and anisotropically etching the gate spacer layer. The gate spacer layer may be formed by a chemical vapor deposition (CVD) process or an atomic layer deposition (ALD) process. The gate spacer layer may include multiple layers that are sequentially stacked, i.e., may be a multi-layered structure. In this respect, the gate spacer layer may be formed of at least one of $SiO_2$, SiCN, SiCON and SiN.

The resulting spacer structure GS may include a first spacer SP1, a second spacer SP2 and a third spacer SP3 (refer to FIG. 6A). In this case, the second spacer SP2 may be formed of a material having a lower dielectric constant than materials of the first and third spacers SP1 and SP3. In some examples, the third spacer SP3 may be formed after the first and second spacers SP1 and SP2 and the source/drain regions SD are formed. In other examples, the first through third spacers SP1, SP2 and SP3 may be concurrently formed.

Specifically, the forming of the source/drain regions SD may include removing upper portions of the first and second active patterns AP1 and AP2 at opposite sides of the respective sacrificial gate patterns 110 and performing a selective epitaxial growing process using portions of the first and second active patterns AP1 and AP2 exposed by the removal, as a seed. The removal of upper portions of the first and second active patterns AP1 and AP2 may be performed by a wet etching process using the gate mask patterns 115 and the spacer structures GS as an etching mask.

The source/drain regions SD of the first active pattern AP1 may be formed to apply a compressive strain to the channel region CH therebetween. As an example, in the case in which the substrate 100 is a silicon substrate, the source/drain regions SD of the first active pattern AP1 may be formed of SiGe. The source/drain regions SD of the first active pattern AP1 may be doped with p-type impurities after the epitaxial growing process or during the epitaxial growing process.

The source/drain regions SD of the second active pattern AP2 may be formed to apply a tensile strain to the channel region CH therebetween. As an example, in the case in which the substrate 100 is a silicon substrate, the source/drain regions SD of the second active pattern AP2 may be formed of SiC or Si. The source/drain regions SD of the second active pattern AP2 may be doped with n-type impurities after the epitaxial growing process or during the epitaxial growing process.

In some examples, because the source/drain regions SD of the first active pattern AP1 and the source/drain regions SD of the second active pattern AP2 are epitaxially grown using different materials from each other, the source/drain regions SD of the first active pattern AP1 and the source/drain regions SD of the second active pattern AP2 may be formed to have different sizes and different shapes from each other.

Referring to FIGS. 13 and 14A through 14C, a first interlayer insulating layer 130 may be formed on the substrate 100. For example, the first interlayer insulating layer 130 may be formed of silicon oxide. A planarization process may be performed on the first interlayer insulating layer 130 until top surfaces of the sacrificial gate patterns 110 are exposed. The planarization process may include an etch-back process and/or a chemical mechanical polishing (CMP) process. When planarizing the first interlayer insulating layer 130, the gate mask patterns 115 may be removed together to expose the sacrificial gate patterns 110.

The exposed sacrificial gate patterns 110 may be removed such that gate trenches GT may be formed to each expose the channel region CH between adjacent ones of spacer structures GS. The gate trenches GT may be formed by performing an etching process of selectively removing portions of the sacrificial gate patterns 110.

Referring to FIGS. 15 and 16A through 16C, an oxidation process may be performed on the exposed channel regions CH using plasma such that interfacial layers IL may be respectively grown from the channel regions CH. The interfacial layers IL may be results of a thermal oxidation and/or a chemical oxidation of the channel regions CH. The oxidation process may be conducted using an oxidizing agent, for example, at least one of oxygen ($O_2$), ozone ($O_3$) and water vapor ($H_2O$). The interfacial layers IL may include a silicon oxide layer.

A gate dielectric pattern GI and a gate electrode GE may be sequentially formed in each of the gate trenches GT to fill each of the gate trenches GT. Specifically, a gate dielectric layer may be formed in the gate trenches GT to fill a portion of each of the gate trenches GT. The gate dielectric layer may be formed to cover the top surfaces and sidewalls of the channel regions CH. As an example, the gate dielectric layer may include at least one of silicon oxide, silicon oxynitride and a high-k dielectric material of which a dielectric constant is higher than that of silicon oxide.

A gate conductive layer may be formed on the gate dielectric layer to fill remaining portions of the gate trenches GT. For example, the gate conductive layer may include at least one of a doped semiconductor material, a conductive metal nitride and a metal. The sequentially stacked gate dielectric layer and gate conductive layer may be planarized such that the gate dielectric patterns GI and the gate electrode GE may be formed in each gate trench GT.

The gate electrodes GE may be recessed such that first recess regions RC1 may be defined on the respective gate electrodes GE. In other words, top surfaces of the gate electrodes GE may be lower than top surfaces of the spacer structures GS and top surfaces of the gate dielectric patterns GI. Each of the first recess regions RC1 may have a recess defined by inner sidewalls of the gate dielectric pattern GI and the top surface of the gate electrode GE. The recessing of the gate electrode GE may include selectively etching the gate electrodes GE to remove a portion thereof.

Referring to FIGS. 17 and 18A through 18C, a first capping layer 150 may be formed on the first interlayer insulating 130. The first capping layer 150 may fill the recesses of first recess regions RC1. Due to the first recess regions RC1, depressed regions DEa may be formed in a top surface of the first capping layer 150. The first capping layer 150 may be formed of at least one of SiON, SiCN, SiCON, SiN and $Al_2O_3$.

Referring to FIGS. 19 and 20A through 20C, the first capping layer 150 may be etched to form first capping patterns CP1 on the gate electrodes GE. The first capping patterns CP1 may respectively fill the recesses of first recess regions RC1.

The first capping layer 150 may be etched such that top surfaces of the first capping patterns CP1 are lower than a top surface of the first interlayer insulating layer 130. When etching the first capping layer 150, the spacer structures GS and the gate dielectric patterns GI may be etched together. Therefore, the top surfaces of the spacer structures GS and the top surfaces of the gate dielectric patterns GI may be lower than the top surface of the first interlayer insulating layer 130. As an example, a portion of the top surface of the first capping pattern CP1 may be substantially coplanar with the top surfaces of the spacer structures GS.

Due to the depressed regions DEa formed in the top surface of the first capping layer 150, indentations DE may be respectively formed in the top surfaces of the first capping patterns CP1. The indentations DE may be formed due to an anisotropic dry etching of the first capping layer 150 to form the first capping patterns CP1.

In some examples, in the case in which the etching process is performed after planarizing the first capping layer 150, the depressed regions DEa in the top surface of the first capping layer 150 may be removed. In this case, the first capping patterns CP1 may have substantially flat top surfaces without the indentations DE (refer to FIG. 6C).

By performing the etching process, the top surfaces of the spacer structures GS, the top surfaces of the gate dielectric patterns GI and the top surfaces of the first capping patterns CP1 may be lower than the top surface of the first interlayer insulating layer 130 such that second recess regions RC2 may be formed. The recesses of the second recess regions RC2 may each expose the top surfaces of the pair of spacer structures GS, the top surface of the gate dielectric pattern GI and the top surface of the first capping pattern CP1.

In some examples, an insulating pattern NO may be formed on the exposed top surfaces of the spacer structures GS, the exposed top surface of the gate dielectric pattern G1 and the exposed top surface of the first capping pattern CP1. The insulating pattern NO may include a native oxide that is formed naturally by contact of the exposed layers with an air (refer to FIG. 6B).

Referring to FIGS. 21 and 22A through 22C, a second capping layer 160 may be formed on the first interlayer insulating layer 130. The second capping layer 160 may fill the second recess regions RC2. The second capping layer 160 may be formed of a material having an etching selectivity with respect to the first interlayer insulating layer 130. The second capping layer may be formed of, for example, at least one of SiON, SiCN, SiCON, SiN and Al2O3. In some examples, the second capping layer 160 may be formed of the same material as the first capping patterns CP1. In other examples, the second capping layer 160 may be formed of a material different from a material of the first capping patterns CP1. In this case, a dielectric constant of the second capping layer 160 may be greater than that of the first capping patterns CP1.

Referring to FIGS. 23 and 24A through 24C, a planarizing process of the second capping layer 160 may be performed until the top surface of the first interlayer insulating layer 130 is exposed. Thus, second capping patterns CP2 may be formed in the respective recesses of the second recess regions RC2. The planarization process may include an etch-back process and/or a CMP process. The first capping pattern CP1 and the second capping pattern CP2 may form a capping structure GP. The second capping pattern CP2 may be formed to completely cover the top surface of the first capping pattern CP1 and the top surfaces of the pair of spacer structures GS. In other words, the second capping pattern CP2 may be formed to have a greater width than the first capping pattern CP1. The second capping pattern CP2 may be spaced apart from the gate electrode GE with the first capping pattern CP1 therebetween.

Referring to FIGS. 25 and 26A through 26C, a second interlayer insulating layer 140 may be formed on the first interlayer insulating layer 130, The second interlayer insulating layer 140 may be formed of, for example, silicon oxide.

Contact holes CAH may be formed at a side or opposite sides of at least one of the gate electrodes GE. Specifically, a photoresist pattern PR may be formed on the second interlayer insulating layer 140. The photoresist pattern PR may include openings defining positions of the contact holes CAH. The openings may each be vertically juxtaposed or aligned with the source/drain region SD. The openings may each be formed to have an area, as viewed in plan, larger than that of the source/drain region SD. The first and second interlayer insulating layers 130 and 140 may be etched using the photoresist patterns PR as an etch mask to form the contact holes CAH exposing the source/drain regions SD.

The etching process for forming the contact holes CAH may include a dry etching process capable of selectively etching the first and second source/drain regions SD. For example, the etching process may be performed using fluorocarbon ($C_xF_y$) as an etching gas The openings of the photoresist pattern PR may each be formed to have a width greater than a distance between the adjacent gate electrodes GE (refer to FIG. 26A). While performing the etching process, a portion of the capping structure GP and a portion of the space structure GS may be etched, while the other portions of the capping structure GP and the space structure GS remain intact. Therefore, the contact holes CAH may selectively expose the source/drain region SD without exposing the gate electrodes GE adjacent thereto. That is, the contact holes CAH may be formed in a self-aligned manner. As a portion of the capping structure GP is etched, the capping structure GP may have a sloped sidewall ER.

The spacer structure GS may include a low-k dielectric material (e.g., the material of the second spacer SP2) so as to reduce a parasitic capacitance between the gate electrode GE and an active contact CA described later. However, an etch resistance of the spacer structure GS due to the low-k dielectric material may be relatively low and thus, the spacer structure GS may be easily etched during the etching process for forming the contact holes CAH.

Because the second capping pattern CP2 is formed to completely cover the top surface of the spacer structure GS, the spacer structure GS may be effectively protected during the etching process for forming the contact holes CAH. For example, the second capping pattern CP2 may be formed of a high-k dielectric material (e.g., $AL_2O_3$) having a high etching selectivity with respect to the silicon oxide layer. Thus, the etch resistance of the second capping pattern CP2 with respect to the etching process may be relatively high. The second capping pattern CP2 is spaced apart from the gate structure GE by the first capping pattern CP1 and the spacer structure GS, and thus the second capping pattern CP2 having the high-k dielectric material may not affect the parasitic capacitance. In some examples, the second capping pattern CP2 may have the same material (e.g., SiN) as the first capping pattern CP1. However, because the second capping pattern CP2 has a larger volume than the first capping pattern CP1, the etch resistance of the second capping pattern CP2 may be relatively high by virtue of its physical structure.

Referring again to FIGS. 3 and 4A through 4C, the active contacts CA may be formed to fill the contact holes CAH. The active contacts CA may each include a barrier pattern 180 and a conductive structure 185. The barrier pattern 180 may include a barrier conductive layer formed of, for example, at least one of titanium nitride, tungsten nitride and tantalum nitride. The conductive structure 185 may include a metal layer formed of, for example, at least one of tungsten, titanium and tantalum.

Although not shown, through a subsequent process, interconnection layers may be formed on the second interlayer insulating layer 140 to contact the active contacts CA. The interconnection layers may include a conductive material.

Figure 27:
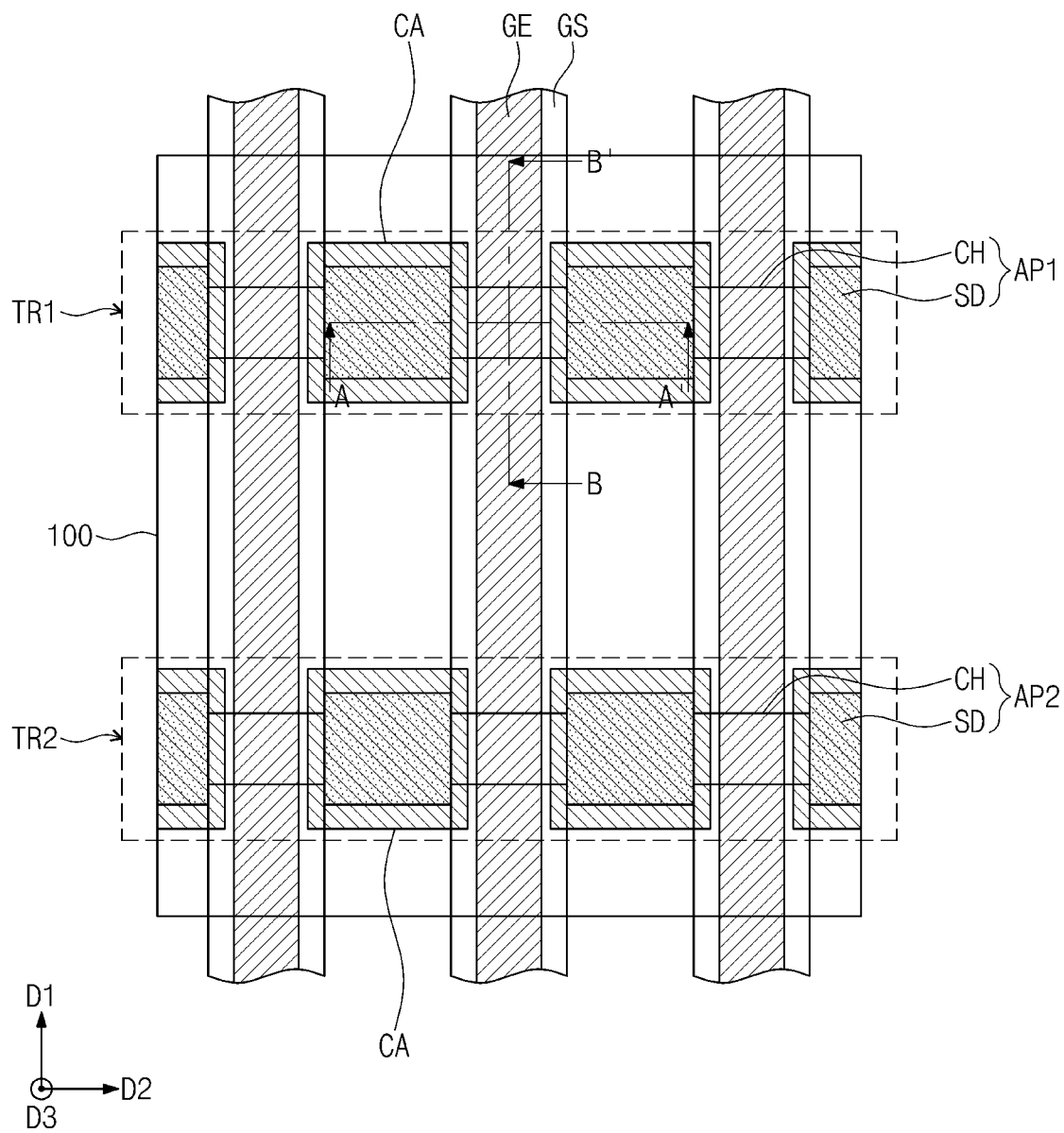
FIG. 27 is a plan view illustrating a semiconductor device according to an example of the inventive concept.
Figure 28A:
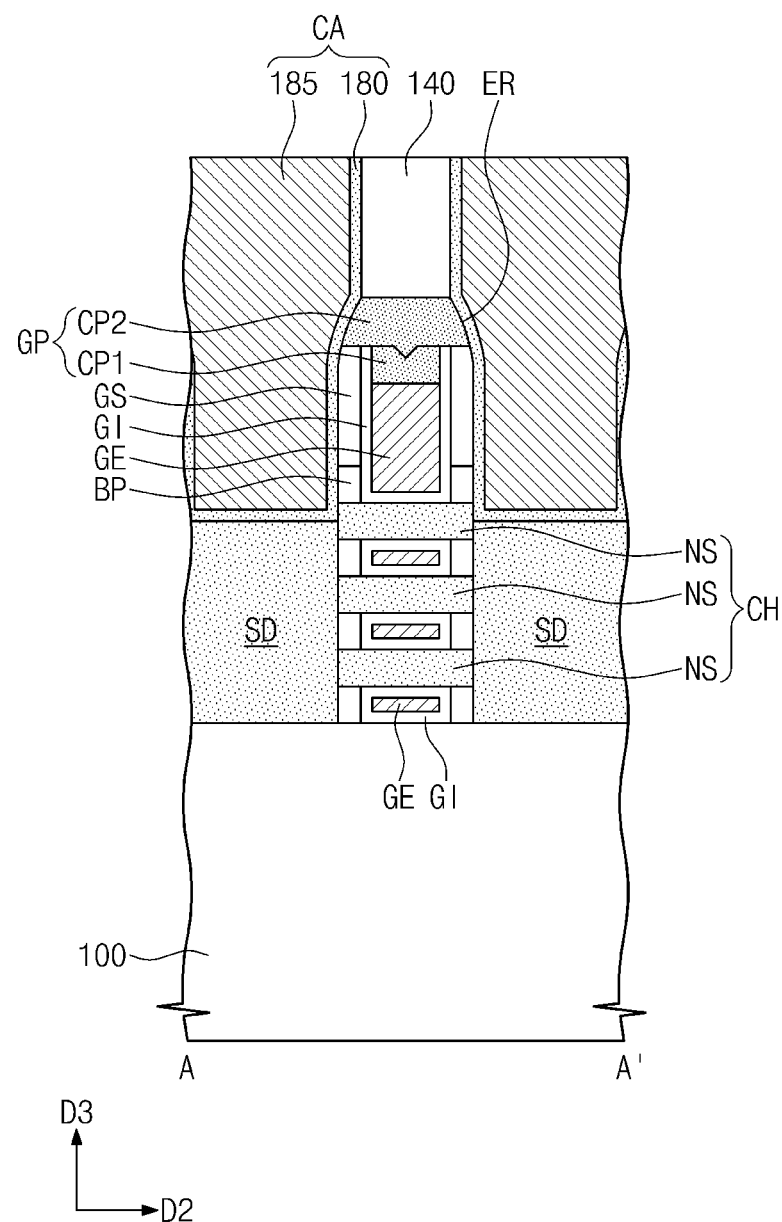
FIGS. 28A and 28B are cross-sectional views taken along lines A-A' and B-B' of FIG. 27, respectively.
Figure 28B:
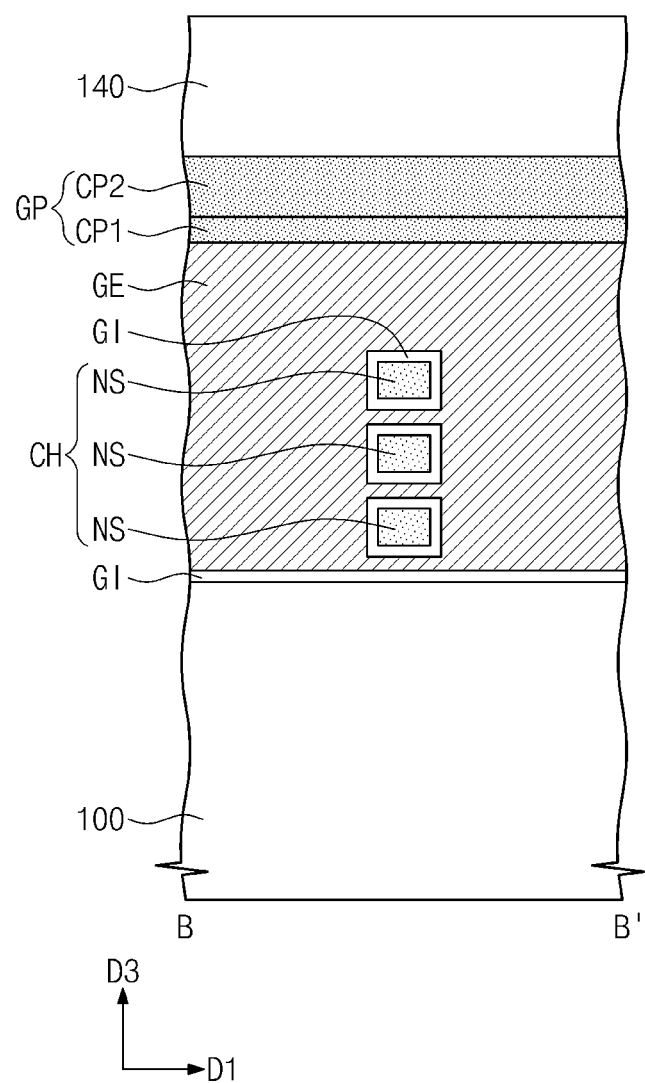

FIG. 27 is a plan view illustrating a semiconductor device according to an example of the inventive concept. FIGS. 28A and 28B are cross-sectional views taken along lines A-A' and B-B' of FIG. 27, respectively. Hereinafter, the same elements as described with reference to FIGS. 3, 4A through 4C and 6A through 6C will not be described again or will be mentioned only briefly for the sake of brevity.

Referring to FIGS. 27 and 28A and 28B, a first transistor TR1 and a second transistor may be disposed on a substrate 100. A first active pattern AP1 and a second active pattern AP2 may be disposed on the substrate 100. The first active pattern AP1 and the second active pattern AP2 may be active regions for the first transistor TR1 and the second transistor TR2, respectively.

Gate electrodes GE may be disposed on the first and second active patterns AP1 and AP2 to cross the first and second active patterns AP1 and AP2. A gate dielectric pattern GI may extend along sidewalls and a bottom surface of each of the gate electrodes GE. Spacer structures GS may be spaced apart from each of the gate electrodes GE with the gate dielectric pattern GI interposed therebetween. A capping structure GP may be disposed on each of the gate electrodes GE. A top surface of the gate dielectric pattern GI and a top surface of each of the gate electrodes GE may contact a bottom surface of the capping structure GP. The gate electrodes GE, the gate dielectric pattern GI, the spacer structure GS and the capping structure GP may be similar to those described with reference to FIGS. 3, 4A through 4C, 5 and 6A through 6C.

The first and second active patterns AP1 and AP2 may each include source/drain regions SD and a channel regions CH. The channel regions CH may each include a plurality of semiconductor patterns NS which are vertically stacked. The semiconductor patterns NS may be spaced apart from each other in the third direction D3. The source/drain regions SD may directly contact sidewalls of the semiconductor patterns NS. In other words, the semiconductor patterns NS may connect the source/drain regions on opposite sides thereof. Referring again to FIG. 28A, although three semiconductor patterns NS are illustrated, the inventive concept is not particularly limited to any particular number of the semiconductor patterns NS. In some examples, the semiconductor patterns NS may include, for example, at least one of Si, SiGe and Ge. The semiconductor patterns NS may have an equal thickness to each other, but the inventive concept is not limited thereto.

As described above, the gate electrode GE and the gate dielectric pattern GI may cover the channel region CH and may extend in the first direction D1. More specifically, the gate electrode GE and the gate dielectric pattern GI may fill spaces between the semiconductor patterns NS. In this example, the gate dielectric pattern GI may contact the semiconductor patterns NS. The gate electrode GE may be spaced apart from the semiconductor patterns NS with the gate dielectric pattern GI interposed therebetween.

The first and second transistors TR1 and TR2 as described with reference to FIGS. 3 and 4A through 4C may each be a tri-gate-type field effect transistor (i.e., a FinFET). The gate electrode GE may surround an outer peripheral surface of each semiconductor pattern NS. The first and second transistors TR1 and TR2 may each be a gate-all-around-type field effect transistor that includes the channel regions CH, each of whose outer peripheral surfaces is surrounded by the gate electrode GE.

Barrier insulating patterns BP may be provided between the source/drain regions SD and the gate electrode GE. The barrier insulating patterns BP may be spaced apart from each other with semiconductor patterns NS therebetween. The barrier insulating patterns BP may contact the gate dielectric pattern GI. The barrier insulating patterns BP may include at least one of silicon oxide, silicon nitride and silicon oxynitride.

The source/drain regions SD may include epitaxial patterns formed using the semiconductor patterns NS and the substrate 100 as a seed. In the case in which the first transistor TR1 is a PMOSFET, the source/drain regions SD of the first active pattern AP1 may include a semiconductor material applying a compressive strain to the channel region CH. In the case in which the second transistor TR2 is an NMOSFET, the source/drain regions SD of the second active pattern AP2 may include a semiconductor material applying a tensile strain to the channel region CH.

First and second interlayer insulating layers 130 and 140 may be disposed on the substrate 100 to cover the gate electrodes GE. Active contacts CA may be formed to penetrate the first and second interlayer insulating layers 130 and 140 and be electrically connected to the source/drain regions SD. At least one of the active contacts CA may be a self-aligned contact. The active contact CA may contact the capping structure GP. The capping structure GP may have a sloped sidewall ER contacting the active contact CA.

Figure 29:
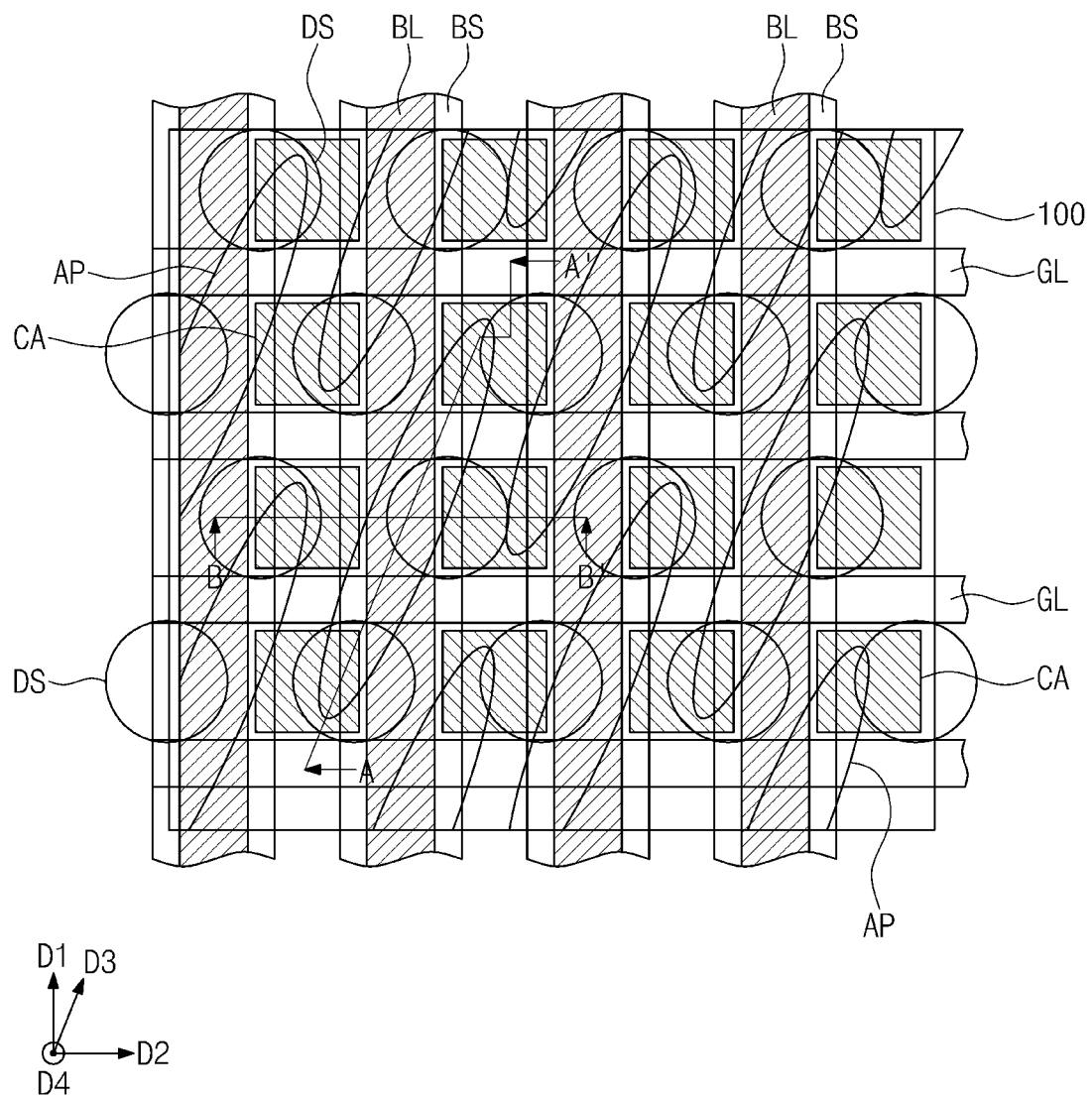
FIG. 29 is a plan view illustrating a semiconductor device according to an example of the inventive concept.
Figure 30A:
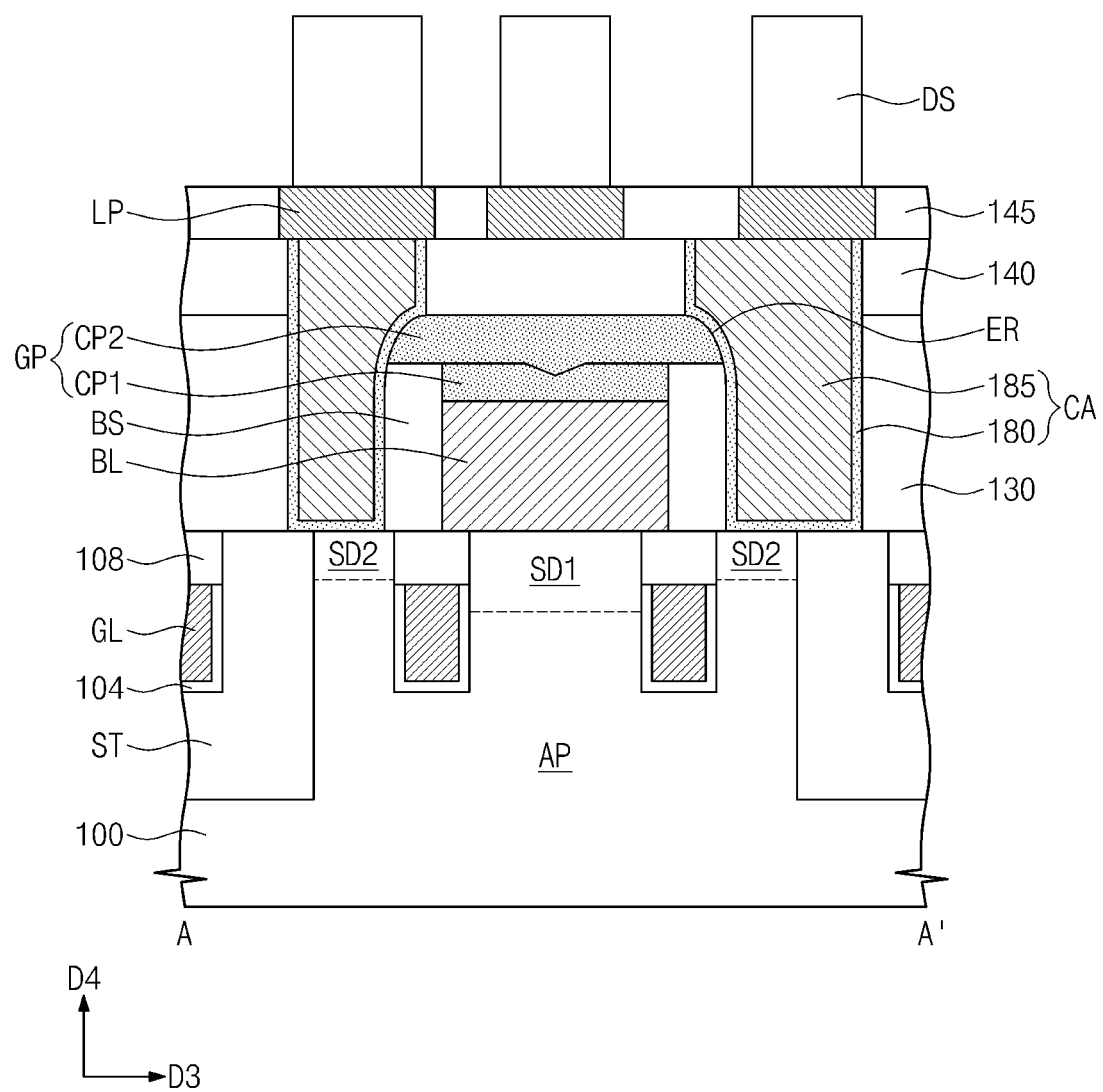
FIGS. 30A and 30B are cross-sectional views taken along lines A-A' and B-B' of FIG. 29, respectively.
Figure 30B:
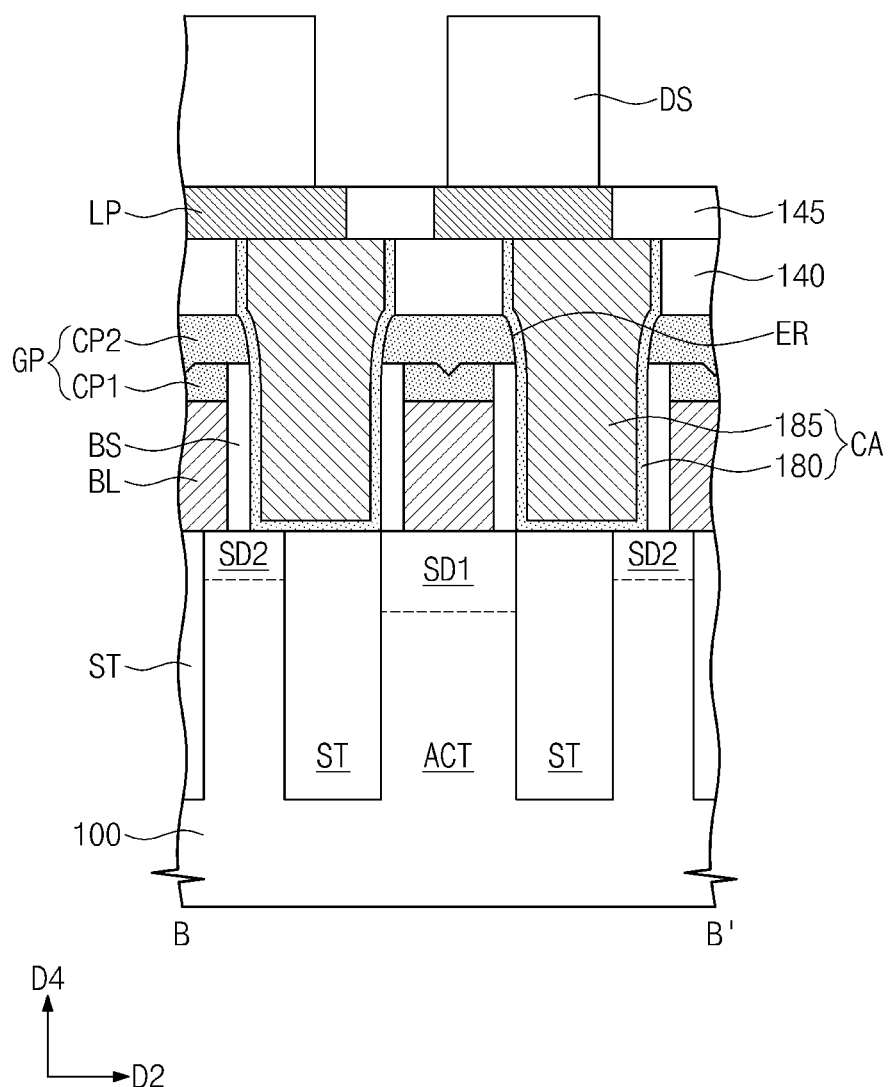

FIG. 29 is a plan view illustrating a semiconductor device according to an example of the inventive concept. FIGS. 30A and 30B are cross-sectional views taken along lines A-A' and B-B' of FIG. 29, respectively. Hereinafter, the same elements as described with reference to FIGS. 1 and 2 will not be described again or will mentioned only briefly for the sake of brevity.

Referring to FIGS. 29, 30A and 30B, device isolation patterns ST defining active patterns AP may be provided on a substrate 100. The device isolation patterns ST may include, for example, a silicon oxide layer. In a plan view, the active patterns AP may each be elongated ("bar-shaped") with its major axis oriented in a third direction D3. The third direction D3 may cross a first direction D1 and a second direction D2 that cross each other. The first, second and third directions D1, D2 and D3 may each be a direction parallel to a top surface of the substrate 100. A fourth direction D4 may be a direction perpendicular to the top surface of the substrate 100 and the first, second and third directions D1, D2 and D3.

Gate lines GL may be disposed in the substrate 100 to cross the active patterns AP. The gate lines GL may extend in the second direction D2 and be spaced along the first direction D1. The gate lines GL may be buried within the substrate 100. The gate lines GL may include a conductive material, for example, at least one of a doped semiconductor material (e.g., a doped silicon, a doped germanium), a conductive metal nitride (e.g., titanium nitride, tantalum nitride), a metal (e.g., tungsten, titanium, tantalum) and a metal-semiconductor compound (e.g., tungsten silicide, cobalt silicide, titanium silicide).

Gate dielectric patterns 104 may be interposed between the gate lines GL and the active patterns AP and between the gate lines GL and the device isolation patterns ST. The gate dielectric patterns 104 may include, for example, a silicon oxide layer, a silicon nitride layer and/or a silicon oxynitride layer.

Mask patterns 108 may be respectively provided on top surfaces of the gate lines GL. The top surfaces of the gate lines GL may be substantially coplanar with the top surface of the substrate 100. The mask pattern 108 may include, for example, a silicon oxide layer, a silicon nitride layer and/or a silicon oxynitride layer.

A first impurity region SD1 and second impurity regions SD2 spaced apart from each other with the first impurity region SD1 interposed therebetween may be provided in each active pattern AP. The first impurity region SD1 may be disposed in the active pattern AP between adjacent ones of a respective pair of the gate lines GL. The second impurity regions SD2 may be respectively disposed in the active pattern AP at opposite sides of the pair of the gate lines GL. That is, the second impurity regions SD2 may be spaced apart from each other with the pair of the gate lines GL therebetween. The first impurity region SD1 may extend deeper than the second impurity regions SD2 into the active pattern AP. The first impurity region SD1 may include impurities of the same conductivity type as the second impurity regions SD2.

Conductive patterns may be disposed to cross the first impurity region SD1 of first active patterns AP. The conductive patterns may include bit lines BL. The bit lines BL may extend in the first direction D1 and be arranged in the second direction D2. The bit lines BL may be electrically connected to the first impurity regions SD1. As an example, the bit lines BL may include, for example, at least one of a doped semiconductor material, a conductive metal nitride and a metal.

Spacer structures GS may be respectively disposed on opposite sidewalls of each bit line BL. A capping structure may be disposed on each bit line. In some examples, the bit line BL, the spacer structure GS and the capping structure GP may be similar to the gate electrode GE, the spacer structure GS and the capping structure GP as described with reference to FIGS. 1 and 2.

A first interlayer insulating layer 130 and a second interlayer insulating layer 140 may be provided on the substrate 100. Active contacts CA may extend through the first and second interlayer layers 130 and 140 and be electrically connected to the second impurity regions SD2. At least one active contact CA may be a self-aligned contact. The active contact CA may contact the capping structure GP and have a sloped sidewall ER contacting the active contact CA.

Landing pads LP may be disposed on the second interlayer insulating layer 140 to be electrically connected to the active contacts CA, respectively. The landing pads LP may be arranged in two-dimensions. The landing pads LP may overlap the active contacts CA. The landing pads LP may include a conductive material, for example, a doped semiconductor material, a metal and/or a meal-semiconductor compound. Third interlayer insulating layer 145 may fill gaps between the landing pads LP.

Data storage elements DS may be disposed on the third interlayer insulating layer 145 as electrically connected to the landing pads LP, respectively. The data storage elements DS may be memory elements capable of storing data. In this case, the field effect transistors including the active patterns AP and the gate lines GL may function as switching elements. In some examples, the data storage elements DS may each be a memory element having a capacitor, a magnetic tunnel junction (MTJ) pattern, or a variable-resistance structure including a phase-change material for storing data.

In the semiconductor device according to the present inventive concept, the conductive pattern can be protected effectively while forming the self-aligned contact and the parasitic capacitance between the contact and the conductive pattern can also be reduced. Accordingly, it is possible to improve an operation speed of the semiconductor device.

Although the present inventive concept has been particularly shown and described with reference to examples thereof, it will be understood by those of ordinary skill in the art that various changes in form and details may be made to such examples without departing from the spirit and scope of the inventive concept as defined by the following claims.

What is claimed is:

1. A semiconductor device comprising:
   a substrate including a first active pattern and a second active pattern, the first active pattern including a first source/drain, a second source/drain and a first channel between the first source/drain and the second source/drain, the second active pattern including a third source/drain, a fourth source/drain and a second channel between the third source/drain and the fourth source/drain;
   a device isolation pattern disposed between the first active pattern and the second active pattern;
   a gate structure disposed on the device isolation pattern, the first channel and the second channel, and including a gate electrode, a gate dielectric surrounding a bottom surface and sidewalls of the gate electrode, a spacer disposed on a sidewall of the gate dielectric and a capping pattern disposed on the gate electrode;
   a first contact disposed on the first source/drain and on a first sidewall of the gate structure, the first contact being electrically connected to the first source/drain, the first contact including a first conductive structure and a first barrier pattern surrounding a bottom surface and sidewalls of the first conductive structure;
   a second contact disposed on the device isolation pattern, the second contact including a second conductive structure and a second barrier pattern surrounding a bottom surface and sidewalls of the second conductive structure; and
   a conductive pattern disposed on the second contact and electrically connected to the second contact,
   wherein the first conductive structure includes a first upper portion, a first lower portion and a first middle portion between the first upper portion and the first lower portion,
   a width of the first upper portion of the first conductive structure is greater than a width of the first lower portion of the first conductive structure,
   a slope of each of the sidewalls of the first conductive structure is changed at the first middle portion,
   a sidewall of the first middle portion of the first conductive structure is concavely rounded,
   the second conductive structure includes a second upper portion, a second lower portion and a second middle portion between the second upper portion and the second lower portion,
   a width of the second upper portion of the second conductive structure is greater than a width of the second lower portion of the second conductive structure,
   a slope of each of the sidewalls of the second conductive structure is changed at the second middle portion,
   a sidewall of the second middle portion of the second conductive structure is concavely rounded, and
   a bottom surface of the second contact is disposed higher than a highest portion of the device isolation pattern.

2. The semiconductor device of claim 1, wherein the first barrier pattern includes titanium nitride, tungsten nitride or tantalum nitride.

3. The semiconductor device of claim 1, wherein the gate dielectric includes silicon oxide, silicon nitride or a high-k dielectric.

4. The semiconductor device of claim 3, wherein the high-k dielectric includes hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide or lead zinc niobate.

5. The semiconductor device of claim 1, wherein at least a portion of the first source/drain is disposed higher than a bottom surface of the gate structure.

6. The semiconductor device of claim 1, wherein the first conductive structure is differently shaped from the second conductive structure.

7. The semiconductor device of claim 1, wherein a ratio of the first upper portion and the first lower portion of the first conductive structure is different from a ratio of the second upper portion and the second lower portion of the second conductive structure.

8. The semiconductor device of claim 1, wherein a bottom surface of the first conductive structure is disposed higher than a bottom surface of the second conductive structure with respect to a top surface of the device isolation pattern.

9. The semiconductor device of claim 1, wherein the bottom surface of the first conductive structure is disposed higher than a bottom surface of the gate structure.

10. The semiconductor device of claim 1, wherein the width of the first lower portion of the first conductive structure is less than a width of a widest portion of the first source/drain.

11. The semiconductor device of claim 1, further comprising:
   an interfacial layer disposed between the first active pattern and the gate electrode;
   a first interlayer insulating layer disposed on the first active pattern, the second active pattern and a second sidewall of the gate structure; and
   a second interlayer insulating layer disposed on the capping pattern, the first interlayer insulating layer and a sidewall of the first contact.

12. The semiconductor device of claim 1, wherein the first contact is a self-aligned contact.

13. The semiconductor device of claim 1, wherein a top surface of the gate electrode is lower than a top surface of the spacer.

14. The semiconductor device of claim 1, wherein the first source/drain includes SiGe or SiC.

15. A semiconductor device comprising:
   a substrate including a first fin active pattern and a second fin active pattern, the first fin active pattern including a first source/drain, a second source/drain and a first channel between the first source/drain and the second source/drain, the second fin active pattern including a third source/drain, a fourth source/drain and a second channel between the third source/drain and the fourth source/drain;
   a device isolation pattern disposed between the first fin active pattern and the second fin active pattern;
   a gate structure disposed on the device isolation pattern, the first channel and the second channel, and including a gate electrode, a gate dielectric surrounding a bottom surface and sidewalls of the gate electrode, a spacer disposed on a sidewall of the gate dielectric and a capping pattern disposed on the gate electrode;
   a first contact disposed on the first source/drain and on a first sidewall of the gate structure, the first contact including a first conductive structure and a first barrier pattern surrounding a bottom surface and sidewalls of the first conductive structure; and
   a second contact disposed on the device isolation pattern, the second contact including a second conductive structure and a second barrier pattern surrounding a bottom surface and sidewalls of the second conductive structure,
   wherein the first conductive structure includes a first upper portion, a first lower portion and a first middle portion between the first upper portion and the first lower portion,
   a width of the first upper portion of the first conductive structure is greater than a width of the first lower portion of the first conductive structure,
   a slope of each of the sidewalls of the first conductive structure is changed at the first middle portion,
   a sidewall of the first middle portion of the first conductive structure is concavely rounded,
   the second conductive structure includes a second upper portion, a second lower portion and a second middle portion between the second upper portion and the second lower portion,
   a width of the second upper portion of the second conductive structure is greater than a width of the second lower portion of the second conductive structure,
   a slope of each of the sidewalls of the second conductive structure is changed at the second middle portion,
   a sidewall of the second middle portion of the second conductive structure is concavely rounded,
   a bottom surface of the second contact is disposed higher than a highest portion of the device isolation pattern, and
   a bottom surface of the first contact is disposed higher than a bottom surface of the second contact with respect to a top surface of the device isolation pattern.

16. The semiconductor device of claim 15, wherein the first conductive structure is differently shaped from the second conductive structure, and
   a ratio of the first upper portion and the first lower portion of the first conductive structure is different from a ratio of the second upper portion and the second lower portion of the second conductive structure.

17. The semiconductor device of claim 15, wherein a bottom surface of the first conductive structure is disposed higher than a bottom surface of the second conductive structure with respect to a top surface of the device isolation pattern.

18. The semiconductor device of claim 15, wherein the first contact is a self-aligned contact.

19. The semiconductor device of claim 15, wherein a first transistor formed in the first fin active pattern is a PMOSFET, and
   a second transistor formed in the second fin active pattern is an NMOSFET.

20. The semiconductor device of claim 15, further comprising a conductive pattern disposed on the second contact.

21. A semiconductor device comprising:
   a substrate including a first active pattern and a second active pattern, the first active pattern including a first source/drain, a second source/drain and a first channel between the first source/drain and the second source/drain, the second active pattern including a third source/drain, a fourth source/drain and a second channel between the third source/drain and the fourth source/drain;
   a device isolation pattern disposed between the first active pattern and the second active pattern;
   a gate structure disposed on the device isolation pattern, the first channel and the second channel, and including a gate electrode, a gate dielectric surrounding a bottom surface and sidewalls of the gate electrode, a spacer disposed on a sidewall of the gate dielectric and a capping pattern disposed on the gate electrode;

a first contact disposed on the first source/drain and on a first sidewall of the gate structure, the first contact including a first conductive structure and a first barrier pattern surrounding a bottom surface and sidewalls of the first conductive structure; and a second contact disposed on the device isolation pattern, the second contact including a second conductive structure and a second barrier pattern surrounding a bottom surface and sidewalls of the second conductive structure, wherein the first conductive structure includes a first upper portion, a first lower portion and a first middle portion between the first upper portion and the first lower portion, a width of the first upper portion of the first conductive structure is greater than a width of the first lower portion of the first conductive structure, a slope of each of the sidewalls of the first conductive structure is changed at the first middle portion, a sidewall of the first middle portion of the first conductive structure is concavely rounded, the second conductive structure includes a second upper portion, a second lower portion and a second middle portion between the second upper portion and the second lower portion, a width of the second upper portion of the second conductive structure is greater than a width of the second lower portion of the second conductive structure, a slope of each of the sidewalls of the second conductive structure is changed at the second middle portion, a sidewall of the second middle portion of the second conductive structure is concavely rounded, and the first channel includes a plurality of semiconductor patterns including a first semiconductor pattern and a second semiconductor pattern that are spaced apart from each other and are vertically stacked.

22. The semiconductor device of claim 21, wherein a bottom surface of the first contact is disposed higher than a bottom surface of the second contact with respect to a top surface of the device isolation pattern.

23. The semiconductor device of claim 21, wherein the first conductive structure is differently shaped from the second conductive structure, and a ratio of the first upper portion and the first lower portion of the first conductive structure is different from a ratio of the second upper portion and the second lower portion of the second conductive structure.

24. The semiconductor device of claim 21, further comprising a conductive pattern disposed on the second contact and electrically connected to the second contact.

25. The semiconductor device of claim 21, wherein a bottom surface of the second contact is disposed higher than a highest portion of the device isolation pattern.

* * * * *